United States Patent [19]
Reedy et al.

[11] Patent Number: 5,883,396
[45] Date of Patent: Mar. 16, 1999

[54] HIGH-FREQUENCY WIRELESS COMMUNICATION SYSTEM ON A SINGLE ULTRATHIN SILICON ON SAPPHIRE CHIP

[75] Inventors: Ronald E. Reedy; Mark L. Burgener, both of San Diego, Calif.

[73] Assignee: Peregrine Semiconductor Corporation, San Diego, Calif.

[21] Appl. No.: 733,320

[22] Filed: Oct. 17, 1996

Related U.S. Application Data

[63] Continuation of Ser. No. 218,561, Mar. 25, 1994, Pat. No. 5,572,040, which is a continuation-in-part of Ser. No. 90,400, Jul. 12, 1993, Pat. No. 5,416,043.

[51] Int. Cl.$^6$ ................................................ H01L 29/72
[52] U.S. Cl. .......................... 257/9; 257/280; 257/327; 257/347; 257/350; 257/369; 257/213
[58] Field of Search ................................ 257/9, 213, 280, 257/327, 347, 350, 369

[56] References Cited

U.S. PATENT DOCUMENTS

| | | |
|---|---|---|
| 3,562,608 | 2/1971 | Gallagher et al. . |
| 3,829,881 | 8/1974 | Kohashi . |
| 4,177,084 | 12/1979 | Lau et al. . |
| 4,198,649 | 4/1980 | Berry . |
| 4,385,937 | 5/1983 | Ohmura . |
| 4,418,470 | 12/1983 | Naster et al. . |
| 4,425,700 | 1/1984 | Sasaki et al. . |
| 4,463,492 | 8/1984 | Maeguchi . |
| 4,509,990 | 4/1985 | Vasudev . |
| 4,523,963 | 6/1985 | Ohta et al. . |
| 4,588,447 | 5/1986 | Golecki . |
| 4,607,176 | 8/1986 | Burrows et al. . |
| 4,615,762 | 10/1986 | Jastrzebski et al. . |
| 4,617,066 | 10/1986 | Vasudev . |
| 4,659,392 | 4/1987 | Vasudev . |
| 4,766,482 | 8/1988 | Smeltzer et al. . |
| 4,775,641 | 10/1988 | Duffy et al. . |

(List continued on next page.)

FOREIGN PATENT DOCUMENTS

| | | |
|---|---|---|
| 61-103530 | 9/1986 | Japan . |
| 62-176145 | 1/1988 | Japan . |
| 4-122020 | 8/1992 | Japan . |
| WO 89/07367 | 8/1989 | WIPO . |

OTHER PUBLICATIONS

Golecki et al., "Recrystallization of Silicon–on–Sapphire by CW Ar Laser Irradiation: Comparison Between the Solid and the Liquid–Phase Regimes"; Appl. Phys. Lett. 37(10), 1980, pp. 929–921.

Inoue et al. "Crystaline Disorder Reduction and Defect–Type Change in Silicon–on–Sapphire Films by Silicon Implantation and Subsequent Thermal Annealing"; Appl. Phys. Lett. 36(1), 1980, pp. 64–66.

Golecki et al., "Improvement of Crystalline Quality of Epitaxial Silicon–on–Sapphire by Ion–Implantation and Furnace Regrowth"; Solid State Electronics vol. 23, 1980, 803–806.

Linnros et al., "Ion–Beam Induced Epitaxial Regrowth of Amorphous Layers in Silicon on Sapphire"; Physical Review B, vol. 30, No. 7, 1984, pp. 3629–3638.

Lau et al., "Improvement of Crystalline Quality of Epitaxial Si Layers by Ion Implantation Techniques"; Appl. Phys. Lett. 34(1), 1979, pp. 76–78.

(List continued on next page.)

*Primary Examiner*—Edward Wojciechowicz
*Attorney, Agent, or Firm*—Dennis H. Epperson

[57] ABSTRACT

A high-frequency wireless communication system on a single ultrathin silicon on sapphire chip is presented. This system incorporates analog, digital (logic and memory) and high radio frequency circuits on a single ultrathin silicon on sapphire chip. The devices are fabricated using conventional bulk silicon CMOS processing techniques. Advantages include single chip architecture, superior high frequency performance, low power consumption and cost effective fabrication.

26 Claims, 39 Drawing Sheets

U.S. PATENT DOCUMENTS

| | | |
|---|---|---|
| 4,843,448 | 6/1989 | Garcia et al. . |
| 5,027,171 | 6/1991 | Reedy et al. . |
| 5,141,882 | 8/1992 | Komori et al. . |
| 5,229,644 | 7/1993 | Wakai et al. . |
| 5,294,823 | 3/1994 | Eklund et al. . |
| 5,300,443 | 4/1994 | Shimabukuro et al. . |
| 5,572,040 | 11/1996 | Reedy et al. ................................ 257/9 |

OTHER PUBLICATIONS

P.R. de la Houssaye, et al., "Fabrication of n–channel metal–oxide–semiconductor field–effect transistors with 0.2μm gate lengths in 500 Å thin film silicon on sapphire", Journal of Vacuum Science and Technology: Part B, vol. 10, No. 6, pp. 2954–2957, Nov./Dec. 1992.

P.H. Woerlee, et al., "Half–Micron CMOS on Ultra–Thin Silicon on Insulator", Technical Digest of the International Electron Devices Meeting 1989, Washington, D.C., pp. 821–824, Dec. 3–6, 1989.

Nobuo Sasaki et al., "A CMOS/SOS Synchronous Static RAM Fabricated with an Advanced SOS Technology", Japanese Journal of Applied Physics, Supplement 18–1, vol. 18, pp. 57–62, 1979.

Adele E. Schmitz et al., "A Deep–Submicrometer Microwave/Digital CMOS/SOS Technology", IEEE Electron Device Letters, vol. 12, No. 1, pp. 16–17, Jan. 1991.

Tsu–Jae King et al., "A Low–Temperature ($\geq 550°$ C) Silicon–Germanium MOS Thin–Film Transistor Technology for Large–Area Electronics", Technical Digest of the International Electron Devices Meeting 1991, Washington, D.C., pp. 567–570, Dec. 8–11, 1991.

R.E. Reedy et al., "Characterization of Defect Reduction and Aluminum Redistribution in Silicon Implanted SOS Films", Journal of Crystal Growth, vol. 58, No. 1, pp. 53–60, Jun. 1982.

R.E. Reedy et al., "Suppressing Al Outdiffusion in Implantation Amorphized and Recrystallized Silicon on Sapphire Films", Applied Physics Letters, vol. 42, No. 8, pp. 707–709, Apr., 1983.

G.A. Garcia et al., "High–Quality CMOS on Thin (100 nm) Silicon on Sapphire", IEEE Electron Device Letters, vol. 9, No. 1, pp. 32–34, Jan. 1988.

R.E. Reedy et al., "Thin (100 nm) SOS for Application to Beyond VLSI Microelectronics", Mat. Res. Soc. Symp. Proc., vol. 107, pp. 365–376, 1988.

HIGH-FREQUENCY WIRELESS COMMUNICATION SYSTEM ON A SINGLE ULTRATHIN SILICON ON SAPPHIRE CHIP

RELATED APPLICATION

This application is a continuation of application Ser. No. 08/218,561, filed Mar. 25, 1994, now U.S. Pat. No. 5,572,040 issued Nov. 5, 1996 inventors Reedy and Burgener and entitled "High-Frequency Wireless Communication System on a Single Ultrathin Silicon on Sapphire Chip"; which is a continuation-in-part of patent application Ser. No. 08/090,400, filed Jul. 12, 1993, now U.S. Pat. No. 5,416,043, by inventors Burgener and Reedy, and entitled "Minimum Charge FET Fabricated on an Ultrathin Silicon on Sapphire Wafer".

FIELD OF THE INVENTION

The current invention relates generally to the fabrication of semiconductor-on-insulator composite substrates, such as silicon-on-sapphire (SOS), and more particularly to devices, structures and processes for providing transistors in integrated circuits in silicon-on-sapphire material.

BACKGROUND OF THE INVENTION

SILICON-ON-SAPPHIRE SUBSTRATES AND DEVICES

The field effect transistor (FET) controls current conduction from a source region to a drain region by application of voltage to a gate conductor. If the gate conductor is insulated from the source-drain conduction channel, the device is called an insulated gate FET. The most common gate structure is that of metal oxide semiconductor, or the MOSFET. A variety of requirements force designs which contain doped semiconductor material below the insulating gate structure, i.e., in the conduction channel. As device dimensions shrink, doping concentrations must be increased to maintain proper transistor operation.

Dopant atoms and electrically active states (hereinafter called "fixed charge") in and below the conduction channel region of MOSFETs are charged and discharged during operation of the device. Since fixed charge is immobile, it does not contribute to FET current conduction. Therefore, the charging and discharging of fixed charges introduces a variable parasitic charge to the transistor with many negative effects, including scattering of conduction carriers; variation in threshold voltage; introduction of buried channel operation; introduction of a body effect; complication of device modeling; increased complexity for device and process design; increased electric fields; and difficulty in scaling devices to smaller dimensions or voltages, among others.

Dopant atoms are introduced into MOSFETs for specific reasons such as to adjust threshold voltage or to control substrate currents, with the aforementioned adverse side effects accepted as necessary by-products of dopant atom introduction. It would be very desirable to be able to introduce only the specific type, quantity and location of dopant atoms which are necessary to achieve the desired electrical characteristics for the device and to avoid or eliminate all other dopant atoms. The "ideal" semiconductor material would thus include a completely monocrystalline, defect-free silicon layer of sufficient thickness to accommodate the fabrication of active devices thereon. Ideal operation of MOSFETs would occur if there were no parasitic charge (which we define as unintended or excess dopant atoms plus electrically active states) in the conduction channel.

Another requirement for MOSFETs is to set threshold voltage, which is the gate voltage necessary to initiate conduction. A common technique for setting threshold voltage is to modify the dopant concentrations in the channel region. However, this approach has the undesirable side effects associated with dopant charge mentioned above. Also, adjusting threshold voltage by ion implantation requires at least two and often four masking steps which increase cost and decrease yield.

Previously, silicon-on-sapphire (SOS) has been used for high performance MOSFET microelectronics, primarily for applications requiring radiation hardness. Typically, a silicon film is epitaxially grown on a sapphire substrate. Ideally, the silicon film is thin compared to the source to drain separation (called the channel length) and the insulating substrate is thick enough to ensure no significant electrostatic coupling to a back plane, or mounting surface. Due to crystal and thermal expansion mismatches between the silicon and the sapphire, the silicon films are typically heavily populated with crystalline defects and electrically active states. The dominant type of crystalline defects are commonly called "twins". The quality of the silicon films can be improved by increasing the thickness of the silicon, hence traditional SOS is made with silicon films between 400 and 800 nanometers thick. This film thickness is capable of supporting transistors with channel lengths down to about 1 micron. Submicron channel length devices cannot be made in traditional SOS materials as thinner films are required.

The advantages of utilizing a composite substrate comprised of a monocrystalline semiconductor layer, such as silicon, epitaxially deposited on a supporting insulative substrate are well recognized. These advantages include the substantial reduction of parasitic capacitance between charged active regions and the substrate and the effective elimination of leakage currents flowing between adjacent active devices. This is accomplished by employing as the substrate an insulative material, such as sapphire ($Al_2O_3$), and providing that the conduction path of any interdevice leakage current must pass through the substrate.

An "ideal" silicon-on-sapphire wafer may be defined to include a completely monocrystalline, defect-free silicon layer of sufficient thickness to accommodate the fabrication of active devices therein. The silicon layer would be adjacent to a sapphire substrate and would have a minimum of crystal lattice discontinuities at the silicon-sapphire interface. Previous attempts to fabricate this "ideal" silicon-on-sapphire (SOS) wafer have been frustrated by a number of significant problems.

Historically, the first significant problem encountered in attempts to fabricate the ideal SOS wafer was the substantial incursion of contaminants into the epitaxially deposited silicon layer. In particular, substantial concentrations of aluminum contaminants, diffused from the sapphire substrate, were found throughout the silicon epitaxial layer. The inherent consequence of a high concentration of aluminum contaminants, effectively acting as acceptor-type impurities in the silicon epitaxial layer, is that there are unacceptably high leakage currents between the source and drain regions of P-channel active devices, such as MOSFETs (Metal Oxide Semiconductor Field Effect Transistor) and MESFETs (MEtal Semiconductor FET). These leakage currents may be of sufficient magnitude that the P-channel active devices may be considered to be always in an "on", or conducting state.

The incursion of substrate-oriented contaminants into the silicon layer was found to be an inherent consequence of high temperature processing steps. Such steps are typically utilized in both the initial epitaxial deposition of the silicon layer and the subsequent annealing of the silicon layer to reduce crystalline defects contained therein. Thus, it was recognized that high temperature annealing needed to be avoided to prevent the substantial incursion of substrate-orientated contaminants into the silicon layer.

However, in the absence of a high temperature anneal, a second problem appeared. The crystalline quality of the silicon layer, as epitaxially deposited, was of insufficient quality to permit the fabrication of active devices therein. It was discovered that the dominant crystal defects, i.e., twins, could be eliminated by solid phase epitaxial (SPE) regrowth, a process described in U.S. Pat. No. 4,177,084, entitled "METHOD FOR PRODUCING A LOW DEFECT LAYER OF SILICON-ON-SAPPHIRE WAFER", issued to Lau et al. As described by Lau et al., the SPE process provides a low temperature subprocess for improving the crystallinity of the silicon epitaxial layer of a silicon-on-sapphire composite substrate. The SPE process involves the high energy implantation (typically at 40 KeV to 550 KeV) of an ion species, such as silicon, into the silicon epitaxial layer at a sufficient dose (typically $10^{15}$ to $10^{16}$ ions/cm$^2$) to create a substantially amorphous silicon layer lying adjacent the silicon/sapphire interface while leaving a substantially crystalline layer at the surface of the original epitaxial layer. The thickness of the silicon epitaxial layer is substantially that intended for the completed silicon-on-sapphire composite substrate (typically 3000 Å–6000 Å). The ion species is implanted through the majority of the epitaxial layer so that the maximum disruption of the silicon crystal lattice is near, but not across, the silicon/sapphire interface to ensure that the amorphous region is adjacent the sapphire substrate. Throughout the ion implantation, the sapphire substrate is kept below about 100° C. by cooling with Freon or liquid Nitrogen. A single step low temperature (600° C.) annealing of the composite substrate is then performed to convert the amorphous silicon layer into crystalline silicon. During this regrowth, the remaining crystalline surface portion of the silicon layer effectively acts as a nucleation seed so that the regrown portion of the silicon epitaxial layer has a common crystallographic orientation and is substantially free of crystalline defects.

While Lau's SPE process does significantly improve the crystallinity of the silicon epitaxial layer, it also facilitates the diffusion of aluminum from the sapphire substrate ($Al_2O_3$) into the silicon epitaxial layer, which dopes the silicon film P-type. The contaminant concentration resulting from the use of the SPE process is, unfortunately, sufficient to preclude the practical use of integrated circuits fabricated on composite substrates processed with this SPE subprocess. The reasons for the failure of active devices to operate correctly are essentially the same as given above with regard to composite substrates fabricated utilizing high temperature processing steps. Additionally, it has been observed that the method described by Lau et al., can leave enough electrically active states in the silicon epitaxial layer to preclude its use for fabrication of integrated circuits.

U.S. Pat. No. 4,509,990, entitled "SOLID PHASE EPITAXY AND REGROWTH PROCESS WITH CONTROLLED DEFECT DENSITY PROFILING FOR HETEROEPITAXIAL SEMICONDUCTOR ON INSULATOR COMPOSITE SUBSTRATES", issued to Vasudev, also describes use of ion implantation and solid phase regrowth to prepare a silicon-on-sapphire wafer. In a first principle embodiment, a method for fabricating a silicon-on-sapphire wafer very similar to that taught by Lau et al. is described with the additional requirement that the implantation energy and the ion dose are constrained such that they are sufficiently low so as not to exceed the damage density threshold of the sapphire substrate. In a second principle embodiment, the method describes a residual high defect density in the silicon layer near the sapphire substrate. Both embodiments utilize a method for controlling the temperature of the rear surface of the sapphire substrate by mounting the substrate on a heat sink with either a thin film of thermal paste or a thin film of silicon positioned intermediate to the rear surface of the substrate and the heat sink to provide a high heat conductivity interface therebetween. During the ion implantation, the temperature of the heat sink is held at a constant temperature (typically between −20° C. and 250° C.) resulting in a substantial thermal gradient between the rear surface of the sapphire and the silicon layer (typically 150° C. to 200° C.). Thus, it follows that the silicon layer is at a temperature falling in the range of 130° C. to 450° C.

It has been found that the process described by Vasudev can result in incomplete and non-uniform removal of crystalline defects and electrically active states from the silicon layer due to non-uniform thermal contact of the rear surface of the sapphire with the heat sink. When the thermal paste is used, any air bubbles in the paste interface can result in the non-uniform control of the silicon layer temperature. Additionally, further processing of the wafer is made more difficult because it is necessary to completely remove all residues of the thermal paste before proceeding. While coating the rear surface of the sapphire with silicon to provide a thermal interface removes the problem of cleaning paste from the wafer before further processing, it has also been found to provide non-uniform temperature control of the silicon layer, due to roughness of the rear surface of the sapphire. Even when great care is taken to smooth the rear surface of the sapphire prior to applying the silicon interface layer, a costly and time consuming process, warping of the substrate caused by heating and cooling of the sapphire during the implantation can result in non-uniform thermal contact between the rear surface of the sapphire and the heat sink.

U.S. Pat. No. 4,659,392, entitled "SELECTIVE AREA DOUBLE EPITAXIAL PROCESS FOR FABRICATING SILICON-ON-INSULATOR STRUCTURES FOR USE WITH MOS DEVICES AND INTEGRATED CIRCUITS", issued to Vasudev, describes another method for tailoring defect densities in regions of silicon on insulator wafers. Using this process, the defect structure and dopant concentrations near the interface between the silicon and the insulator are optimized for specific applications. However, such residual defects would make such silicon films inappropriate for construction of fully depleted transistors.

Other methods to prepare silicon on sapphire films have been described. U.S. Pat. No. 4,385,937, entitled "REGROWING SELECTIVELY FORMED ION AMORPHOSIZED REGIONS BY THERMAL GRADIENT", issued to Ohmura, describes a method which uses large thermal gradients during solid phase regrowth to enhance electron mobility in the silicon semiconductor layer. U.S. Pat. No. 4,775,641, entitled "METHOD OF MAKING SILICON-ON-SAPPHIRE SEMICONDUCTOR DEVICES", issued to Duffy et al., describes a method which intentionally forms a silicon layer adjacent an insulating substrate which has a high density of naturally occurring crystallographic defects. The purpose of this region is to substantially reduce the back-channel leakage that occurs when the device is operated after being irradiated. U.S. Pat. No. 4,588,447, entitled "METHOD OF ELIMINATING P-TYPE ELECTRICAL ACTIVITY AND INCREASING CHANNEL MOBILITY OF SI-IMPLANTED AND RECRYSTALLIZED SOS FILMS", issued to Golecki, describes use of ion implantation, recrystallization and oxygen diffusion to neutralize aluminum in the silicon film. The resulting oxide layer on the outward surface is subsequently densified and etched away. U.S. Pat. No. 4,523,963, entitled "METHOD OF FABRICATING MOS DEVICE ON A SOS WAFER BY STABILIZING INTERFACE REGION WITH SILICON AND OXYGEN IMPLANT", issued to Ohta, et al. describes use of implanting both silicon and oxygen to form recrystallized silicon films. An insulating layer is intentionally formed at the interface of the sapphire substrate. This insulating layer contains a high density of crystalline defects and dopants.

The paper entitled "THIN (100 nm) SOS FOR APPLICATION TO BEYOND VLSI MICROELECTRONICS", published in the Mat. Res. Soc. Symp. Proc. Vol. 107, pp. 365–376, 1988, authored by Reedy et al. discusses preparation techniques for SOS films using a double anneal with temperatures as high as 1050° C. Mention is made that adequate thermal contact must be made to prevent self annealing, however, no method of providing such contact is disclosed. Characteristics of bulk silicon and the SOS films thus produced are compared. Likewise, it is noted that N- and P-channel transistors which were fabricated in these SOS films exhibited performance characteristics which rivaled those of similar devices fabricated in bulk silicon. However, there is no discussion of fully depleted transistor operation in this paper.

The paper entitled "HIGH-QUALITY CMOS IN THIN (100 nm) SILICON ON SAPPHIRE", published in IEEE Electron Device Letters, Vol. 9, No. 1, pp. 32–34, January, 1988, authored by Garcia et al., presents substantially the same information as the above referenced Reedy et al. paper with more emphasis placed on the characteristics of the enhancement-mode N- and P-channel MOSFET's fabricated in the SOS material.

Historically, as summarized above, significant progress has been made in producing SOS material having low concentrations of crystalline defects and substrate contaminates in the silicon. However, none of this work appears to recognize or address the effects or origin of charge states, which may also be present. Additionally, there are no teachings on how to produce SOS materials and devices therein which do not have the undesirable charge states discussed above.

SOS Single Chip Architecture High Frequency Wireless Communication System

It is well known in the IC industry that integration of several high performance functions in a single chip can reduce the cost of certain functions to a level making widespread use a commercial reality. One of the earliest examples is the pocket calculator. More recent examples include a variety of very complex computer central processing unit (CPU) chips. These new CPU chips have brought large computer system performance to reasonably priced desktop personal computers. Modern communications devices present greater difficulties in high level integration because they require digital computing capability (logic and memory) along with analog and RF circuitry.

Unfortunately, the implementation of large CPU chips in bulk Si CMOS processes have brought the integration path of such systems up against another technology barrier, power dissipation. The 15 Watt power dissipation range of these large CPU chips is at the limit of cooling technology that is conventional in desktop personal computing systems. The power dissipation of such large chips is definitely outside the range of battery powered wireless communication systems, even without adding the analog and RF functions.

The need to reduce power consumption in large single-chip systems for battery powered wireless communication systems is a need which has not previously been met. Portions of such systems have been constructed using Bipolar, GaAs, and CMOS technologies, but many obstacles arise that prevent these technologies from combining different functions in a single chip architecture. Current wireless products must divide digital, analog, and RF functions among several chips. Combining these functions on a single chip would enhance product performance and reliability while decreasing size, power consumption, and manufacturing costs. However, since different functions are currently manufactured in different technologies, attempts at high levels of integration which attempt to combine digital, analog, and RF functions on a single chip have proven to be difficult, expensive and generally unsatisfactory.

One attempt at integrating several different functions on a single substrate is the thin-film hybrid process. The combination of several chips on a thin-film hybrid substrate for RF applications requires highly precise line widths and circuit elements. To create these circuits, however, many processing steps are necessary. These steps include depositing a thin layer of metal on the substrate, coating it, and finally removing the metal layer by etching to form a desired pattern. Individual chips are then interconnected by optically patterned transmission lines within the hybrid package.

Not only is the hybrid fabrication process expensive and time consuming, it has yield problems that increase greatly as the number of integrated circuits on the substrate increases. When the substrate fails a production test due to a failure in just one of the many integrated circuits required, the substrate must be subjected to an expensive rework process or discarded along with all the otherwise good components. Yield losses from incorporation of multiple chips in a hybrid circuit are a significant cost factor.

Another factor which increases hybrid costs is variations in stray coupling between closely-spaced RF circuits. Stray RF coupling between active components, passive components, and interconnect wiring is a significant factor in reducing manufacturing yields. These stray coupling variations make it difficult to achieve repeatable circuit performance, thereby resulting in a serious yield problem.

For the above reasons, attempts to integrate systems more completely using monolithic microwave integrated circuits (MMICs) have increased. Many of these efforts have been frustrated, however, by a number of significant problems caused by using non fully-insulative substrates in attempts to increase device operating frequency and reduce costs. Problems such as high electrical loss, high inter-element parasitic capacitance, high conductor-to-substrate capacitances, and other negative effects result from using non fully-insulative substrates such as gallium arsenide (GaAs) and bulk Si.

U.S. Pat. No. 4,418,470, "METHOD FOR FABRICATING SILICON-ON-SAPPHIRE MONOLITHIC MICROWAVE INTEGRATED CIRCUITS", issued to Naster et al., describes the use of SOS technology for creating an improved method for production of active devices within a MMIC. Naster's method for fabricating MMICs in SOS is limited to conventional (i.e., not fully-depleted) silicon-on-sapphire. No mention of digital, analog, memory, or analogto-digital components are included. Additionally, Naster is limited to low frequency operation due to gate length limitations of conventional SOS.

In present bipolar technology, two well known disadvantages occur: high power dissipation and low density. High power dissipation is a result of the high parasitic junction capacitance associated with using silicon as the substrate. The cross section of a bipolar device, because of its complexity, is much larger than that of a CMOS device. Consequently, the scale of integration (number of components that can be placed on a single chip) is much lower than CMOS.

Present GaAs technology is well suited for RF power active devices, but is not suitable for passive components. The substrate conductivity limits its suitability for the inductors, and lack of a stable oxide makes it unsuitable for the capacitors. GaAs technology is also not suitable for low power logic because it is not possible to build the P-channel MOS device required for CMOS logic. Finally, GaAs is not suitable for analog application because of its inability to closely match device thresholds. GaAs, overall, has proven to be an expensive technology with several manufacturing problems.

It is well known that bulk Si CMOS has frequency performance limits considerably lower than those of Bipolar or GaAs devices. Bulk Si CMOS has limited applicability for construction of RF power amplifiers in the frequency range above 700 MHz. Also, because the substrate is semiconductive, it is unsuitable for RF inductors. Power limitations become severe when bulk Si CMOS is used for ultra-large scale integration of logic in the range beyond 1 million gates. It is generally recognized that a need for a new type of quiet logic must be developed to prevent the substrate displacement currents in standard bulk Si CMOS logic from disrupting the operation of on-chip precision analog and analog-to-digital components. Quiet logic requires more components than conventional CMOS logic.

In conventional SOS technology, there are certain well known properties that limit the integration of a single chip architecture. For example, the limitation in film thickness is not adequate for fabrication of RF active devices and high speed logic devices. Short devices have shallow junctions that could not benefit from the insulating substrate.

A second property of conventional SOS technology that makes it unsuitable for the integration of single chip architecture is the limitation deriving from the kink effect. This characteristic makes conventional SOS technology unsuitable for use in linear amplifiers since devices with transfer function kinks are not linear.

A third property of conventional SOS technology is the high density of active-states, which makes it unsuitable for high-speed memory applications where sense amplifier offsets are important. Bit line and word line drive current are a dominant source of power consumption in a memory. Drive current is directly proportional to the swing required to overdrive the sense amplifier offset voltage. A typical requirement of 200 mV (milli volts, or $10^{-3}$ volts) would have to be doubled if sense amplifier offset voltages reached 200 mV.

In general, prior attempts to use conventional SOS technology for high volume commercial applications have failed due to the limitations of the substrate material. Conventional SOS technology does have superior radiation hardness characteristics, however, this is usually achieved only by accepting inferior device performance. Hundreds of millions of dollars have been spent at several research facilities around the country in attempts to overcome the problems of SOS technology. The net result is that 20 or more years of such research activity has failed to produce a robust, commercially viable fabrication technology for SOS that even approaches the low manufacturing costs, high yields and scale of integration possible in conventional bulk Si MOS technology.

A final factor required when integrating several functions into a single chip architecture is low noise operation. In order to transmit strong and clear signals, little or no noise must exist in the transmission. However, transistors naturally create noise, and it is difficult and expensive to design around high noise characteristics. In addition, various frequency levels are required to transmit information. For instance, baseband information transmitted contains so called 1/f noise (low frequency noise) yet, information transmitted in a cellular phone, requires the RF output transistors to run at high frequencies. Therefore, in a single chip technology, transistors must be able to function at low and high frequencies with as little noise as possible.

Conventional SOS and bulk Si CMOS technology have high noise factors at low frequency levels due to the charging and discharging of electrical states. Bulk Si Bipolar technology demonstrates low noise characteristics at low frequencies and moderate noise at high frequency levels, but has high power dissipation and expensive processing, which causes severe limitations. GaAs MESFETs (metal Schottky field effect transistors) have the worst 1/f noise characteristics over conventional SOS and bulk Si because of its high state density, but demonstrates the lowest noise characteristics at high frequencies. It would be a significant advantage over the above technologies if a transistor could function consistently with low noise in a cost effective single chip process.

RADIO FREQUENCY ELEMENTS

The U.S. government controls and allocates frequency bands for various applications such as radio, T.V., and wireless communications. The frequency bands allocated for wireless communications, such as cellular phones, are set at much higher frequency levels than the frequency bands for radio or television. RF (radio frequency) technology must be devised to function at these higher frequencies in order to clearly convey information in a cost-effective manner. However, device design is substantially more difficult and complicated at higher frequencies. Conventional technology can easily work with frequency levels under 700 MHz (700 million cycles per second), but encounters many obstacles at higher frequencies.

In addition to higher frequency requirements, there is an ever-increasing demand to have more information transmitted simultaneously, without interference from other channels. Higher information rates imply higher bandwidths as well as an increase in the number of communication channels.

The baseband bandwidth is defined as the bandwidth necessary to convey the information transmitted. The more complex the information becomes, the greater baseband bandwidth required. Within carrier frequency bands, channels are spaced by a distance greater than 2 times the baseband bandwidth to prevent interference. At lower frequencies, such as AM radio, baseband bandwidth is lower, which allows more channels to fit within the carrier frequency band compared to the number of channels that can fit into an FM radio band. The quality of sound transmitted, however, is not as clear as FM radio whose wider bandwidth creates better sound quality, but requires greater spacing between channels. The same effect applies to higher frequency bands used for cellular phones.

The major obstacle to fabricating high frequency devices on an insulative substrate using present technology methods is the inability to achieve an adequate device gain-bandwidth product. A gain-bandwidth product, $f_t$, is defined as the signal amplification times the frequency, (or as the frequency at which device gain equals 1). To achieve high gain-bandwidths for wireless communications above 700 MHz, high transconductances and low device capacitances are required. These requirements are necessary because the gain of a transistor is simply the ratio of transconductance to device output conductance, both of which are affected by device capacitance, which is a parasitic load. An acceptable high frequency performance for a gain bandwidth product suitable for a 700 MHz amplifier would be, for example, an $f_t$ of 10 gigahertz (GHz).

Devices fabricated in bulk silicon (Si) are characterized by comparatively high parasitic capacitances. Thus, the gain-bandwidth product for such devices runs well below 10 GHz. The dominant output capacitances are due to the capacitance from gate to source and from gate to drain resulting from coupling through the mobile channel charge, as well as the parasitic overlap capacitance from the gate to the lightly doped drain diffusions (LDD regions) and due to the junction capacitances from the channel, source and drain diffusions to substrate.

The use of silicon-on-insulator (SOI) technology is a well known method for reducing junction capacitance in metal oxide semiconductor (MOS) devices. If the junctions are diffused to a depth greater than the film thickness, the bottom wall of the junction becomes the insulator top surface, and the bottom wall component of the junction capacitance is eliminated. The problem facing designers who use conventional SOI technology in this manner is the thickness of the epitaxial silicon layer, i.e., in the range of 4,000 to 6,000 Å. The source and drain regions are diffused in a downward direction to at least the same depth. Additionally, a bulk Si process step resulting in a 4,000 Å diffusion depth results in approximately 3,000 Å of sideways diffusion. It is generally considered acceptable for the sideways diffusion to be as much as ⅕ of the gate length. Therefore, this amount of sideways diffusion is characteristic of a 1.5 μm gate-length process.

Unfortunately, to produce a device with transconductance high enough to achieve gain-bandwidths in the range beyond 10 GHz, channel lengths must be shortened considerably below 1.5 μm. For a 0.8 μm channel length device, required junction depths are ⅕ of 0.8 μm, or approximately 0.15 μm (1500 Å). Fabricating such a device using traditional silicon-on-sapphire (SOS) techniques on an insulative substrate results in unacceptably high junction capacitance. This effect occurs because a 0.15 μm junction bottom wall depth is far shallower than the 0.4 μm depth of the interface between the Si film and the sapphire insulator. The bottom wall capacitance cannot therefore be reduced by contact with the insulator. (Note: As used herein, traditional or conventional SOS is defined as a 400 to 800 nanometers [i.e., 4,000 Å to 8,000 Å] thick silicon film on a sapphire wafer. This film thickness is capable of supporting transistors having minimum channel lengths of about 1–1.5 microns. Additionally, traditional or conventional SOS has a high level of crystalline defects and is not fully depleted.)

Short channel effects seriously degrade output conductance if the device is constructed with a short, deep channel in bulk silicon or conventional SOS. A short, deep channel region increases the control the drain has over the channel near the source. This causes threshold to vary with drain voltage and channel length. The ability of the gate to shut off the channel is also degraded.

Not only are there limitations in bulk Si for constructing high frequency active RF components, but also in the integration of both active and passive RF components in a single chip. The physical dimensions of RF active components in non-insulating substrates, can be small enough to be incorporated on the top surface of a Si or gallium arsenide (GaAs) device. Unfortunately, the conductivity of the underlying substrate (typically doped above $1 \times 10^{15}$ cm$^{-3}$) results in unacceptably high loss factors at frequencies above 700 MHz for passive components such as inductors. GaAs results in a much lower loss factor than bulk Si, but for the best results, an insulating substrate must be used to integrate on-chip inductors or interconnects.

ANALOG ELEMENTS

It is generally recognized that there are numerous problems associated with the integration of precision analog components, such as high resolution analog-to-digital converters (ADCs) and digital-to-analog converters (DACs), with complex logic systems on the same non-insulating silicon substrate. A non-insulating substrate carries high logic noise voltages as a result of displacement currents in the logic and at the logic/external-bus interface. An insulating substrate, such as sapphire, is required to isolate the analog components from the substrate noise produced by the digital logic, random-access memory (RAM) and I/O in highly integrated systems.

However, the fabrication of analog circuitry on insulative substrates is severely limited by a problem arising in N-channel MOS devices. N-channel MOS devices fabricated in conventional SOS technology suffer from a limitation known as the "kink effect."

The kink effect is associated with floating undepleted regions under the conduction channel, and is a result of holes produced from drain impact ionization current. These holes propagate toward the source and charge the undepleted portions of the substrate below the gate. For N-channel devices, the substrate region charges positively, and the resulting source-body voltage change increases the current in the transistor. This extra current distorts the operation of the transistor, causing an amount of current to pass through the devices that is not proportional to the gate control voltage. This unpredictable and non-linear operation makes the devices unsuitable for analog circuit design.

For example, analog circuit designers typically use a set of curves, referred to as a family of curves, to assist them in a circuit design. These curves determine the drain to source current ($I_{DS}$) at a given drain to source voltage ($V_{DS}$), resulting from a given gate to source voltage ($V_{GS}$). The curves show a saturation of the current after a certain point, which results in a family of drain current curves, one for each gate voltage. In ideal behavior, drain current saturates (or stops increasing) above a certain drain voltage referred to as $V_{DSAT}$, or saturation voltage. However, where the kink effect is present, as in devices fabricated on traditional SOS substrates, increases in drain voltage produce significant impact ionization at a certain value, and the drain current increases as a highly non-linear function of drain voltage.

In the construction of linear components required for precision analog components, such as linear preamplifiers, the kink effect must be eliminated. If not, a high degree of non-linearity is present in their transfer functions. Also, the increase in current causes a decreased output conductance and therefore a decrease in device gain.

Another major limitation for analog components in bulk Si, SOI, and conventional SOS is the source body effect. Source body effects are a well known problem in these technologies. Integrated circuit (IC) industries spend large amounts of resources in attempts to design transistors to function in the presence of source body effects.

The source body effect occurs when the source is not held at the substrate or body potential. When there is an increase in source potential, there must be an increase in surface potential at the source-end of the device if the source current is to be held constant. Unfortunately, the increase in surface potential creates a deeper depletion region under the channel. The increased depletion charge competes with mobile channel charge for the total charge induced voltage drop across the gate oxide capacitance. The effect is the same as an increase in threshold voltage caused by an increase in fixed depletion charge.

When the gate is on for a typical analog transmission gate in bulk Si, SOI, or traditional SOS, and the analog source input is in the voltage range approximately half-way between the supply voltages, the source-body voltage of both PMOS and NMOS devices plays an important role in increasing "on resistance". Consider a case with a 2.5 volt positive supply voltage, a 2.5 volt negative supply voltage, and the input source near zero volts. The source-body voltage of 2.5 volts for either N or P transistor contributes to an increase in threshold voltage by an amount of nearly 1 volt in a typical process. "On resistance" is inversely proportional to the gate voltage in excess of threshold, otherwise known as "gate drive". When device threshold is 0.7 volts plus 1.0 volts for source-body voltage, a gate supply voltage of 5 volts produces a gate drive of less than 1 volt.

LOGIC ELEMENTS

Technologies such as GaAs and Bipolar offer many desirable radio frequency properties. However, high power consumption results when large amounts of logic are required.

Complementary MOS (CMOS) consumes the lowest logic power of any common technology, but is severely limited in speed and power by the poor performance of the PMOS devices in comparison to NMOS devices. PMOS channel widths must be significantly larger than NMOS channel widths. However, CMOS logic circuitry would exhibit many significant advantages for logic circuity if the PMOS channel widths could be reduced to be comparable to the NMOS channel widths.

One of the problems associated with bulk Si PMOS devices fabricated in CMOS processes is poor transconductance characteristics. This drawback exists for several reasons. PMOS mobility is low as a result of hole mobility being lower than electron mobility. Additionally, CMOS processes include scattering by the total quantity of N-type and P-type dopants required to achieve proper device thresholds. The PMOS channel widths, also, must be made significantly larger than the NMOS channel widths in order to provide drive currents adequate to maintain high clock speeds. Consequently, the PMOS devices substantially increase the capacitive input load presented by a CMOS gate, resulting in high operating voltage and power requirements. If a logic element capacitive load could be reduced as a result of narrower PMOS devices, the excess speed could be traded for narrower N and P devices operating at the same speed, but consuming less silicon area. Less silicon area results in reduced fabrication costs.

Another factor contributing to wide NMOS and PMOS channels for logic elements in bulk Si and conventional SOS is the source-body effect as described in the above section on analog components.

A second important logic power limitation in bulk Si arises from an increased logic supply voltage required when the logic subsystem must be operated on a CMOS chip with a linear subsystem requiring a negative substrate bias. Part of the logic power reduction objective is to eliminate the effects of substrate bias in increasing the logic supply voltage.

In order for linear subsystems to operate in the voltage range above and below ground, it is often required that the substrate voltage of an integrated circuit be biased in the range of 3 to 5 volts below ground. A negative substrate bias requires an increase in logic power supply voltage to maintain speed while overcoming well known source-body threshold voltage increases. Such increases result from the N-channel devices operating with a negative substrate bias.

When an increase in speed is desired, higher supply voltages must be used in bulk Si technology with negative substrate bias. If the supply voltage could be reduced by a significant factor, dynamic current would be reduced in direct proportion. Because logic power is dominated by the product of dynamic current and voltage, power can be reduced as the square of the voltage decreases. In bulk Si, however, it is very difficult to lower voltages and maintain speed with a negative substrate bias.

Another problem with traditional SOS MOS devices is the limitation to channel lengths in excess of 1.5 $\mu$m. Because digital system power is related strongly to channel lengths, these relatively long channel lengths result in excessively high power requirements for the digital subsystem of a single chip architecture wireless communication system.

Other difficulties exist in bulk Si for PMOS logic elements relating to the source and drain doping requirements. The diffusivity of boron in silicon at a given temperature is far higher than arsenic, the dopant of choice for N-channel MOS transistor source and drain diffusions. High temperature and time combinations are required to diffuse arsenic to a depth sufficient to prevent source and drain "contact spiking" in a bulk CMOS process. If the arsenic is not diffused sufficiently, the contact will spike, or vertically penetrate the bottom wall of the junction. A shorting of the diffusion to the substrate then exists.

In submicron bulk Si technology, high time/temperature combinations for arsenic diffusion causes excessively deep boron diffusion for the PMOS device. The time-temperature products required to eliminate contact spiking cause sideways diffusion of the boron source and drain into the PMOS channel. To compensate for this action, PMOS transistor gate lengths must be drawn about 0.1 $\mu$m greater than NMOS gate lengths. If the time-temperature products are lowered, less sideways diffusion occurs thereby allowing PMOS channel lengths to be drawn at the same length, or shorter than the NMOS devices. To have the ability to create equal or shorter PMOS electrical channel lengths than the NMOS channel lengths, while still retaining acceptable output conductance value for logic devices, would be a major improvement over present technologies.

Finally, the effect of gate-drain and gate-drain parasitic overlap capacitance in conventional logic is enhanced by what is commonly known as "the Miller effect" in linear circuits. Consequently, a non-negligible portion of the current from a logic element driving a CMOS inverter is consumed in charging the parasitic overlap capacitance enhanced by the Miller effect as the inverter output makes a rapid voltage transition. Again, if the PMOS gate width is reduced to approximately the same measurement as the NMOS gate width in a logic inverter and the reduced lateral diffusion causes less overlap capacitance, speeds will increase by nearly a factor of 2 by comparison to inverters fabricated at the same feature size in bulk Si or conventional SOS CMOS processes.

MEMORY ELEMENTS

The key memory elements comprising a typical memory chip include decoders, drivers, memory cells and sense amplifiers. Memory power is dominated by word line voltages required to adequately drive cell pass transistors. This is true for both static and dynamic random-access memories (SRAM and DRAM).

GaAs and Bipolar technologies are not suitable for large amounts of memory. These technologies are incapable of integrating the amount of memory, both in terms of size and power, required for a single-chip wireless communication system.

The high power consumption, read/write switching currents, and noise introduced through the substrate to precision analog components are significant limitations in bulk Si CMOS technology. One major source of noise current generation is the current required to charge the word lines. A major portion of this current is displacement current resulting from charging the pass-gate capacitance.

In order to improve power dissipation and high noise current generation in bulk Si, word line current must be reduced. There are numerous sources that contribute to word line current in addition to pass-gate capacitance. One such source is the interconnect capacitance from word line to substrate.

Interconnect capacitance is reduced in the SOI process. However, SOI processes suffer from high pass-gate capacitance as a result of the 1.5 $\mu$m limitation in device length previously described. Because interconnect capacitance is typically less than 10% of total word line capacitance, the benefit in reducing it is perhaps on the order of only 5%. There is, however, a more significant benefit from making the use of SOI technology practical. The benefit is derived from the elimination of the coupling of voltage noise to the sensitive analog circuitry from the word line and associated pass transistor dynamic current coupling through the conductive substrate.

A second source of word line current is the capacitive loading of "off" pass transistors. In any SRAM cell, half of the pass transistors connected to the word line will not turn on, and therefore, no conductive channel forms. In a DRAM cell, such as used for coefficient RAM in telecommunication system digital filters, the abundance of digital 1's in the coefficients results in a significant fraction of the pass transistors not being turned on. The charge required to drive the gate of the "off" pass transistors in a bulk Si CMOS DRAM or SRAM is higher than the charge required to drive a transistor to the threshold voltage. The total charge required results from the gate voltage pushing out the depletion layer charge in the conductive substrate below over the entire range of gate voltage swing. This kind of charge push is commonly known as "deep depletion."

A third source of word line current results from charging the gate capacitance of the "on" pass transistors. The gate capacitance is a result of the device width required to achieve a given speed. If bit line capacitance can be significantly reduced, so can the pass transistor device width. Pass transistor size reductions, then, can contribute to a reduction in overall memory operating current.

Another strong contributor to word line current is the supply voltage required by the word line driver to overcome the source-body effects in the pass transistor. This high supply voltage, necessary in bulk Si and conventional SOS, significantly increases the power required to operate the memory. The power required to operate the word lines in a memory is dominated by the product of driver supply voltage and by the displacement current. This current is proportional to driver supply voltage at a given clock frequency. Because power is the product of current and supply voltage, word line drive power can be reduced as the square of the supply voltage.

In addition, there are several sources contributing to bit line capacitance that, if reduced, will assist in the reduction of pass-transistor size and bit line charging current. The sources include parasitic overlap capacitances from the pass transistor gate to source and drain, the parasitic junction capacitance of the diffusions on the bit line, and the interconnect capacitance of the bit line itself.

A major source of bit line current is the charge required to deliver the voltage swing required at the sense amplifier. Voltage swing determines how much drive current is required on the bit lines to reach an unambiguous sense amplifier result within the required time interval. By decreasing the sense amplifier offset voltage, the required voltage swing decreases. Bit line current is a major factor contributing to overall memory power requirements in large high-speed memories.

This charge is determined largely by cell area. There are several factors that contribute to large cell area in bulk Si devices. For example, there is a need to devote a fraction of the cell or cell array area to a substrate tie and a "well tie". Both ties are required in every cell, or in some cases every fourth cell, to stabilize the voltage in both the N and P diffusions underlying the N and P devices. The need for a well structure yields another factor limiting SRAM cell area in bulk Si, the need to increase N-channel to P-channel spacing to accommodate the added well dimensions.

Also, a significant contributor to limited cell size in DRAMs is the requirement to maintain signal charge sufficient to overcome upsets resulting from alpha particle track charge collection. With an insulating substrate, charge collection from the portion of the particle track in the substrate is eliminated. Vertical track charge collection, therefore, cannot be enhanced by well known phenomena, such as "funnelling". In bulk Si, this process distorts the fields under the depletion region and results in collection of alpha track charge deep within the bulk Si MOS substrate.

SUMMARY OF THE INVENTION

To overcome limitations of the previously described SOS films and transistors fabricated therein, the present invention comprises a fabrication process which creates a substantially pure silicon film on sapphire. A substantially pure silicon film is defined as one which initially has substantially no dopant atoms or electrically active states, either in the silicon film or at either top or bottom interface. Substantially no electrically active states is defined as an areal density of electrically active states which is approximately $2 \times 10^{11}$ cm$^{-2}$ to $5 \times 10^{11}$ cm$^{-2}$. The present invention starts with a silicon film epitaxially deposited onto a sapphire substrate. Ion implantation, solid phase regrowth and anneals are performed to eliminate crystalline defects and electrically active states without causing aluminum outdiffusion from the sapphire substrate into the silicon film.

Ion implantation species, dose and energy are specified with respect to the silicon film thickness. Substrate and silicon film temperatures are controlled during the ion implantation step to control proper amorphization and to ensure that no states are introduced or left in the silicon by ion implantation induced thermal effects. Certain anneal conditions are maintained during post solid phase regrowth processing. In particular, anneals in non-oxidizing conditions are performed at temperatures below 950° C. Above that temperature, it has been discovered that electrically active states may be introduced into the silicon film.

In accordance with the current invention, a starting material structure is described which is an intrinsic silicon film (i.e., contains no dopant atoms) on a sapphire substrate with substantially no electrically active states throughout the structure. The current invention describes how to manufacture such a structure and how to maintain its properties throughout a device fabrication process.

The current invention further describes fully depleted transistors fabricated in the substantially pure silicon on sapphire material. During MOSFET operation, a depletion region forms under the control gate. In the present invention, the depletion region extends throughout the silicon film and reaches the silicon-sapphire interface before the conduction channel inverts. This is called a fully depleted transistor. Fully depleted operation has the following desired effects: high performance devices due to reduced carrier scattering; inherently tight threshold voltage control; elimination of buried channel operation; substantial elimination of source-body effects; simplicity of modeling due to reduction of or elimination of parasitic effects; device and process simplicity; low transverse electric fields; ease of scaling to smaller device dimensions and operating voltages; and an option for inherently symmetric threshold voltages for N and P channel MOSFETs (i.e. $|V_{tn}|=|V_{tp}|$). These advantages result primarily from elimination of virtually all parasitic charge in the channel region and from fully depleted operation.

The current invention further comprises process descriptions which ensure these properties are maintained in the channel region of MOSFETs at the end of an integrated circuit manufacturing process. Thus, the current invention comprises materials, processes and structures which result in fully depleted transistor operation in silicon films on sapphire substrates with minimum parasitic charge in the conduction channel.

The current invention utilizes the substantially pure silicon film on sapphire material to fabricate a wireless communication system on a single chip. The wireless communication system chip includes diverse types of circuitry which, heretofore, have not been successfully implemented on a single chip. Specifically, the wireless communication system of the present invention combines digital computing capability (logic and memory) along with analog and RF circuitry on a single chip. This chip has low power consumption, suitable for battery powered operations, low noise characteristics and can be manufactured in large quantities in a cost effective manner.

Radio frequency circuitry fabricated in ultra-thin silicon on sapphire is described. These RF circuits include both active and passive elements, wherein the gain bandwidth product of the active elements is on the order of 10 GHz.

The invention also includes analog devices fabricated in ultra-thin silicon on sapphire. Such analog devices exhibit substantially no kink effect and substantially no source body effects.

CMOS logic circuitry fabricated in accordance with the present invention provides CMOS circuits wherein the PMOS gate length is approximately the same as the NMOS gate length. Thus, in a logic inverter, the reduced lateral diffusion creates less overlap capacitance, thereby increasing speeds by nearly a factor of 2 in comparison to inverters fabricated at the same feature size in bulk Si or conventional SOS CMOS processes.

In one embodiment, the present invention discloses a method of fabricating a silicon on sapphire wafer having an intrinsic silicon layer on a sapphire substrate. The method comprises the steps of: epitaxially depositing a layer of silicon on a surface of a sapphire substrate; implanting a given ion species into the layer of silicon under such conditions that the implanted ions form a buried amorphous region in the silicon layer which extends substantially from the surface of the sapphire substrate into the layer of silicon, thus leaving a surface layer of monocrystalline silicon covering the buried amorphous region; maintaining the layer of silicon at or below a predetermined temperature which is substantially uniform throughout the layer of silicon during the ion implanting step; and annealing the wafer to induce solid phase epitaxial regrowth of the buried amorphous region using the surface layer of monocrystalline silicon as a crystallization seed.

In a further embodiment, the implanting step further comprises the step of selecting the energy and intensity of the implanting ions from within a range of energy and intensity values having a lower limit which is sufficient to amorphize the buried region of silicon and an upper limit which is insufficient to release substrate-originated contaminants into the silicon layer.

Another embodiment of the method further comprises the step of performing a high temperature anneal sequence at or below approximately 950° C. in a non-oxidizing environment thereby removing residual defects in the layer of silicon without introducing bandgap or interface states. Additionally, the step of performing a high temperature anneal sequence in a non-oxidizing environment to remove residual defects in the layer of silicon without introducing bandgap or interface states further comprises selecting the temperature of the high temperature anneal to be within the range of from approximately 900° C. to approximately 950° C., preferably a temperature ramp to 900° C.

In yet another embodiment, the method further comprises the steps of: continuing the ramp to 1000° C. in an oxidizing environment and oxidizing a portion of the layer of silicon at 1000° C., thereby leaving a thin layer of intrinsic silicon interposed between the sapphire substrate and the oxidized layer; and etching away the oxidized layer. Additionally, the method may further comprise the step of controlling the steps of oxidizing and etching to reduce the layer of silicon on the sapphire substrate to a thickness which is in the range of from approximately 50 nm to approximately 110 nm, preferably 110 nm.

In another embodiment, the step of maintaining the layer of silicon at or below a predetermined temperature during the amorphization of the silicon may further include selecting the predetermined temperature to be approximately equal to room temperature. Alternatively, the step of maintaining the layer of silicon at or below a predetermined temperature further comprises selecting the predetermined temperature to be approximately equal to zero degrees centigrade (0° C.).

In another embodiment, the step of annealing the wafer to induce solid phase epitaxial regrowth of the buried amorphous region further comprises selecting the temperature of the annealing step to be within the range of from approximately 500° C. to approximately 600° C.

In a further embodiment, the amorphization step of implanting a given ion species into the layer of silicon further comprises the steps of: selecting silicon as the given ion species; and selecting the energy and total dose of the silicon ions from within a range of energy and total dose values having a lower limit which is sufficient to amorphize the buried region of silicon and an upper limit which is insufficient to release substrate-originated contaminants into the silicon layer. Additionally, the step of selecting the silicon ion energy further includes selecting the silicon ion energy to be within the range of from approximately 185 keV to approximately 200 keV. Furthermore, the step of selecting the silicon ion total dose further includes selecting the silicon ion intensity to be within the range of from approximately $5 \times 10^{14}$ cm$^{-2}$ to approximately $7 \times 10^{14}$ cm$^{-2}$.

In yet another embodiment of the method, the step of maintaining the layer of silicon at or below a predetermined temperature which is substantially uniform throughout the layer of silicon during the ion implanting step further comprises flooding a surface of the sapphire substrate which does not have the layer of silicon deposited thereon with a cooled gas.

In one embodiment of the method the step of epitaxially depositing a layer of silicon on a surface of a sapphire substrate further comprising controlling the deposition to produce a silicon layer having a thickness in the range of from approximately 250 nm to approximately 270 nm.

The invention is also embodied as a device comprising: a sapphire substrate having a first surface; and a layer of silicon substantially free of crystalline defects and charge states deposited on the first surface of the sapphire substrate. Preferably, the layer of silicon has a predetermined thickness which is less than approximately 110 nm. Additionally, the layer of silicon has an areal density of electrically active states which is less than approximately $2 \times 10^{11}$ cm$^{-2}$ to $5 \times 10^{11}$ cm$^{-2}$.

The present invention may also be embodied as a silicon-on-sapphire wafer wherein the silicon layer is less than approximately 110 nm thick and has an areal density of electrically active states which is less than approximately $2 \times 10^{11}$ cm$^{-2}$ to $5 \times 10^{11}$ cm$^{-2}$, wherein the wafer is produced by the process comprising the steps of: epitaxially depositing a layer of silicon on a surface of a sapphire substrate; implanting a given ion species into the layer of silicon under such conditions that the implanted ions form a buried amorphous region in the silicon layer which extends substantially from the surface of the sapphire substrate into the layer of silicon, thus leaving a surface layer of monocrystalline silicon covering the buried amorphous region; maintaining the layer of silicon at or below a predetermined temperature which is substantially uniform throughout the layer of silicon during the ion implanting step; and annealing the wafer to induce solid phase epitaxial regrowth of the buried amorphous region using the surface layer of monocrystalline silicon as a crystallization seed.

Another embodiment of the invention is a MOSFET comprising: a sapphire substrate; and a layer of silicon deposited on the sapphire substrate wherein the layer of silicon further comprises: a source region; a drain region; and a channel region, wherein the channel region is less than approximately 110 nm thick and has an areal density of electrically active states which is less than approximately $2 \times 10^{11}$ cm$^{-2}$ to $5 \times 10^{11}$ cm$^{-2}$ thereby capable of being fully depleted. Additionally, the source region and/or the drain region may further comprise dopant atoms.

In another MOSFET embodiment, the channel region further comprises dopant atoms in a concentration which has a lower limit which is sufficient to induce surface channel conduction and an upper limit which does not prevent full depletion of the channel region.

The MOSFET embodiment may further include a gate dielectric layer adjacent the channel region and a gate conductor layer adjacent the gate dielectric layer. Additionally, the gate conductor layer further comprises N$^+$ polysilicon in contact with the gate dielectric layer. Alternatively, the gate conductor layer further comprises P$^+$ polysilicon in contact with the gate dielectric layer. In some embodiments, the gate conductor layer further comprises a material having a metal work function which is in the range of from 4.5 eV to 4.7 eV. For example, the material having a metal work function which is in the range of from 4.5 eV to 4.7 eV may be selected from a group of materials which includes P$^+$ polygermanium, tungsten, chromium, indium tin oxide and titanium nitride.

Another MOSFET embodiment of the invention comprises a sidewall spacer adjacent the gate dielectric layer and adjacent the gate conductor layer.

Other embodiments of the MOSFET invention may include a lightly doped source region and/or a lightly doped drain region.

In a first primary embodiment, the present invention is a MOS device comprising: an insulating substrate; a layer of silicon formed on the insulating substrate wherein the silicon layer is less than approximately 1000 Å thick; a source region formed in the silicon layer; a drain region formed in the silicon layer; a channel region formed in the silicon layer between the source region and the drain region; and a gate positioned adjacent the channel region. In a first alternate embodiment of the first primary embodiment, the insulating substrate comprises sapphire. In a second alternate embodiment of the first primary embodiment, the silicon layer has an areal density of electrically active states which is less than approximately $5 \times 10^{11}$ cm$^{-2}$. In a third alternate embodiment of the first primary embodiment the channel has a length of less than approximately 0.8 μm. In a fourth alternate embodiment of the first primary embodiment the source region and the drain region overlap the gate by less than approximately 0.06 μm.

In a second primary embodiment, the present invention is a single chip radio frequency integrated circuit comprising: an insulating substrate; a layer of silicon formed on the insulating substrate wherein the silicon layer is less than approximately 1000 Å thick; an active device fabricated in the silicon layer, the active device having a gain-bandwidth product of at least 10 GHz; and a passive component fabricated on the layer of silicon formed on the insulating substrate and connected to the active device to form an rf circuit. In a first alternate embodiment of the second primary embodiment the insulating substrate comprises sapphire. In a second alternate embodiment of the second primary embodiment the silicon layer has an areal density of electrically active states which is less than approximately $5 \times 10^{11}$ cm$^{-2}$.

In a third primary embodiment, the present invention is a combination of: an insulating substrate; a layer of silicon formed on the insulating substrate wherein the silicon layer is less than approximately 1000 Å thick; and a logic component fabricated in the silicon layer. In a first alternate embodiment of the third primary embodiment, the insulating substrate comprises sapphire. In a second alternate embodiment of the third primary embodiment, the silicon layer has an areal density of electrically active states which is less than approximately $5 \times 10^{11}$ cm$^{-2}$. In a third alternate embodiment of the third primary embodiment, the logic component is selected from the group including a NAND gate, a NOR gate and a transmission gate. In this embodiment, the logic component may comprise CMOS FET transistors.

In a fourth primary embodiment, the present invention is a radio frequency circuit comprising: an insulating substrate; a layer of silicon formed on the insulating substrate wherein the silicon layer is less than approximately 1000 Å thick; an active circuit portion comprising a MOSFET fabricated in the silicon layer; and a passive circuit portion fabricated on an oxidized layer of the layer of silicon formed on the insulating substrate and connected to the active device to form a radio frequency circuit comprising: a capacitor; an inductor; and a resistor.

In a fifth primary embodiment, the present invention is a NAND gate comprising: an insulating substrate; a layer of silicon formed on the insulating substrate wherein the silicon layer is less than approximately 1000 Å thick; first and second P-channel transistors fabricated in the layer of silicon formed on the insulating substrate wherein the first and second P-channel transistors have widths of less than approximately 1.3 μm and lengths of less than approximately 0.7 μm; a first N-channel transistor fabricated in the layer of silicon formed on the insulating substrate wherein the first N-channel transistor has a width of less than approximately 0.9 μm and a length of less than approximately 0.8 μm; and a second N-channel transistor fabricated in the layer of silicon formed on the insulating substrate wherein the second N-channel transistor has a width of less than approximately 1.0 μm and a length of less than approximately 0.8 μm.

In a sixth primary embodiment, the present invention is a NOR gate comprising: an insulating substrate; a layer of silicon formed on the insulating substrate wherein the silicon layer is less than approximately 1000 Å thick; first and second PMOS transistors fabricated in the layer of silicon formed on the insulating substrate wherein the first and second PMOS transistors have widths of less than approximately 1.5 μm and lengths of less than approximately 0.7 μm; and first and second NMOS transistors fabricated in the layer of silicon formed on the insulating substrate wherein the first and second NMOS transistors have widths of less than approximately 1.0 μm and lengths of less than approximately 0.8 μm.

In a seventh primary embodiment, the present invention is an electronic memory comprising: an insulating substrate; a layer of silicon formed on the insulating substrate wherein the silicon layer is less than approximately 1000 Å thick; a CMOS memory circuit comprising NMOS or PMOS transistors and resistors fabricated in the layer of silicon formed on the insulating substrate, wherein the NMOS and PMOS transistors are electrically isolated from the substrate and exhibit substantially no source body effect.

In an eighth primary embodiment, the present invention is a wireless communication system comprising: an insulating substrate; a layer of silicon formed on the insulating substrate wherein the silicon layer is less than approximately 1000 Å thick; a radio frequency transmitter/receiver circuit fabricated in the layer of silicon formed on the insulating substrate; a microprocessor having digital logic and memory fabricated in the layer of silicon formed on the insulating substrate; and an amplifier circuit fabricated in the layer of silicon formed on the insulating substrate. In a first alternate embodiment of the eighth primary embodiment, the insulating substrate comprises sapphire. In a second alternate embodiment of the eighth primary embodiment, the silicon layer has an areal density of electrically active states which is less than approximately $5 \times 10^{11}$ cm$^{-2}$.

In a ninth primary embodiment, the present invention is a MOS device comprising: an insulating substrate; a layer of silicon formed on the sapphire substrate wherein the silicon layer is less than approximately 1000 Å thick; a source region formed in the silicon layer, wherein a voltage $V_S$ is applied to the source region; a drain region formed in the silicon layer, wherein a voltage $V_D$ is applied to the drain region; a channel region formed in the silicon layer between the source region and the drain region; and a gate positioned adjacent the channel region, wherein a voltage $V_G$ is applied to the source region to control current flowing between the source and the drain, $I_{DS}$. In a first alternate embodiment of the ninth primary embodiment, the current flowing through the channel from the source to the drain, $I_{DS}$, is a linear function of the voltage difference between the source and the drain, $V_D - V_S = V_{DS}$. In a second alternate embodiment of the ninth primary embodiment, the channel is fully depleted.

In a tenth primary embodiment, the present invention is a method of fabricating a semiconductor substrate structure comprising the steps of: (a) forming a substantially monocrystalline silicon layer on an electrically insulating substrate; (b) implanting ions in the silicon layer to amorphorize an inner portion of the silicon layer adjacent to the substrate while maintaining an outer portion of the silicon layer substantially monocrystalline; (c) annealing the silicon layer in an inert ambient for causing solid phase epitaxial regrowth of the inner portion from the outer portion by ramping a temperature of the silicon layer upwardly from an initial value; and (d) displacing the inert ambient with an oxygen ambient and exposing the silicon layer to the oxygen ambient for surface oxidation thereof when the temperature of the silicon layer reaches a first predetermined value, and subsequently increasing the temperature of the silicon layer to a second predetermined value.

In an eleventh primary embodiment, the present invention is a microelectronic circuit comprising: an electrically insulating substrate; a semiconductive silicon layer that is formed on the substrate and has a thickness of less than approximately 110 nanometers and an areal density of electrically active states less than approximately $5 \times 10^{11}$ cm$^{-2}$; and a microelectronic device formed in the silicon layer. In a first alternate embodiment of the eleventh primary embodiment, the substrate comprises sapphire. In a second alternate embodiment of the eleventh primary embodiment, the device comprises a field effect transistor. This embodiment, the transistor may also have a gate length of less than approximately 0.8 micrometers.

In a twelfth primary embodiment, the present invention is a radio frequency (RF) electronic circuit capable of operating at a frequency of at least approximately 700 MHz comprising: an electrically insulating substrate; a semiconductive silicon layer that is formed on the substrate and has a thickness of less than approximately 110 nanometers and an areal density of electrically active states less than approximately $5 \times 10^{11}$ cm$^{-2}$; and a radio frequency field effect transistor element that is formed in the silicon layer and has a gate length of less than approximately 0.8 micrometers. In a first alternate embodiment of the twelfth primary embodiment, further comprises at least one passive electronic element that is connected in circuit with the transistor element. In this embodiment, the at least one passive electronic element further comprises at least one of an inductor, a capacitor and a resistor.

In a thirteenth primary embodiment, the present invention is an analog electronic circuit having a substantially monotonic gain characteristic and negligible kink effect comprising: an electrically insulating substrate; a semiconductive silicon layer that is formed on the substrate and has a thickness of less than approximately 110 nanometers and an areal density of electrically active states less than approximately $5\times10^{11}$ cm$^{-2}$; and an analog field effect transistor element that is formed in the silicon layer and has a gate length of less than approximately 0.8 micrometers. In a first alternate embodiment of the thirteenth primary embodiment, the transistor element is configured as a transmission gate. In a second alternate embodiment of the thirteenth primary embodiment, the transistor element comprises a gate insulating layer having a thickness that is selected to limit offset voltage variations due to active states of less than approximately three millivolts.

In a fourteenth primary embodiment, the present invention is a digital electronic circuit comprising: an electrically insulating substrate; a semiconductive silicon layer that is formed on the substrate and has a thickness of less than approximately 110 nanometers and an areal density of electrically active states less than approximately $5\times10^{11}$ cm$^{-2}$; and a digital field effect transistor element that is formed in the silicon layer and includes: an N-type source; an N-type drain; and a P-type channel having a gate length of less than approximately 0.8 micrometers, negligible source-body effect and a mobility higher than approximately 180 cm/volt-second; and a gate formed over the channel.

In a fifteenth primary embodiment, the present invention is an electronic memory circuit comprising: an electrically insulating substrate; a semiconductive silicon layer that is formed on the substrate and has a thickness of less than approximately 110 nanometers and an areal density of electrically active states less than approximately $5\times10^{11}$ cm$^{-2}$; and a field effect transistor memory element that is formed in the silicon layer and has a gate length of less than approximately 0.8 micrometers and a negligible source-body effect. In a first alternate embodiment of the fifteenth primary embodiment, the memory element is configured as a transmission gate.

In a sixteenth primary embodiment, the present invention is an integrated circuit comprising: an electrically insulating substrate; a semiconductive silicon layer that is formed on the substrate and has a thickness of less than approximately 110 nanometers and an areal density of electrically active states less than approximately $5\times10^{11}$ cm$^{-2}$; a radio frequency circuit element that is formed in the silicon layer and is capable of operation at a frequency of at least approximately 700 MHz; an analog circuit element formed in the silicon layer; and a digital circuit element that is formed in the silicon layer and is operatively connected to the radio frequency circuit element and the analog circuit element. In a first alternate embodiment of the sixteenth primary embodiment, the radio frequency circuit element, the analog logic circuit element and the digital logic circuit element each comprise a field effect transistor having a gate length of less than approximately 0.8 micrometers. A second alternate embodiment of the sixteenth primary embodiment further comprises a memory circuit element formed in the silicon layer. This memory circuit element may further comprise a field effect transistor having a gate length of less than approximately 0.8 micrometers. In a third alternate embodiment of the sixteenth primary embodiment, the analog element is substantially free of disturbances transmitted through the substrate from the digital element.

These and other characteristics of the present invention will become apparent through reference to the following detailed description of the preferred embodiments and accompanying drawings.

DETAILED DESCRIPTION OF THE PREFERRED EMBODIMENTS

SILICON-ON-SAPPHIRE SUBSTRATES AND DEVICES

The present invention will now be described with reference to the FIGURES. Like reference numbers refer to like or similar regions depicted in the FIGURES. It is to be understood that the several views and the present descriptions are by way of example and that the scope of the current invention is not limited by such views or descriptions. It is understood that both N- and P-type MOSFETs can be made simultaneously on the same sapphire substrate, as shown throughout FIGS. 2 and 3, thereby comprising complimentary MOS (or CMOS) circuits.

In one embodiment, the present invention is in the form of an ultrathin intrinsic silicon film on an insulating sapphire substrate wherein the silicon film contains extremely low concentrations of charge states and a process for making same. Ideally, the intrinsic silicon contains no dopant atoms or electrically active states, either within the silicon film or at the interface between the silicon and the sapphire. While complete elimination of all charge states and dopant atoms is not feasible, trace amounts are acceptable within tolerances determined by the application. For example, if a threshold voltage is to be set to an accuracy of δ Volts, the total charge in the silicon film should be less than about $\delta/C_{ox}$, where $C_{ox}$ is the gate oxide capacitance per unit area. Other tolerances can be determined similarly. Analog circuitry and memory sense amplifiers have the most exacting requirements for low active state density. As an example, an areal density of active states less than approximately $2\times10^{11}$ cm$^{-2}$ will produce a shift in threshold voltage by an amount less than 200 mV. Here, the areal charge density is multiplied by the unit electronic charge $1.6\times10^{-19}$ coul and divided by the specific oxide capacitance $190\times10^{-9}$ farad cm$^{-2}$ to estimate the threshold voltage shift. Equally important is the variation in this contribution as it affects the offset voltage of an amplifier. That variation is estimated by dividing the threshold shift by the square-root of the total number of active states under the gate of the amplifier input MOSFET. For the example chosen, an areal density of $2\times10^{11}$ cm$^{-2}$ will produce a variation (standard deviation) in offset voltage equal to approximately 1 mV when the gate area is 20 μm$^2$. This offset is small enough to provide low offset voltages for sense amplifiers. Other applications may tolerate total allowable fixed charge up to as much as $5\times10^{11}$ cm$^{-2}$.

Figure 1A:
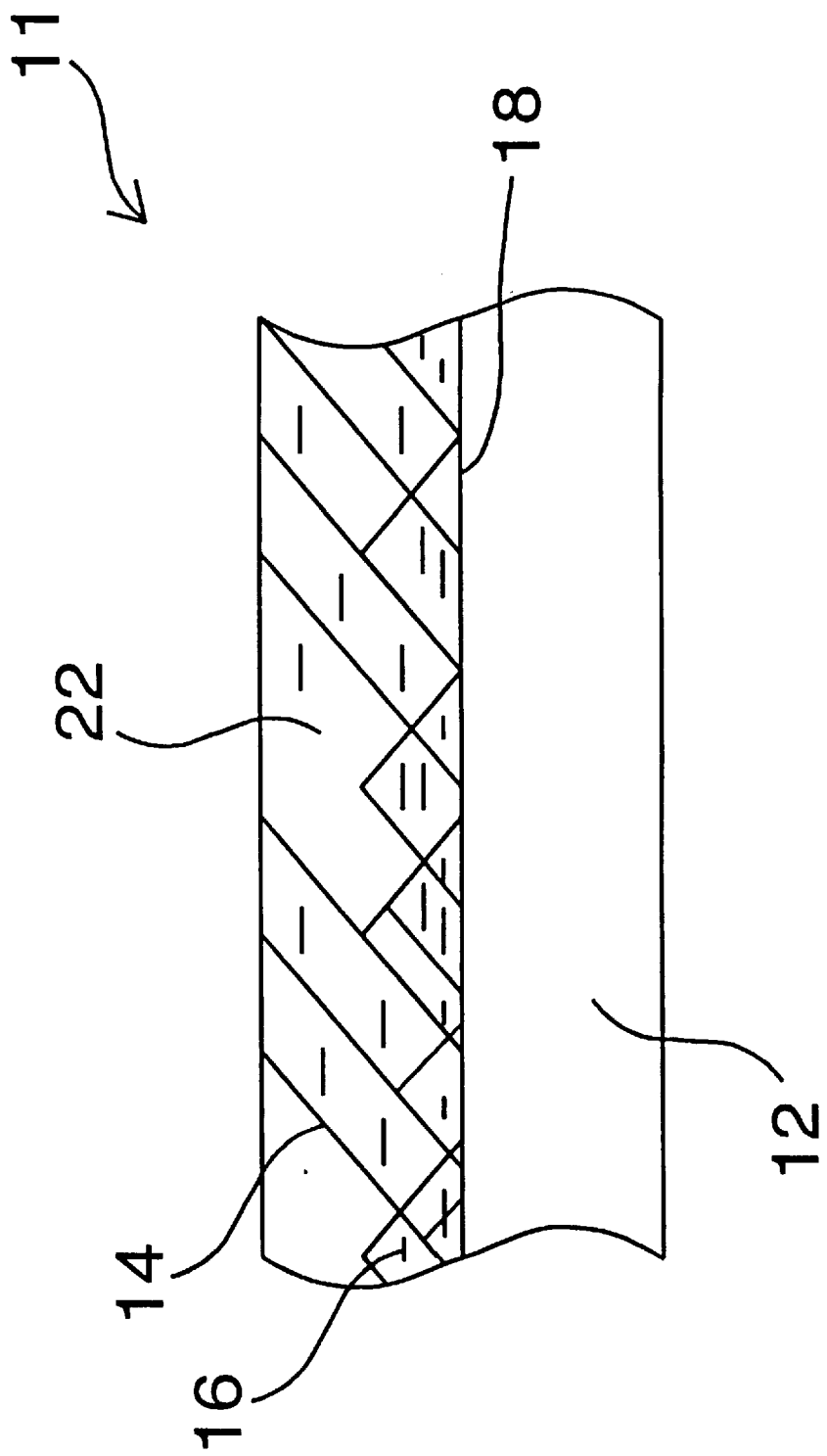
FIGS. 1A–1E illustrate steps in the process of converting an epitaxial silicon on sapphire wafer into a substantially pure silicon on sapphire wafer.

In a preferred embodiment, as shown in FIG. 1A, a 270 nm thick intrinsic silicon film 22 is deposited on a sapphire substrate 12 by epitaxial deposition to form a silicon-on-sapphire wafer 11. After the epitaxial deposition, the silicon film 22 contains a concentration of twin defects 14 and electrically active states 16. The thickness of the silicon film 22 is controlled during the epitaxial deposition process using standard processes.

Figure 1B:
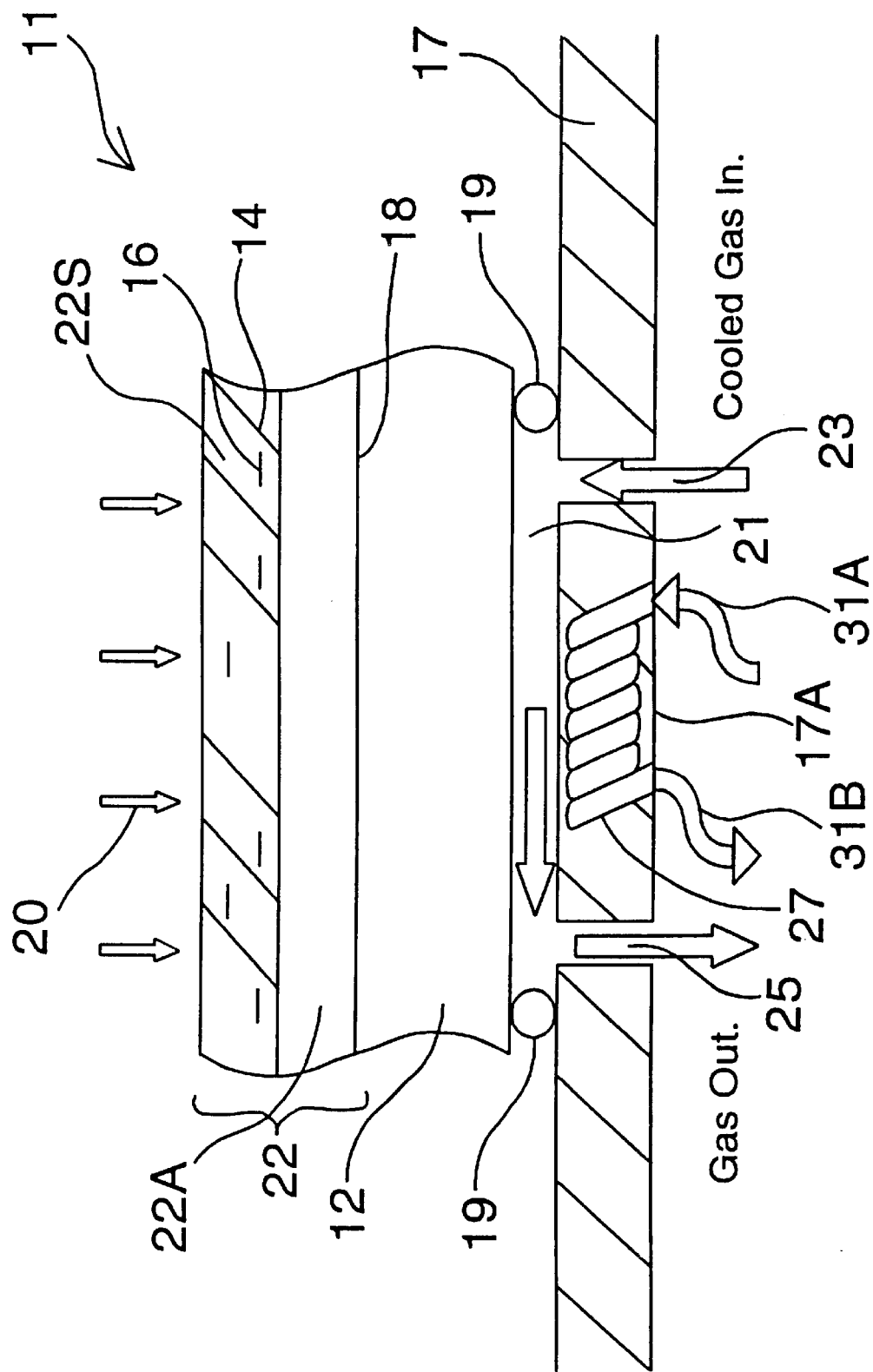

Referring to FIG. 1B, a 185 keV Beam of Si ions 20 is implanted into the silicon film 22 at a dose of approximately $6\times10^{14}$ cm$^{-2}$, thus creating a subsurface amorphous region 22A and leaving a surface monocrystalline silicon region 22S. The energy and dose of the beam of Si ions 20 are selected so that the amorphous region 22A extends from an interface 18 formed between the sapphire substrate 12 and the Si film 22 up into the Si film 22 to a thickness which is greater than the desired final thickness of Silicon film. In this embodiment, the amorphous region 22A is approximately 200 nm thick.

The amorphous region 22A in the 270 nm thick intrinsic silicon film 22 is created by implantation with the Si ion beam having an energy of 185 keV at a dose of $6\times10^{14}$ cm$^{-2}$ while maintaining the silicon film 22 at a uniform temperature at or below about 0° C. It has been found that this process will uniformly amorphize layer 22A without causing aluminum atoms to be released from the sapphire substrate 12 into the silicon film 22. While others have reported cooling the substrate by placing it on a cooled heat sink during implantation, none have paid particular attention to the temperature of the silicon film 22 during the implantation nor have they adequately addressed the issue of uniform cooling of the silicon film.

Previous cooling techniques include various techniques for placing the sapphire substrate 12 in contact with a cooled heat sink. Contact between the sapphire substrate and the heat sink was accomplished in a variety of ways including the use of a thermal paste layer interposed between the sapphire and the heat sink; depositing a layer of indium on the sapphire to provide more uniform contact with the heat sink; polishing the sapphire surface to improve contact with the heat sink; etc. However, these techniques created other problems and have been found to be inadequate for forming silicon films free of defects, dopants and charge states. A common shortcoming of these techniques is that it is very difficult to insure that the thermal contact between the sapphire and the heat sink is uniform over the entire sapphire surface. Non-uniform contact results in a nonuniform temperature within the overlying silicon film 22 which creates an amorphous layer 22A which is not uniformly amorphous due to partial self annealing. If the silicon film 22 is held at higher temperatures, the dose and/or energy must be increased to insure amorphization of layer 22A. If the temperature of the silicon film 22 is maintained at too high a temperature or not controlled at all, the ion implantation will cause the substrate temperature to rise, thereby increasing the required dose and/or energy required to amorphize layer 22A to a level where aluminum will outdiffuse from the sapphire 12 into the silicon 22. The present invention overcomes these shortcomings by cooling the sapphire with a chamber filled with cooled gas and/or a cooled support structure and by adjusting the gas flow, pressure and/or temperature of the gas and the temperature of the chamber's backside to insure that the silicon layer 22 is maintained at or below a predetermined temperature. For the dose and energy cited above, the substrate 12 is cooled to a temperature which maintains the surface of the silicon film 22 at a temperature preferably lower than about 0° C. One configuration for accomplishing these objectives is illustrated in FIG. 1B.

As shown in FIG. 1B, the SOS wafer 11 is positioned on a support structure 17 in a manner which creates a chamber 21 between the sapphire substrate 12 and the cooled support structure 17, for example, by placing an O-ring 19 between the support structure 17 and the SOS wafer 11. Cooled gas is circulated through the chamber 21 to cool the substrate 12. Since the gas has the same thermal contact with all areas of the substrate 12, uniform cooling is assured. Gas enters the chamber 21 through an inlet 23 and exits the chamber through an outlet 25. The gas provides thermal contact to the cooled support structure 17 which removes the heat. Additionally, support structure 17 has a cooled region 17a which is cooled by a coil 27 having a coolant inlet 31a and a coolant outlet 31b. The support structure is cooled by flowing coolant into the inlet 31a, through the coil 27 and out the outlet 31b. The coolant flow and temperature are adjusted to insure that the silicon layer 22 is maintained at or below a predetermined temperature.

Figure 1C:
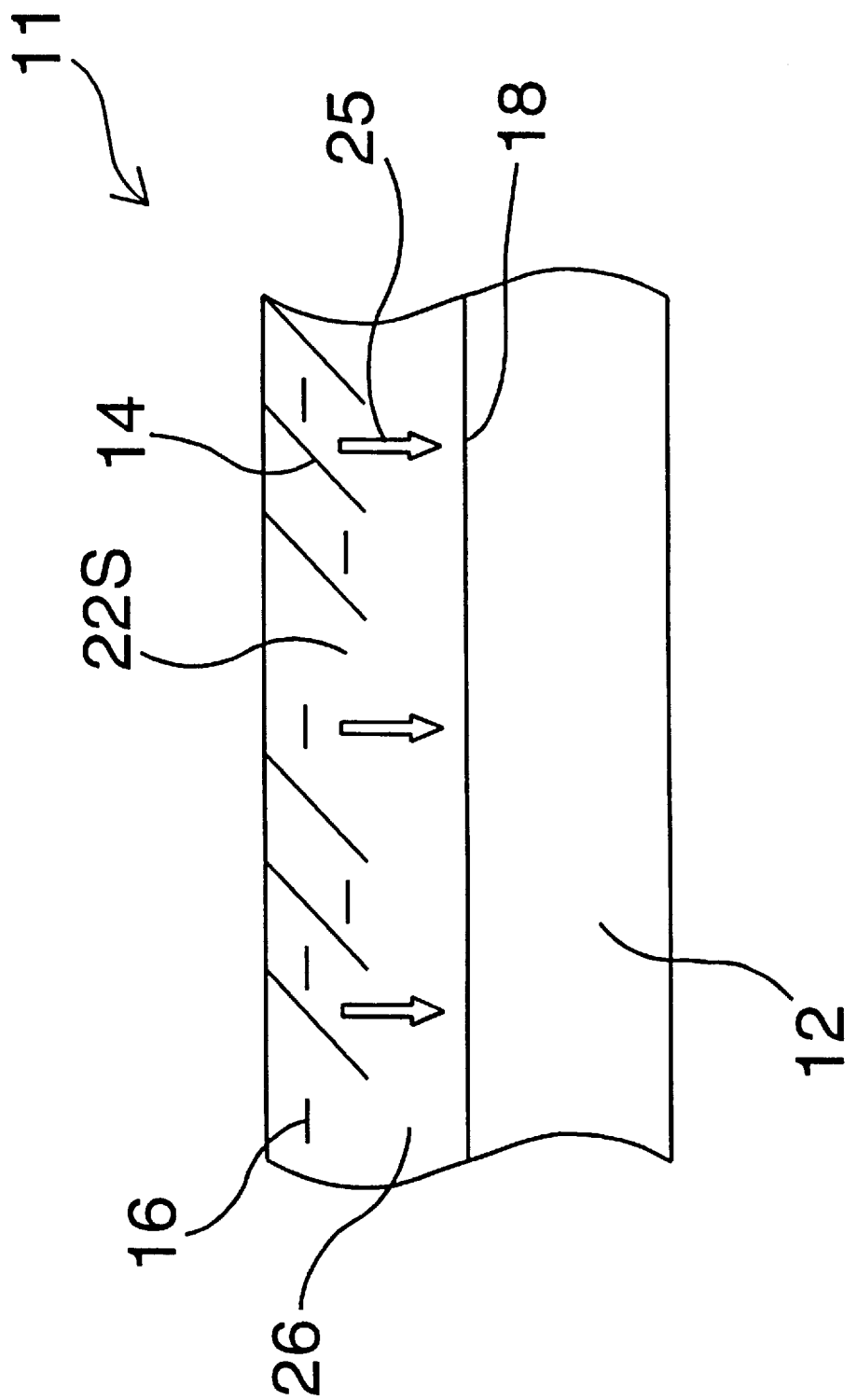

After creating the amorphous region 22A through silicon ion implantation, the SOS wafer 11 is subjected to a thermal anneal step at approximately 550° C. in an inert atmosphere (e.g. nitrogen) to induce solid phase epitaxial regrowth from the surface of the monocrystalline silicon region 22S downward through the amorphous region 22A to the interface 18. Thus the amorphous region 22A is regrown as a single crystal region, generally indicated at 26 in FIG. 1C. The direction of the regrowth from the monocrystalline silicon region 22S to the interface 18 is depicted by arrows 25 in FIG. 1C. Regrowth is accomplished in approximately 30 minutes. Upon completion of this solid phase epitaxial regrowth, the anneal temperature is ramped over a time of approximately 30 minutes to approximately 900° C. in an inert atmosphere (e.g. nitrogen) and held at 900° C. for a time of approximately 30 minutes to remove any remaining defects or states, thereby converting the amorphous region 22A (FIG. 1B) into a substantially pure single crystal region 26 (FIG. 1C) devoid of the twins 14 and the bandgap states 16 (FIG. 1A).

Figure 1D:
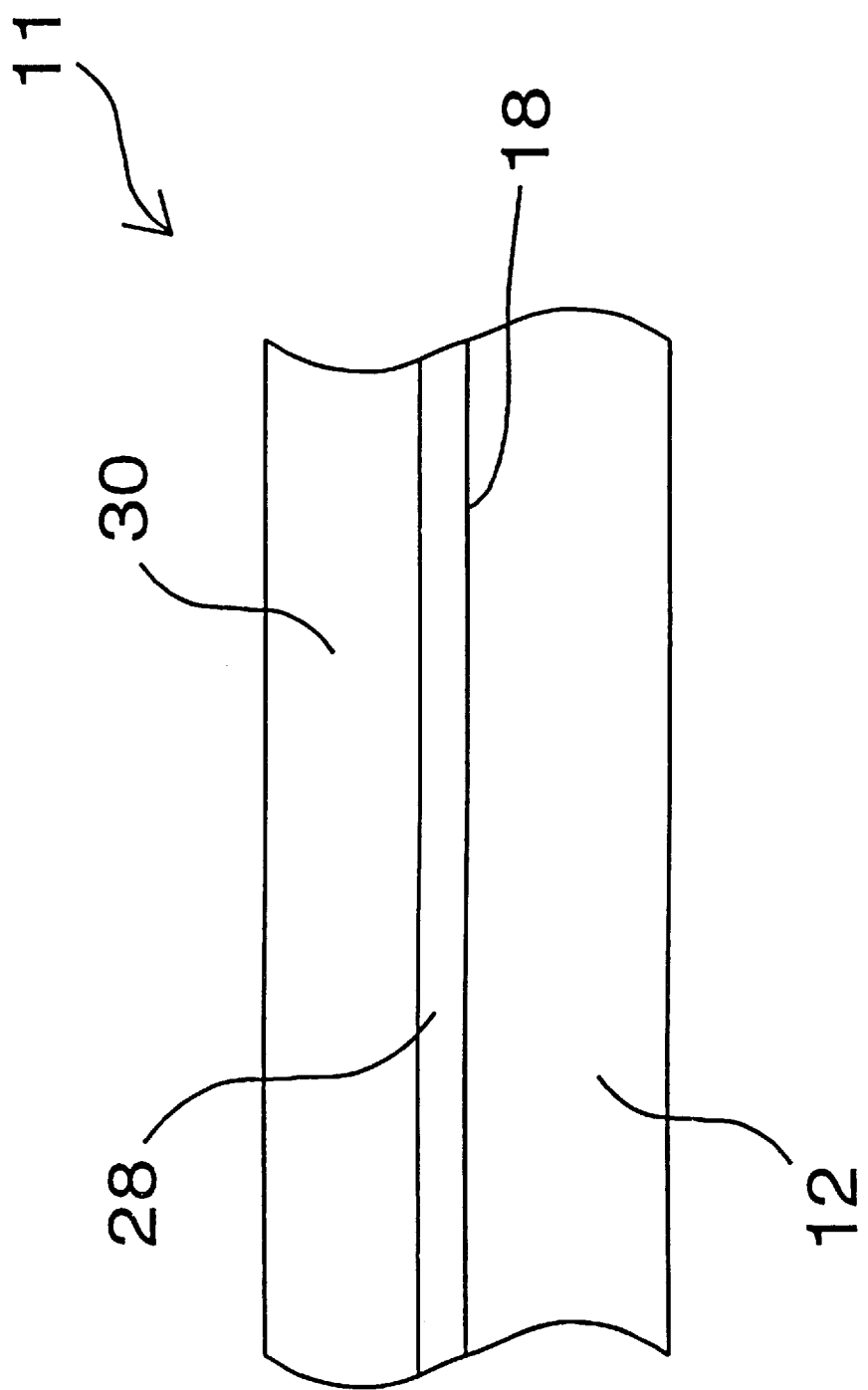

As shown in FIG. 1D, a silicon dioxide region 30 having a thickness of approximately 360 nm is then grown in the monocrystalline silicon region 22S by turning on dry $O_2$ just before turning off the nitrogen at the end of the anneal at 900° C. The temperature is ramped to 1000° C. at which time the temperature is stabilized and the oxidation is carried out in steam at 1000° C. Prior to ramp-down, dry $O_2$ is turned on and left on during ramp-down. The silicon dioxide region 30 is sufficiently thick to consume all the remaining twins 14 and band gap states 16 in the surface region 22S (FIG. 1C) of the silicon film 22. The silicon dioxide region 30 is sufficiently thick to leave an approximately 110 nm thick region of substantially pure silicon 28 (i.e., substantially free of defects and bandgap states) immediately adjacent the sapphire substrate 12.

Figure 1E:
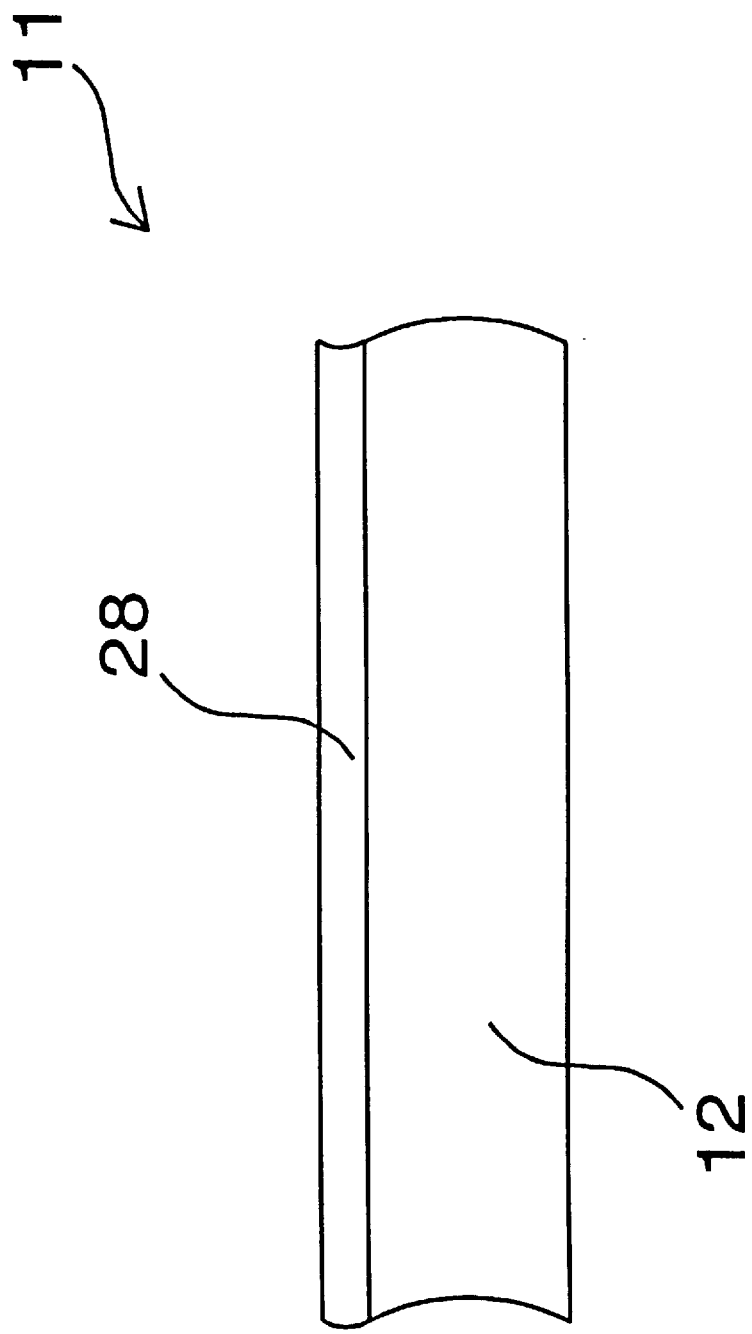

Referring now to FIG. 1E, the silicon dioxide film 30 is removed (etched) to result in an approximately 110 nm thick substantially pure silicon film 28 on the sapphire substrate 12. Thus, referring to FIG. 1C, the twins 14 and the states 16 in the upper portion of the silicon film are removed by forming the silicon dioxide film 30 and etching it away. Removal of the silicon dioxide film 30 may be delayed if it could serve a masking or other purpose. Additionally, the film 30 could be formed by an initial oxidation followed by stripping and a second oxidation, thereby resulting in an approximately 110 nm thick substantially pure silicon film 28 on the sapphire substrate 28 and a silicon dioxide film 30 of any desired thickness. The substantially pure silicon film 28 on the sapphire substrate 12 is now suited for MOSFET fabrication.

The above process of the present invention advantageously produces the substantially pure ultrathin silicon film 28 and reduces processing costs and complexity by using only one implant cycle and a two phase anneal cycle.

Design and fabrication of fully depleted MOSFET's are described with reference to FIGS. 2 and 3. In all of the below described embodiments, all of the MOSFET processing steps are preferably limited to temperatures less than approximately 950° C. in order to maintain the purity of the silicon in channel regions. Additionally, all anneals performed in non-oxidizing conditions are performed at temperatures less than approximately 950° C.

In one MOSFET embodiment, formation of isolated N-type and P-type regions in the silicon layer 28 is accomplished using a process often referred to as "local oxidation of silicon" (LOCOS). Unless otherwise stated, it will be understood throughout that there may be other standard semiconductor processing steps which will achieve the same or functionally similar results as described below. Substitution of these alternatives are considered to be within the scope of the present invention as long as they do not result in a processing step performed in non-oxidizing conditions which subjects the silicon layer 28 or any subsequent regions fabricated in the silicon layer 28 to temperatures in excess of approximately 950° C. For example, instead of using the LOCOS process to form the isolated N-type and P-type regions, alternative isolation techniques may also be employed. One such alternative process etches the silicon layer 28 (FIG. 1E) into individual islands (sometimes called "mesas"), to form the isolated N-type and P-type regions. Additional alternative processing procedures are disclosed in a book entitled "VLSI Technology", Second Edition, edited by S. M. Sze, published by McGraw-Hill, New York, 1988, hereby incorporated herein by reference.

The following process step descriptions are intended to supplement standard bulk CMOS processing steps. It is understood by those skilled in the art that each silicon fabrication facility has its own preferred process recipes that have been well tried and tested in its own bulk CMOS process. Therefore, it is not necessary to explain each process recipe utilized in processing devices in ultrathin silicon on sapphire of the present invention in order to enable one skilled in the art of bulk silicon CMOS processing to practice the present invention. For example, in well understood steps such as gate oxide growth, it is not necessary to explain each cleaning or "clean-up oxide" step, but rather it is helpful to explain the final oxide target thickness. This type of information is provided for a 0.8 μm ultrathin silicon on sapphire process typical of the present invention.

Figure 2A:
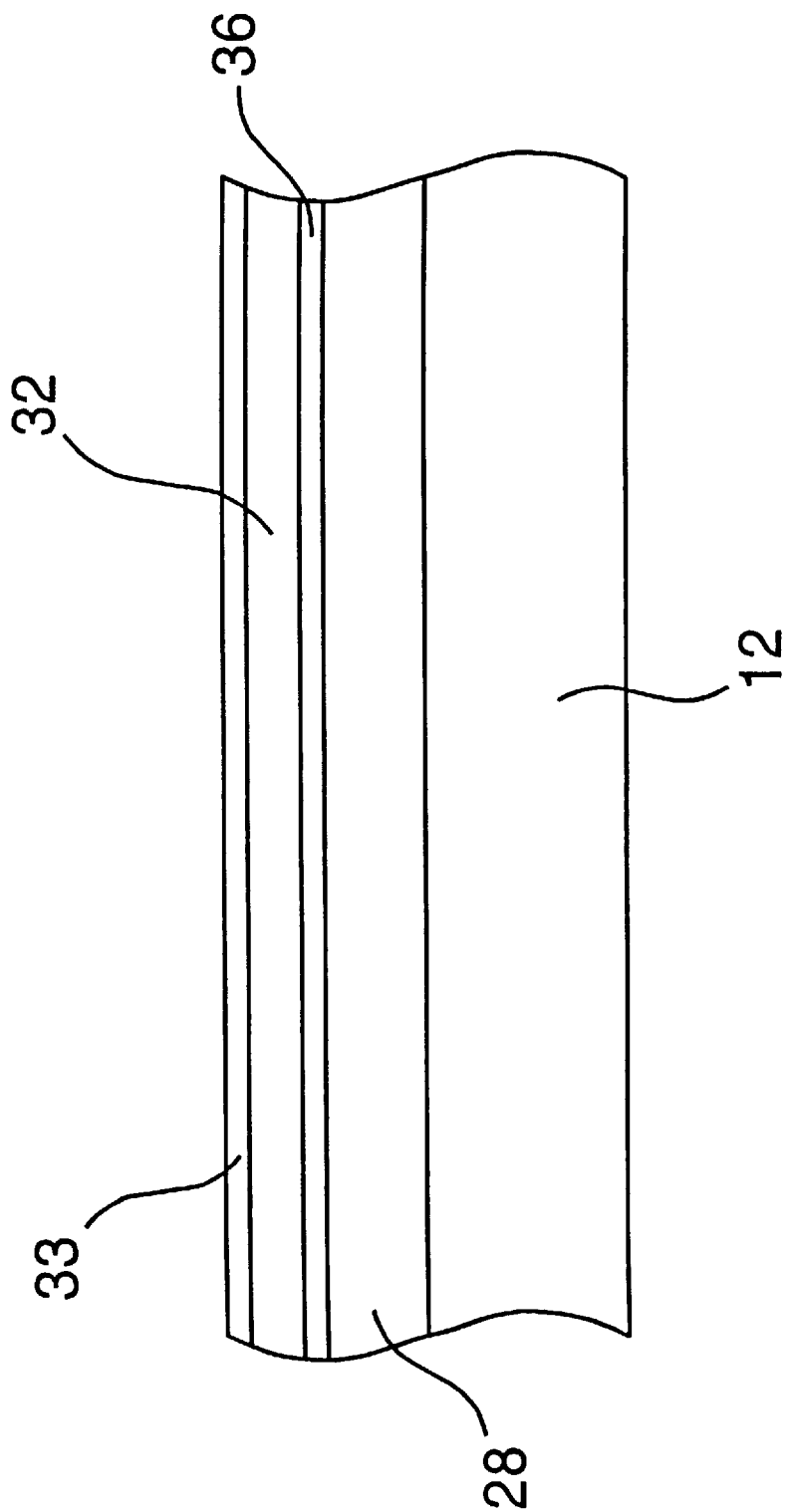
FIGS. 2A–2E illustrate a MOSFET and fabrication process steps used to manufacture the MOSFET in substantially pure silicon on sapphire material. Cross sectional views are shown for both N- and P-type transistors. These figures show the device and process through the first level of metallization.
Figure 2B:
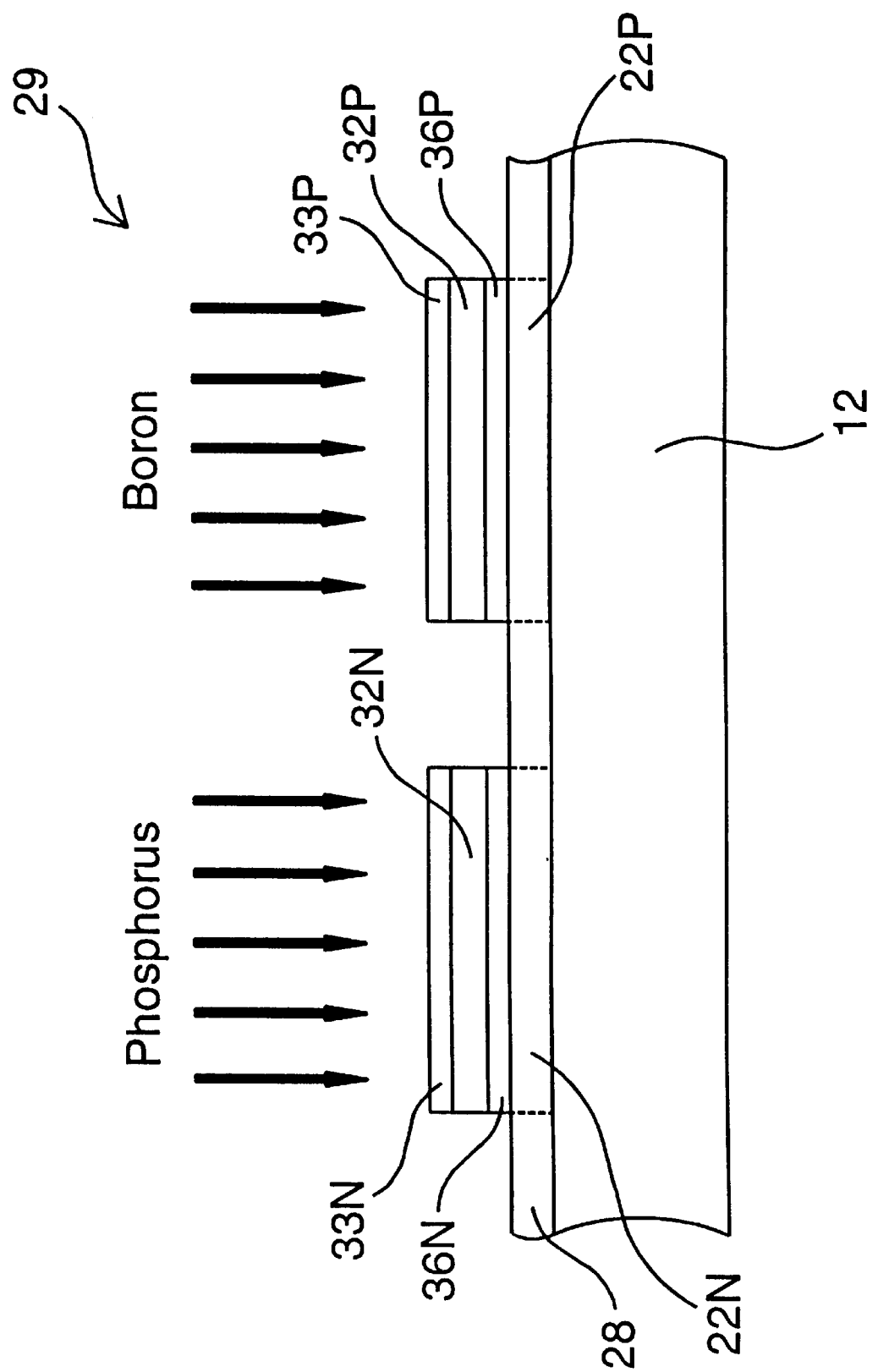
Figure 2C:
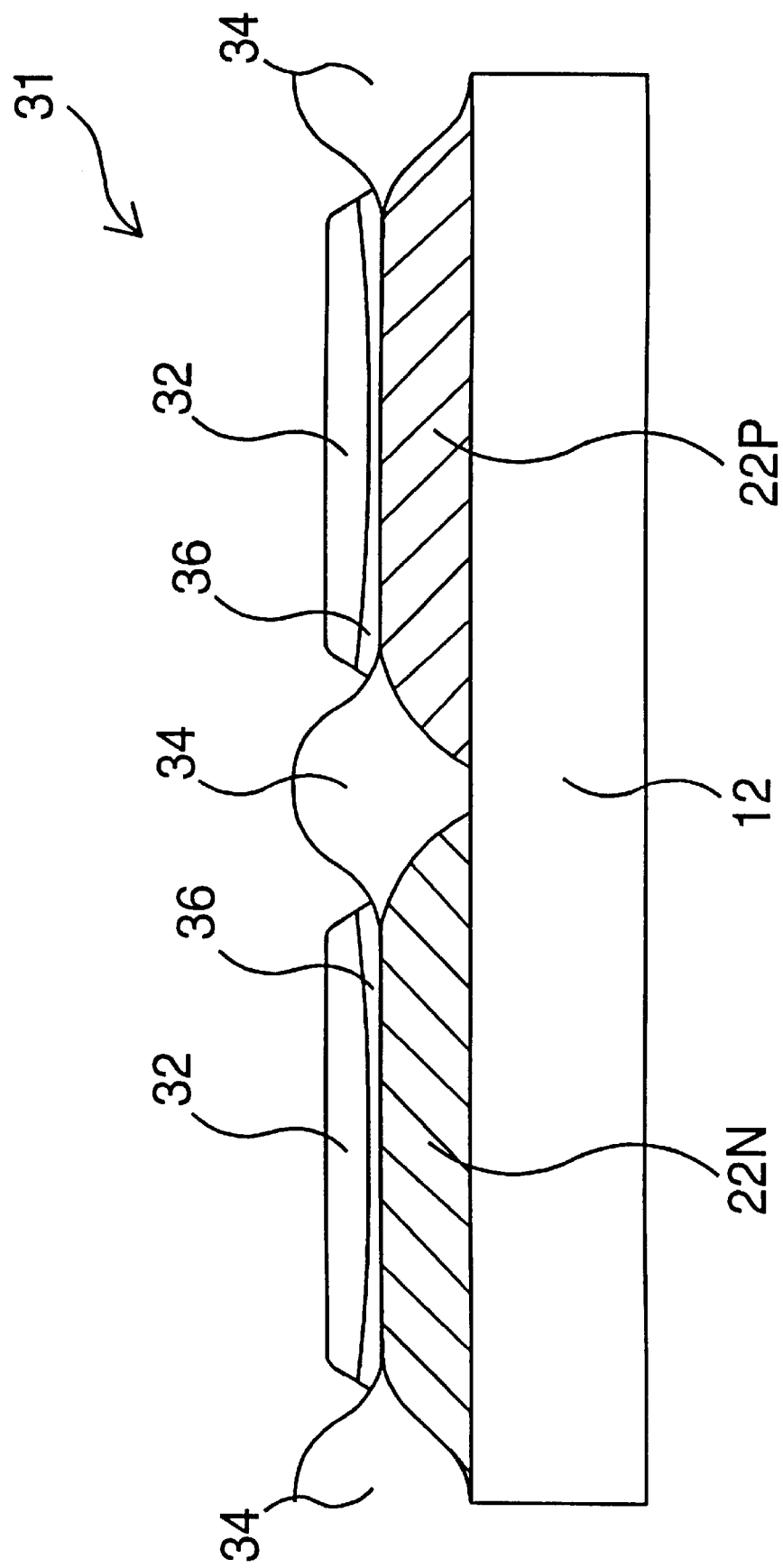

As shown in FIG. 2A, formation of isolated N-type and P-type regions with the LOCOS process begins with the deposition of a silicon dioxide layer 36, a silicon nitride layer 32 and a photo-resist layer 33 on top of the silicon layer 28 of the silicon-on-sapphire wafer 11 shown in FIG. 1E. Using standard masking and etching processes, individual islands (36p,32p,33p) and (36n,32n,33n) of the silicon dioxide layer 36, silicon nitride layer 32 and photo-resist layer 33 are formed on the surface of the Silicon layer 28 as shown in FIG. 2B. Standard masking and ion implantation techniques are used to form a silicon N-type region 22N and a silicon P-type region 22P. For example, as shown in FIG. 2B, the silicon N-type region 22N is formed by ion implantation of the Silicon layer 28 underlying the island (36n, 32n,33n) with phosphorus and the silicon P-type region 22P is formed by ion implantation of the Silicon layer 28 underlying the island (36p,32p,33p) with boron. As shown in FIG. 2C, the silicon N-type region 22N is isolated from the silicon P-type region 22P by the growth of a silicon dioxide region 34. The silicon dioxide regions 34 are grown by introducing the wafer 29 shown in FIG. 2B into a high temperature (less than approximately 950° C.) oxidizing ambient environment. The silicon dioxide isolation regions 34 extend down to the sapphire substrate 12. Although the wafer 29 is in an oxidizing ambient, the silicon nitride layer 32 shields the silicon regions 22N and 22P, thereby keeping those regions from oxidizing. After growing the isolation regions 34, the silicon nitride layer 32 and the stress relief oxide layer 36 are stripped away.

FIG. 2C shows regions 22N and 22P fully isolated from each other by the silicon dioxide isolation regions 34 for complementary MOS transistors. Alternative isolation techniques may also be employed. For example, the silicon layer 28 (FIG. 1E) may be etched into individual islands (sometimes called "mesas"). Thus, upon removal of the silicon dioxide regions 34 by etching, the silicon islands 22N and 22P become individual isolated islands or mesas.

Figure 2D:
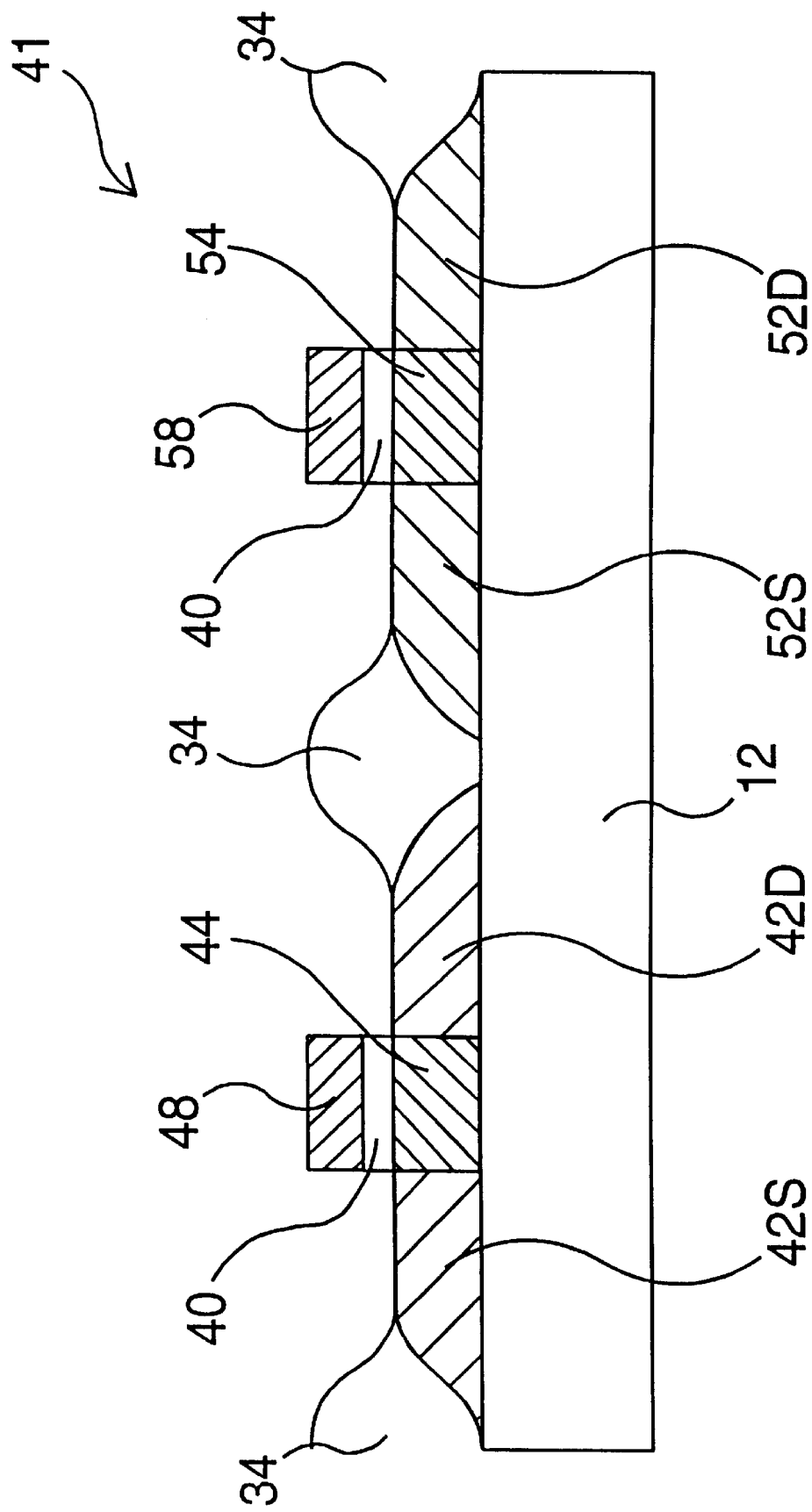

A subsequent stage 41 of the MOSFET process is shown in FIG. 2D. In stage 41, the N-type and P-type regions 22N and 22P (FIG. 2C) are further processed to form self aligned sources 42S and 52S, conduction regions 44 and 54, and self aligned drains 42D and 52D, respectively. Additionally, gate insulators 40 and gate conductive layers 48 and 58 form a control gate structure. The control gate structure is formed by thermal oxidation of the gate insulators 40 followed by deposition and patterning of a chosen gate conductive layer 48 for the P-channel and 58 for the N-channel. For electrostatic reasons, it is preferred that the gate length, i.e., the distance separating the source 52S from the drain 52D, be maintained at more than about 5–10 times the thickness of the conduction region. For example, a 500 nm gate length should be made in a silicon film thinner than about 100 nm, and preferably closer to 50 nm.

Referring to FIG. 2D, self aligned sources and drains 42S, 42D, 52S and 52D are formed by ion implantation or diffusion. Doping the source and drain regions of thin silicon films is subject to certain limitations. For example, ion implantation doping can amorphize the entire thickness of the source/drain region. An amorphized film will not properly recrystallize from the sapphire substrate and high resistivity may result. Therefore, it is preferable that the source and drain regions be formed by diffusion doping since the sapphire substrate forms a diffusion barrier to the dopant atoms. Diffusion doping of the source/drain regions represents an improvement over conventional MOSFET designs using implantation doping in that very thin (i.e., shallow) source/drain regions 42S, 42D, 52S and 52D having low resistivities can be fabricated by means of a single diffusion step.

Since the sapphire substrate 12 is an effective diffusion barrier and since the depth of the source and drain regions 42S, 42D, 52S and 52D are determined by the thickness of the silicon film, forming shallow source and drain regions is controlled by the structure, not by diffusion time and temperature, as in conventional transistor processing. Therefore diffusion doping can be used for scaled down dimensions. Diffusion doping has several advantages over ion implantation including: the host silicon is not damaged or transformed into amorphous regions; the process is inherently scalable to the thinnest silicon films; and higher doping concentrations can be achieved.

Threshold voltage of the control gate structure is initially determined by correctly choosing the gate conductor material according to its so-called metal work function. If necessary, further adjustments to the threshold voltage are made by introducing appropriate dopant atoms into the conduction channel, for example by ion implantation into the conduction regions 44 and 54. In accordance with the present invention, no dopant atoms other than those introduced for threshold adjustment (or to ensure surface channel conduction, see below) are present in the conduction channel regions 44 and 54. The absence or low concentrations of dopants in the MOSFET embodiments of the present invention represent an improvement over traditional MOSFET designs wherein substantial concentrations of dopant atoms are typically present for various reasons (e.g., as integral parts of traditional transistors; to provide isolation; as a byproduct of counterdoping; etc.). By fabricating MOSFETs in substantially pure silicon on sapphire in accordance with the present invention, only minimal concentrations of dopant atoms (if any) are present, thereby eliminating parasitic charge and its associated degradations discussed above.

Gate conductor layers 48 and 58 are often multilayer structures. In this case, the threshold voltage is determined by the characteristics of the primary gate conductor layer, i.e., the layer which is immediately adjacent the gate insulator 40. Conductive layers above the primary gate conductor layer are included for various reasons, especially to reduce series resistance (See FIG. 3 and discussion below for an example). However, such secondary gate conductive layers do not affect the threshold voltage of transistors. Each of the gate materials cited below has various applications when the material is in contact with the gate insulator 40.

$P^+$ and $N^+$ polysilicon gate materials, used in various combinations in N-type MOSFETS and P-type MOSFETS, are useful in designing and fabricating digital and analog circuits, voltage reference circuits and memory type circuits. $P^+$ polygermanium is a good choice for high performance digital logic where symmetric threshold voltages for N- and P-type MOSFETs are desired. Any conductive material which has a metal work function at the center of silicon's band gap (i.e., equal to silicon's electron affinity plus half the band gap or more specifically a metal work function of 4.5–4.7 eV) results in symmetric threshold voltages for N- and P-channel MOSFETs. Examples of such materials are tungsten, chrome, indium tin oxide, and titanium nitride, among others. The material may be different or the same for each transistor type (regions 48 and 58) depending on the desired threshold voltage. Examples of choice of material and resultant threshold voltages are approximately as follows:

$N^+$ polysilicon gate conductor results in $V_{tn}=0$ V and $V_{tp}=-1$ V;

$P^+$ polysilicon gate conductor results in $V_{tn}=+1$ V and $V_{tp}=0$ V;

$P^+$ polygermanium, tungsten, indium tin oxide or titanium nitride gate conductors result in $V_{tn}=+\frac{1}{2}$ V and $V_{tp}=-\frac{1}{2}$ V;

where $V_{tn}$ and $V_{tp}$ are the threshold voltages of N- and P-channel MOSFETs, respectively.

As can be seen from the above discussion and referring to FIG. 2D, if a threshold voltages of +1 Volt for the N-channel and −1 Volt for the P-channel were desired, region 48 could be P+ polysilicon and region 58 could be N+ polysilicon (i.e., different materials). If threshold voltages of +½ Volt for the N-channel and -½ Volt for the P-channel were desired, regions 48 and 58 could be P+ polygermanium, tungsten, indium tin oxide or titanium nitride (i.e., the same material). Numerous other material choices, and therefore other choices of threshold voltages, are also available.

The gate dielectric material 40 is grown and the gate conducting materials 48 and 58 are deposited using process conditions which avoid introduction of states or fixed charges into the channel regions 44 and 54. Specifically, processing temperatures and ambients are chosen to avoid generation of interface states or fixed charge in the dielectric. Therefore, as previously discussed, processing temperatures should be kept below approximately 950° C. Also, for P+ doped conductors as gate material 48 or 58, processing temperatures, times and ambients should be chosen to avoid diffusion of the dopant atoms from the gate conductors 48 and 58 through the gate dielectric insulator 40 into the silicon films 44 and 54. Diffusion barriers such as silicon nitride as part of the gate dielectric insulator 40 can be used to prevent such dopant migration.

Use of metal work function exclusively (i.e., no dopant atoms introduced into the conduction region) to set threshold voltage has the desirable effect of accurate and predictable threshold voltage control which is independent of process variations or certain device parameters.

Surface channel transistor behavior occurs when conduction occurs in the silicon channels 44 and 54 at the interface between the gate insulator 40 and the silicon films 44 and 54. In some designs, it may be desirable to intentionally induce surface channel conduction. This may be accomplished by implanting very small amounts of dopant atoms into the substantially pure silicon channel regions 44 and 54. This will result in surface channel conduction without significantly affecting the threshold voltage. Such a device is defined herein as an "intrinsic surface channel MOSFET." Additional dopant atoms, such as boron, phosphorous or arsenic, may be introduced into the channel regions 44 and 54 to further adjust the threshold voltage of the intrinsic surface channel MOSFET. Addition of dopant atoms in excess of that necessary to adjust the threshold voltage may introduce some of the adverse effects cited earlier, such as impurity scattering and possible threshold voltage variation. However, a device constructed in accordance with this invention contains only the dopant atoms necessary to induce surface channel conduction and to set threshold voltage. Therefore, none of the other parasitic charge found in traditional MOSFETs are present. The present invention thereby minimizes the dopant charge in regions 44 and 54 and associated adverse effects associated with higher concentrations of dopant charge.

A maximum amount of dopant charge can be introduced into channel regions 44 and 54. If the maximum amount is exceeded, the depletion region will not reach the sapphire 12, thus eliminating fully depleted operation. The maximum dopant charge is dependent on the silicon film thickness in the channel regions 44 and 54. For the preferred embodiment, the regions 44 and 54 are approximately 100 nm thick and the maximum dopant density is approximately $1 \times 10^{12}$ cm$^{-2}$.

Figure 2E:
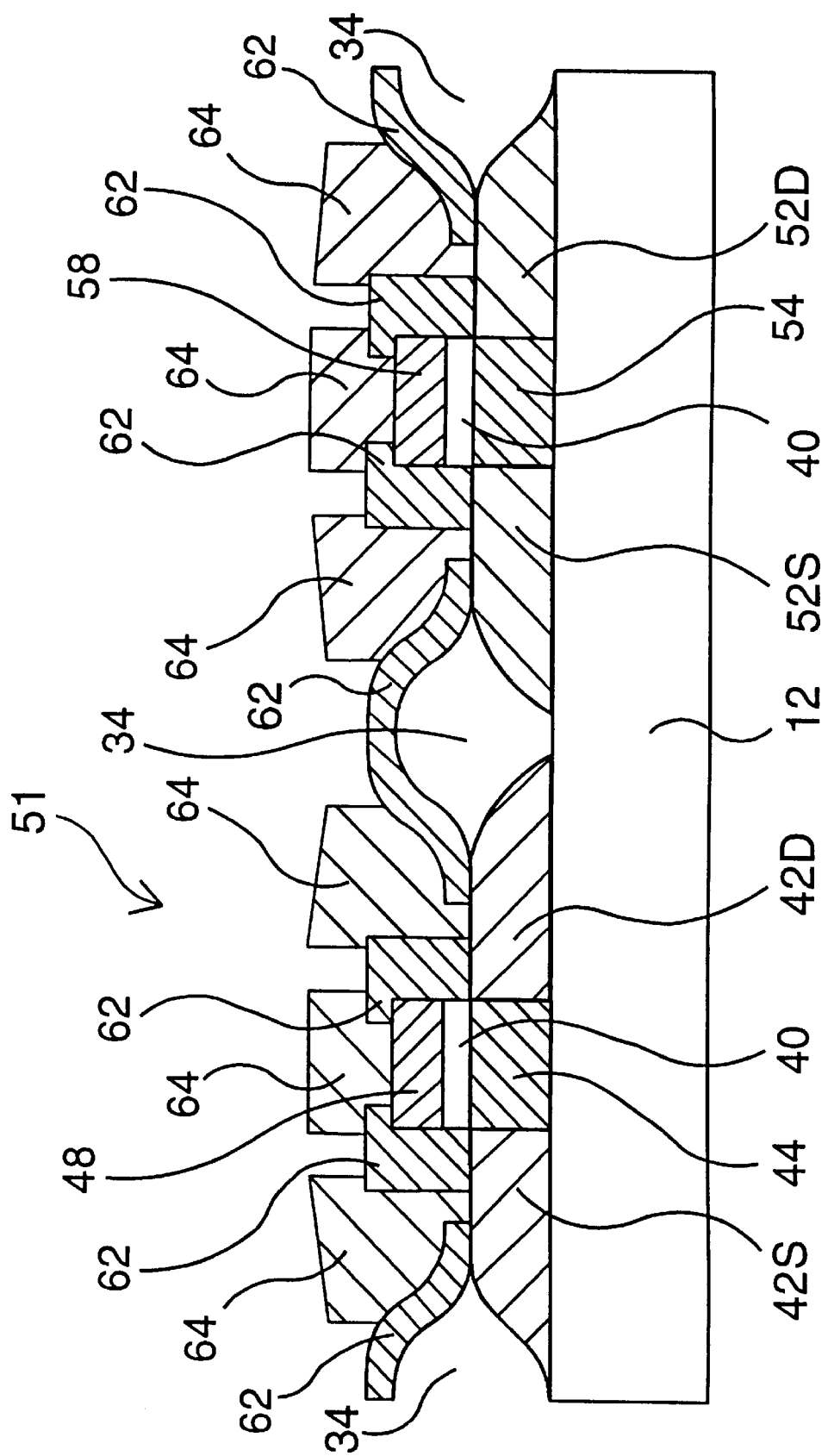

A next stage 51 of the MOSFET fabrication process is shown in FIG. 2E. In this stage, insulating layer 62 and metal layer 64 are deposited and patterned for interconnecting devices as desired. Specifically, an interlevel insulating layer 62 is deposited and patterned, followed by deposition and patterning of a metallic conductor interconnecting layer 64.

Additional layers of insulators and metallic conductors may be added as needed (not shown). Another advantage of the present invention is apparent at this point, there are no opportunities for metal to diffuse into the source and drain regions as in many conventional MOSFET fabrication processes. In the present invention, after deposition and patterning of the metallic interconnect layer 64, an annealing step is performed. This annealing step serves two primary functions: to remove states and charge which may have been introduced during the previous processing steps and to sinter different metallic layers to form low resistance contacts. In conventional processing, source and drain junctions are deep enough to ensure that no metal will diffuse through them and into an underlying silicon substrate, thereby destroying transistors. In the current invention, such a failure mechanism does not exist since only sapphire 12 is found beneath the source and drain regions 42S, 42D, 52S and 52D.

Figure 3A:
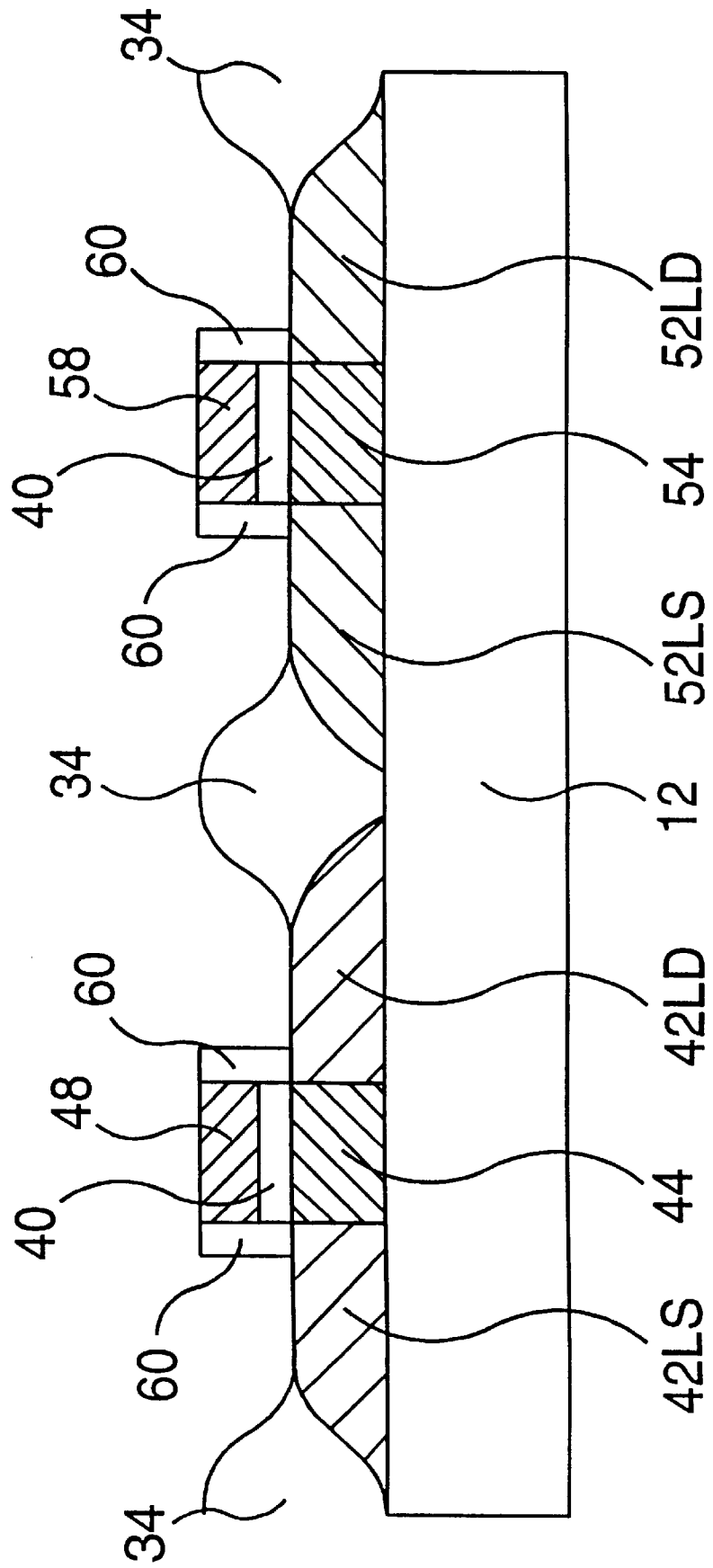
FIGS. 3A–3C illustrate an embodiment of the invention comprising adding to the device and process depicted in FIGS. 2, gate sidewall spacers, lightly doped drains (LDD), and self aligned silicide (salicide). Cross sectional views are shown for both N- and P-type transistors. These figures show the device and process through the first level of metallization.
Figure 3B:
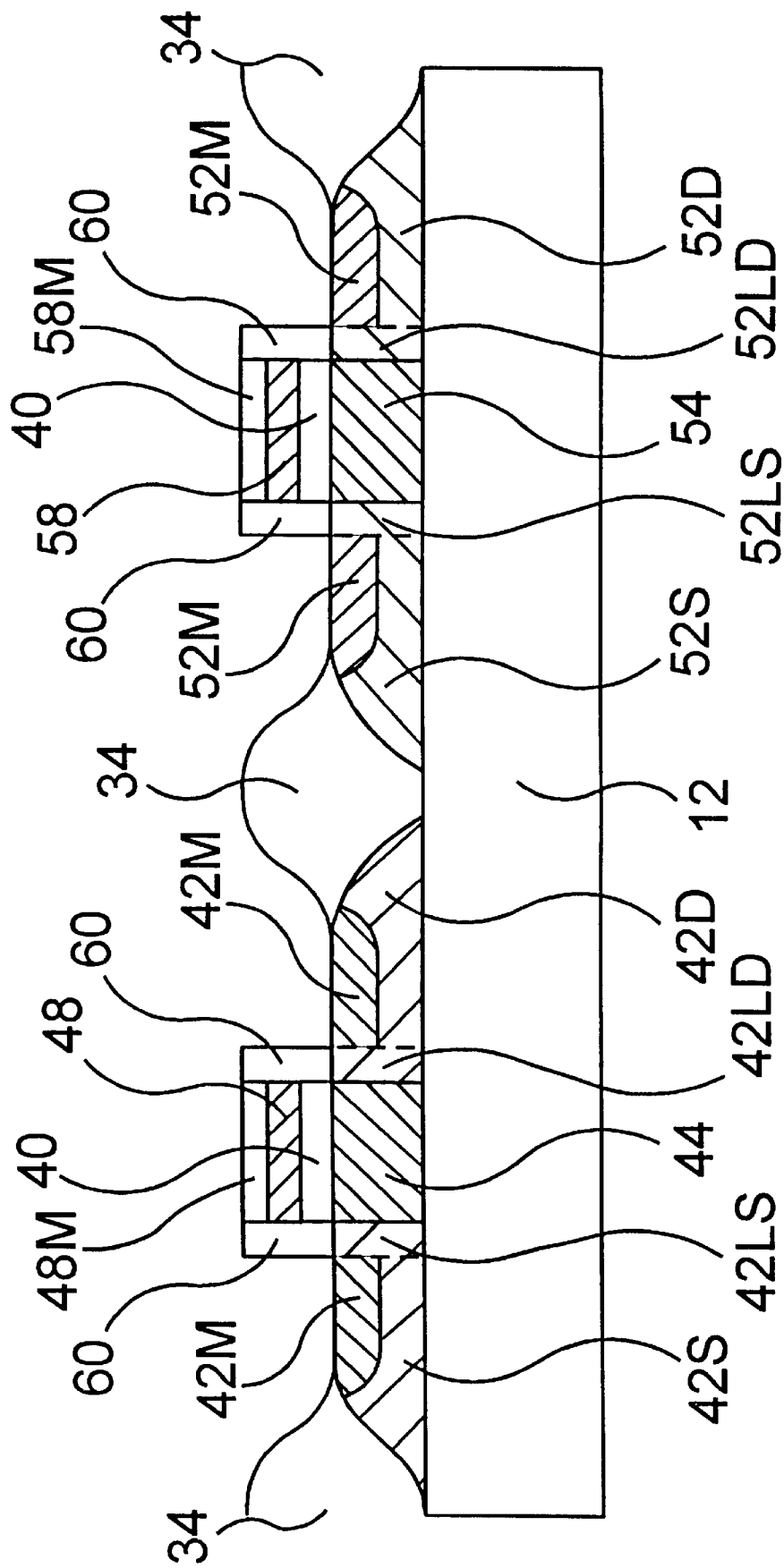
Figure 3C:
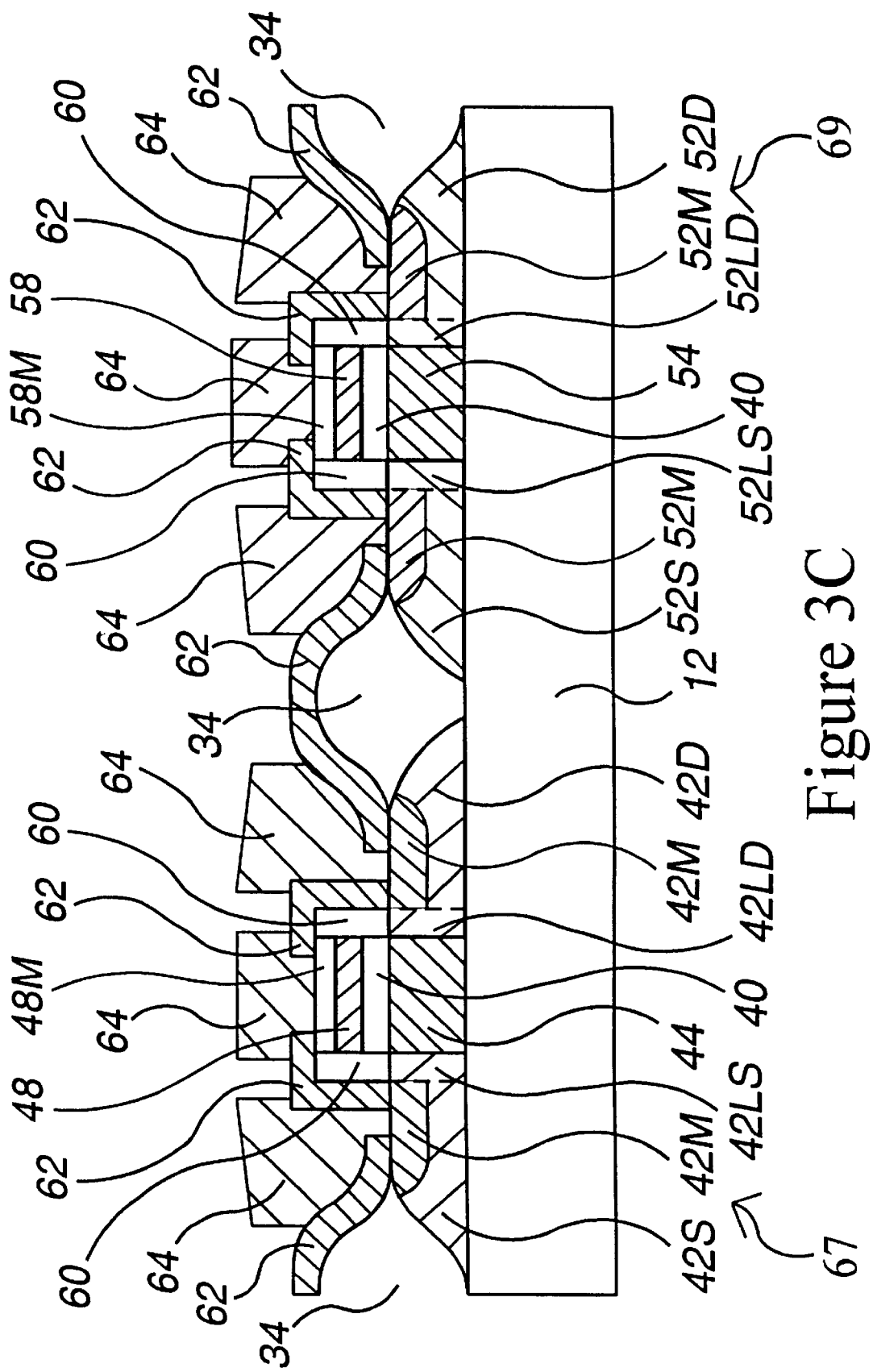

The current invention may also be embodied in a lightly doped drain (LDD) structure or self aligned silicide (salicide). This embodiment is illustrated in FIGS. 3A, 3B and 3C. This embodiment may be implemented after the gate conductors 48 and 58 are patterned as discussed above and shown in FIG. 2D. Referring to FIG. 3A, after patterning the gate conductors 48 and 58, self aligned lightly doped drain (LDD) regions 42LD and 52LD are formed by ion implantation or diffusion. The LDD reduces electric fields, thereby improving reliability and certain device characteristics such as drain breakdown voltage. However, the LDD also increases series resistance at both the drain and source, thereby decreasing output current. A trade-off is therefore inherent in the choice of an LDD and different requirements will lead to different LDD designs. The advantages cited above for diffusion doping of the self aligned sources and drains 42S, 42D, 52S and 52D also apply to doping the LDD structures.

In the self aligned silicide (salicide) embodiment of the present invention, a sidewall spacer 60 is deposited and etched adjacent to the gate structure comprising the gate insulator 40 and conductor 48, 58. Referring to FIG. 3B, final self aligned sources and drains 42S, 42D, 52S and 52D are formed by ion implantation or diffusion. For appropriate gate conductors 48 and 58 (such as polysilicon or polygermanium) the structure is coated with a metallic material and reacted to form metallic compounds 48M and 58M in the upper portion of gate conductors 48 and 58 as well 42M and 52M in source and drain regions 42S, 42D, 52S and 52D. Stripping unreacted metal from sidewall spacers 60 completes the salicide (or germanide) processing. Referring to FIG. 3B, silicide regions 42M, 52M, 48M, and 58M are separated from each other by the sidewall spacers 60. The thickness of metallic regions 42M, 48M, 52M and 58M is controlled by the amount of metallic material which is deposited. Obviously, the salicide option exists independently of LDD doping level. Referring to FIG. 3C, a complementary MOS structure is shown with both LDD and salicide options included after metallization as described above for FIG. 2. Many other materials and processing options can be used in addition to or in replacement of those described above. It is to be understood that such choices may be practiced within the scope of this invention.

Additional information (including circuit designs, design rules, processes, etc.) which may be adapted for making similar or analogous devices or circuits in the ultrathin silicon on sapphire material of the present invention is disclosed in a book authored by Arthur B. Glaser and Gerald E. Subak-Sharpe entitled "Integrated Circuit Engineering—Design, Fabrication, and Applications", Addison-Wesley

RADIO FREQUENCY ELEMENTS

Figure 4A:
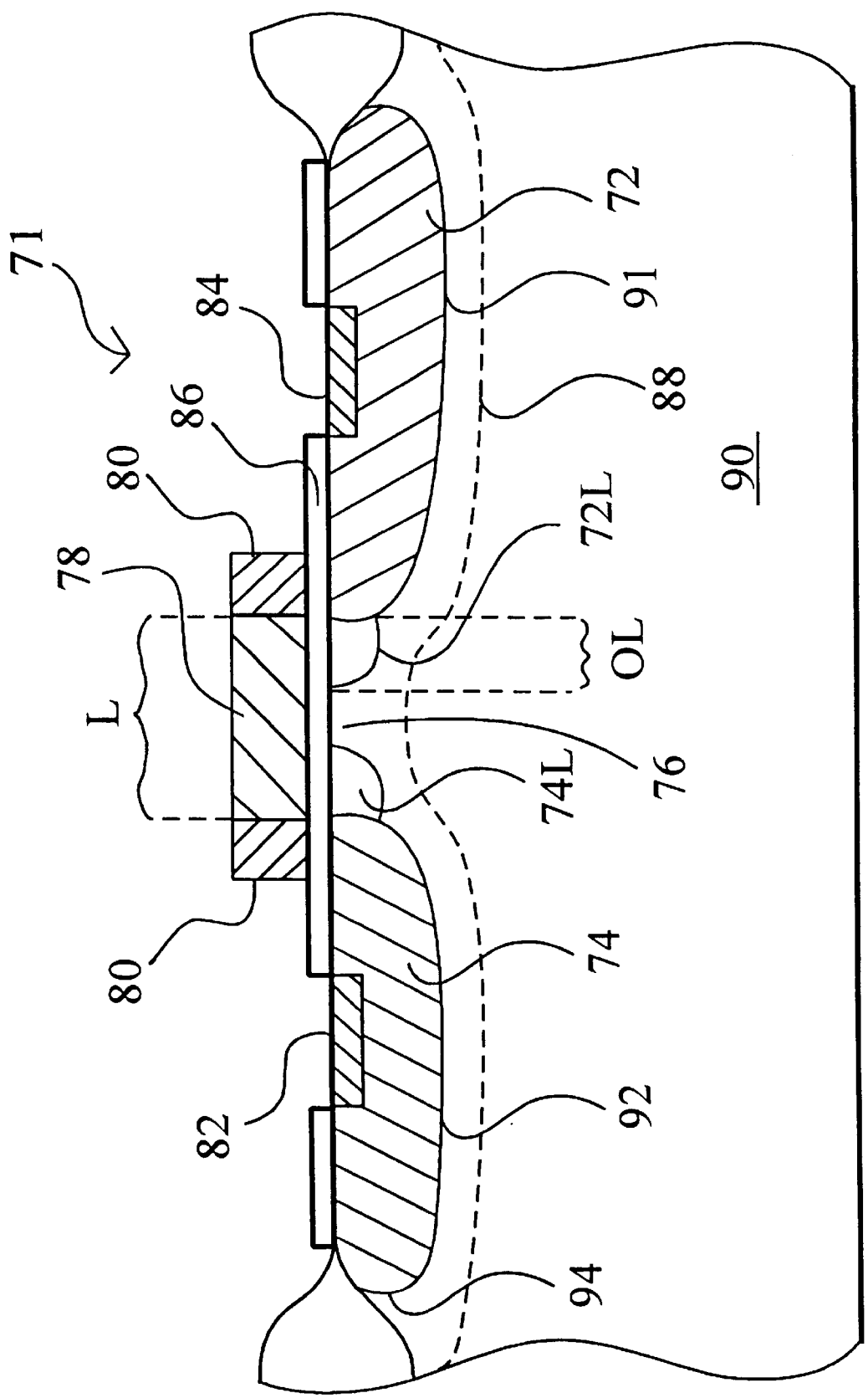
FIG. 4A shows a cross sectional view of a typical MOS device fabricated in bulk Silicon.
Figure 4B:
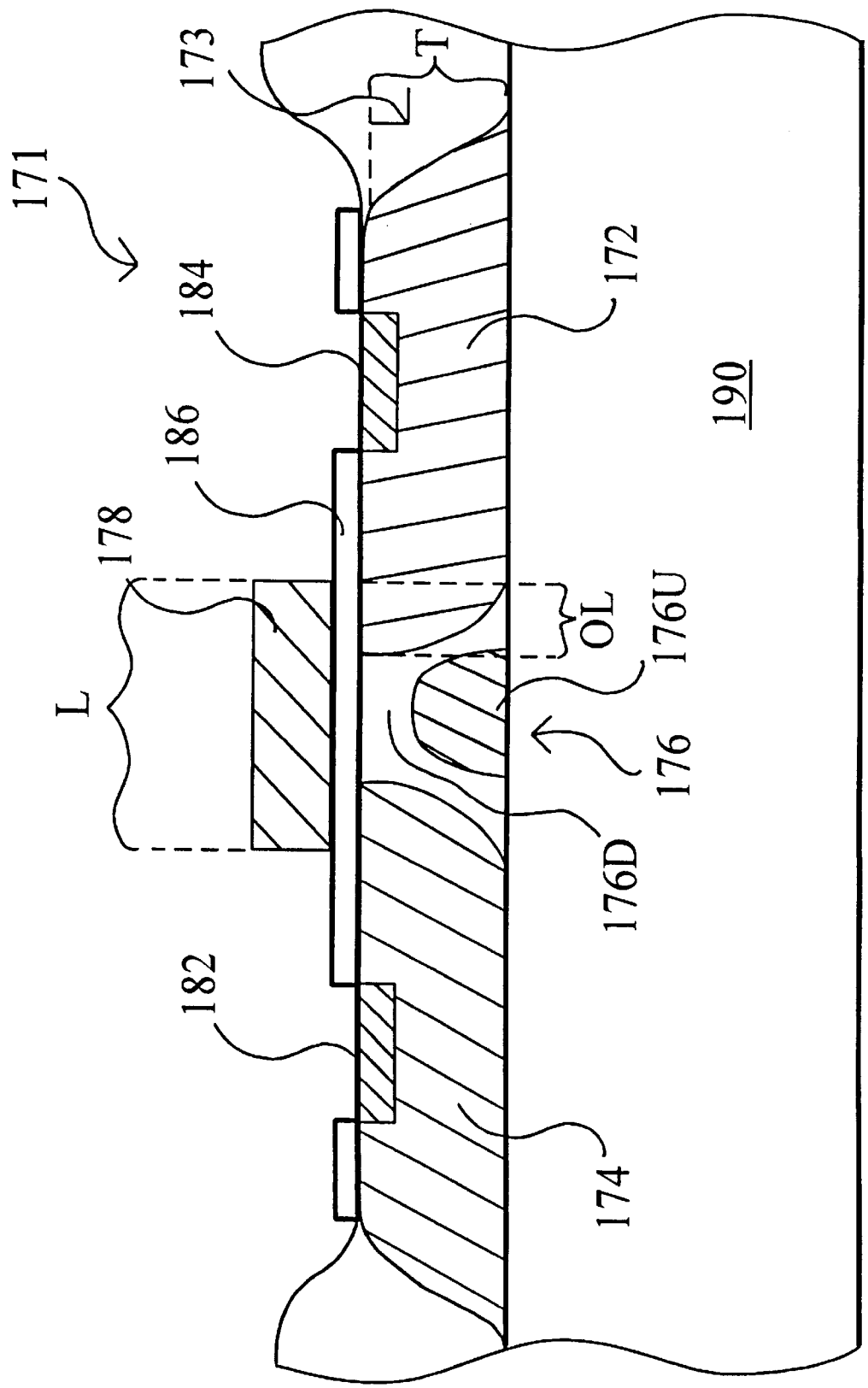
FIG. 4B shows a cross sectional view of a typical MOS device fabricated in conventional Silicon on Sapphire, i.e., a 4,000 to 6,000 Å thick layer of Silicon on a sapphire substrate.
Figure 4C:
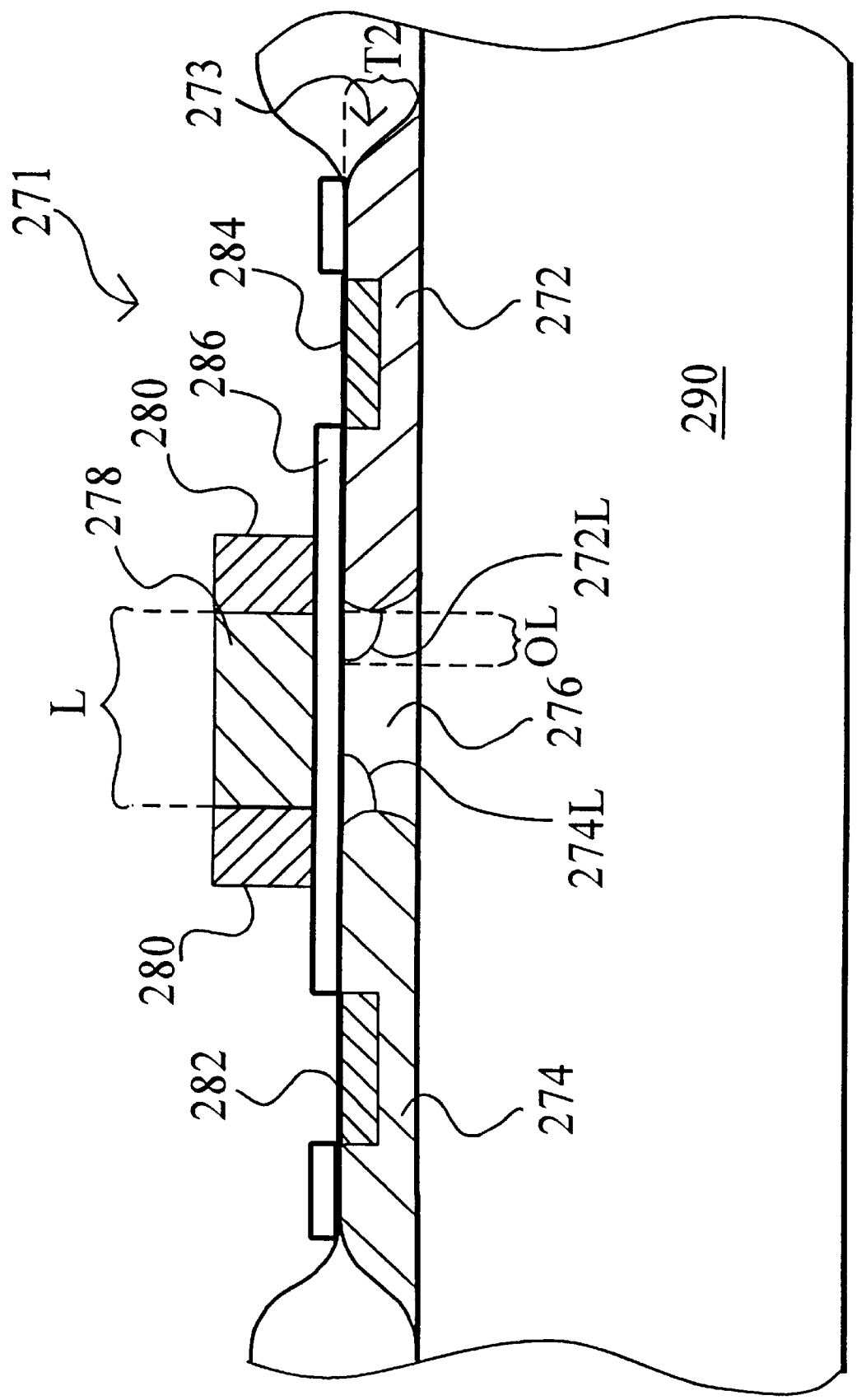
FIG. 4C shows a cross sectional view of a typical MOS device fabricated in ultrathin Silicon on Sapphire of the present invention, i.e., an approximately 1,000 Å thick layer of substantially defect free Silicon on a sapphire substrate.

FIGS. 4A, 4B and 4C show a typical MOS device fabricated in bulk Silicon, conventional Silicon on Sapphire, and ultrathin Silicon on Sapphire of the present invention, respectively. These Figures illustrate how the MOS device fabricated in the ultrathin Silicon on Sapphire of the present invention achieves radio frequency performance characteristics which are far superior to similar devices fabricated in bulk silicon and conventional Silicon on Sapphire.

FIG. 4A shows a cross sectional view of a typical MOS transistor 71 fabricated in a bulk Silicon substrate 90. Transistor 71 includes a drain diffusion region 72, a source diffusion region 74, a conduction channel 76 and a gate 78 having sidewall spacers 80. A lightly doped drain diffusion 72L and a lightly doped source diffusion 74L are positioned adjacent the drain diffusion region 72 and the source diffusion region 74, respectively. A source contact 82 and a drain contact 84 are provided for making connections to the device 71. An oxide layer 86 isolates the gate 78 from the channel 76. A depletion region is indicated generally by dashed line 88 within the bulk silicon substrate 90. Typical of present bulk silicon MOS devices, the minimum length L of gate 78 is less than approximately 0.5 $\mu$m.

The dominant internal capacitances for this type of bulk silicon MOS device are due to: 1) overlap capacitances created by the overlap OL of the gate 78 and the lightly doped drain diffusion 72L and the lightly doped source diffusion 74L (typically, the overlap OL is approximately 0.1 $\mu$m); 2) capacitances between a bottom wall 92 of the source diffusion region 74 and the bulk silicon substrate 90 (similar capacitance is present between the bottom wall of the drain diffusion region 91 (See FIG. 4A) and the bulk substrate 90); and 3) side wall junction capacitances between a side wall 94 of the source diffusion region 74 and the bulk silicon substrate 90 (similar capacitance is present between the side wall of the drain diffusion region and the bulk substrate 90). In order to improve the radio frequency performance of bulk silicon devices, much effort is expended in designing the devices in ways which will reduce these capacitances.

FIG. 4B shows a cross sectional view of a typical MOS transistor 171 fabricated in a conventional Silicon on Sapphire wafer, i.e., a 4,000 to 6,000 Å thick layer of Silicon 173 on a sapphire substrate 190. Transistor 171 includes a drain diffusion region 172, a source diffusion region 174, a conduction channel 176 and a gate 178. The conduction channel 176 includes a depleted region 176D and an undepleted region 176U. A source contact 182 and a drain contact 184 are provided for making connections to the device 171. An oxide layer 186 isolates the gate 178 from the channel 176. Typical of conventional Silicon on Sapphire MOS devices, the minimum length L of gate 178 is approximately 1.5 $\mu$m.

Since conventional or traditional SOS material is limited to minimum epitaxial silicon layer 173 thicknesses T of approximately 4,000 angstroms (Å), depletion region 176D only extends through part of the channel 176. Additionally, since the silicon layer 173 is 4,000 Å thick, the drain diffusion 172 yields a sideways diffusion OL of approximately 3,000 Å, i.e., approximately ⅓ of the gate length L of approximately 1.0–1.5 $\mu$m. The capacitances due to the side walls 94 and the bottom walls 92 in bulk silicon MOS transistor 71 shown in FIG. 4A and discussed above, are eliminated in conventional SOS, but the capacitance due to the 3,000 Å overlap of the source 174 and drain 172 diffusions with the gate 178 and the capacitance from the gate 178 to the undepleted region 176U still remain. The long channel length and high overlap capacitance of the typical conventional SOS device shown in FIG. 4B make it generally unsuitable for fabrication of MOSFETs having an $f_t$ in excess of the 10 GHz required for RF power amplifier operation above 700 MHz.

FIG. 4C shows a cross sectional view of a typical MOS transistor 271 fabricated in the ultrathin Silicon on Sapphire of the present invention, i.e., an approximately 1,000 Å thick layer of substantially pure Silicon 273 on a sapphire substrate 290. Transistor 271 includes a drain diffusion region 272, a source diffusion region 274, a conduction channel 276 and a gate 278 having sidewall spacers 280. A lightly doped drain diffusion 272L and a lightly doped source diffusion 274L are positioned adjacent the drain diffusion region 272 and the source diffusion region 274, respectively. A source contact 282 and a drain contact 284 are provided for making connections to the device 271. An oxide layer 286 isolates the gate 278 from the channel 276. A representative gate length L for gate 278 in ultrathin Silicon on Sapphire of the present invention is approximately 0.5 $\mu$m.

The MOS device 271 in ultrathin silicon on sapphire of the present invention shown in FIG. 4C exhibits substantially smaller short channel effects than either the bulk silicon device 71 or the conventional SOS device 171 because of the substantially thinner silicon film 273 thickness T2 of approximately 0.1 $\mu$m (equivalent to 100 nanometers or 1,000 Å). Production of a device having a transconductance capable of gain-bandwidths of approximately 10 GHz is achieved by selecting gate length L to be approximately 0.8 $\mu$m. This significant reduction from the conventional SOS channel lengths of 1.5 $\mu$m is possible because of the reduction in the thickness T of the silicon film 273.

Transistor 271 of FIG. 4C has high transconductance properties since the gate length L is on the order of 0.8 $\mu$m or less. It also has low parasitic capacitance in comparison to the bulk Si transistor 71 and conventional SOS transistor 171 illustrated in FIGS. 4A and 4B. Because low temperature processing (described previously) is used to produce device 271 of the present invention, sideways diffusion of the lightly doped source 274L and the lightly doped drain 272L regions extend only about 0.03 $\mu$m under the gate 278. Note that in MOS transistor 71 of FIG. 4A the lightly doped source 74L and the lightly doped drain 72L regions extend about 0.1 $\mu$m under the gate 78, thus creating substantially greater overlap capacitance. Also, note that the drain diffusion 172 for the typical SOS device 171 of FIG. 4B has a sideways diffusion overlap OL of the source 174 and drain 172 under the gate 178 of approximately 0.3 $\mu$m. In comparison, the gate overlap capacitance of the MOS device in ultrathin silicon on sapphire of the present invention shown in FIG. 4C is reduced by at least a factor of 3.

Due to the above described improvements resulting in reduced overlap of the source and drain with the gate and reduced channel length, transistor 271 of the present invention achieves the gain-bandwidth product of 10 GHz required to construct a 700 MHz RF power amplifier. This is due to a transconductance approximately as high as the bulk Si MOS transistor 71 and the reduced device capacitances described above.

Figure 5A:
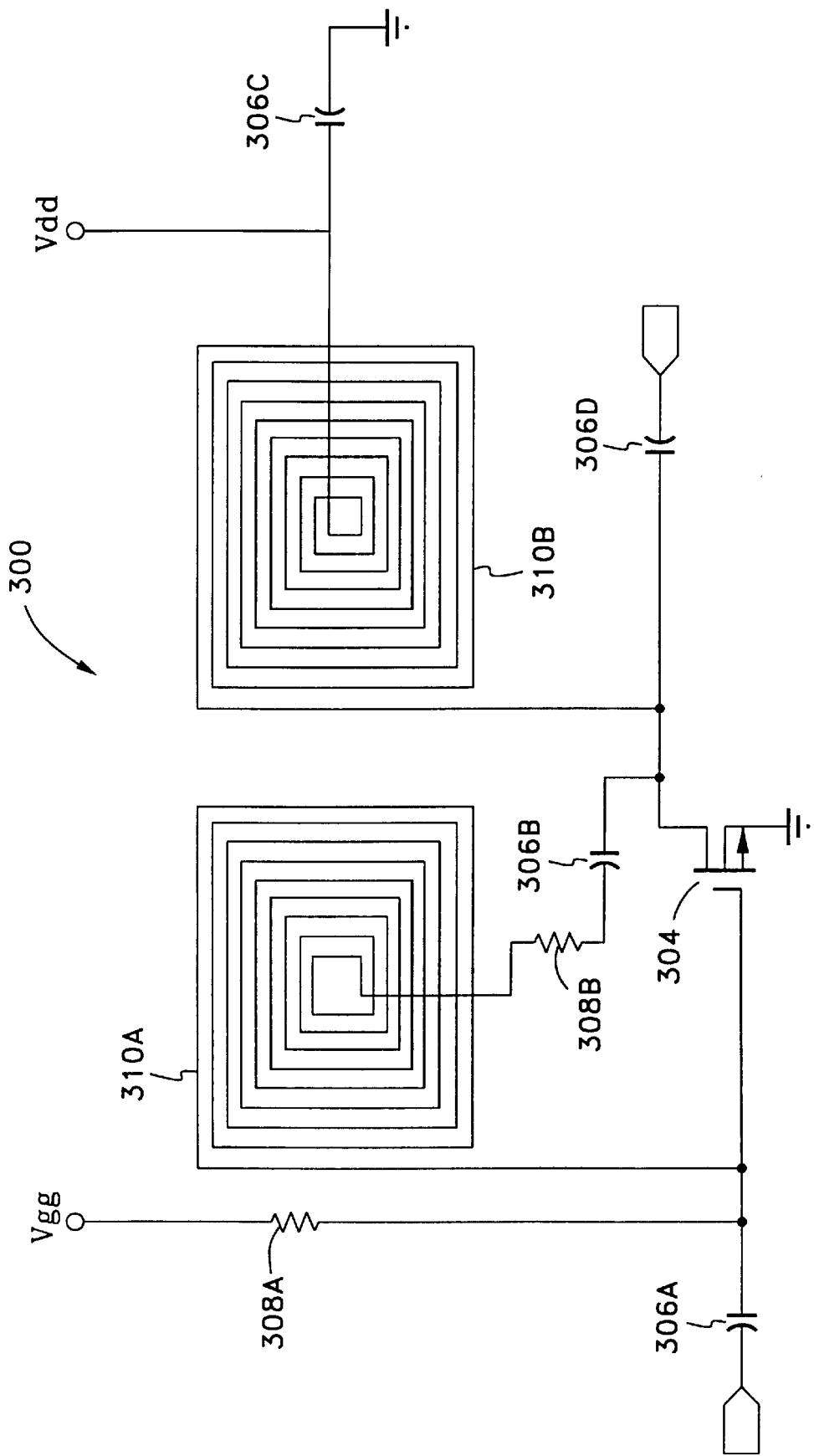
FIG. 5A shows an electrical schematic diagram of a typical high frequency radio amplifier stage.

FIG. 5A is an electrical schematic diagram of a typical high frequency radio amplifier stage 300. Amplifier stage 300 includes an N-channel active device 304 having a device width of 500 μm and a channel length of 0.8 μm, capacitors 306, resistors 308 and inductors 310.

The amplifier stage 300 could be fabricated in bulk silicon. However, such a device would have severe limitations on its high frequency performance. The capacitors and inductors are easily formed in bulk Si MOS fabrication technology using MOS technology that is well understood by those knowledgeable in the art. In MOS technology, the capacitor plates are formed using the two layers of metal commonly available in the MOS processes. They may also be formed under a polysilicon gate by using a process step known as a buried layer. Yet another alternative is to form a capacitor between the gate polysilicon and a second layer of polysilicon. The inductors may be formed by patterning either of the two metal layers. However, low substrate conductivity is essential for low-loss operation of the inductors at frequencies above 700 MHz. Unfortunately, the high conductivity of the bulk silicon substrate seriously degrades the inductor performance and consequently the high frequency performance of the amplifier stage 300 when fabricated in bulk silicon.

Figure 5B:
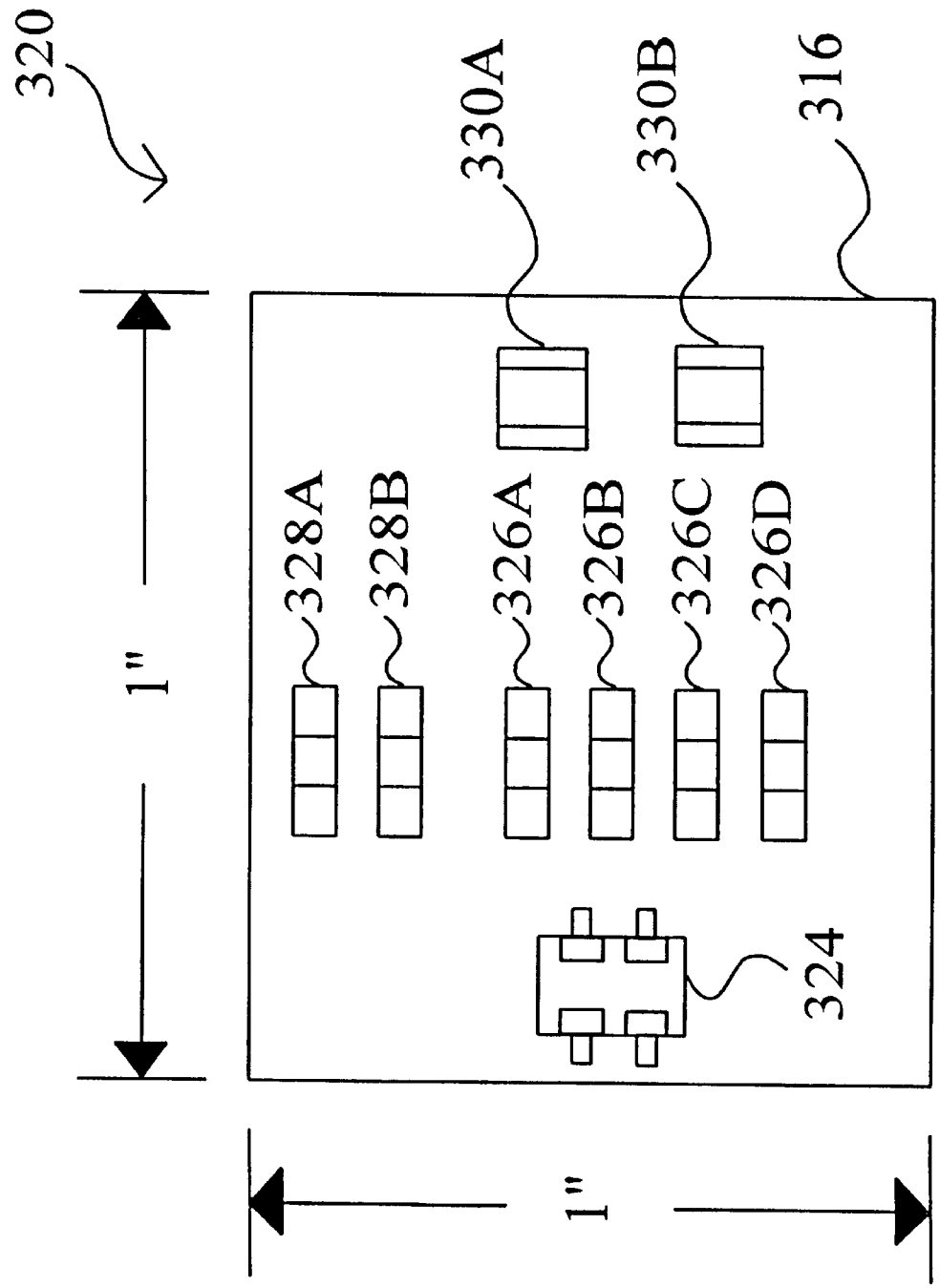
FIG. 5B shows the RF power amplifier stage in FIG. 5A fabricated on an insulating substrate using discrete components.

While GaAs has been found suitable for fabrication of certain high frequency active devices, it has been found to be unacceptable where it is desirable to integrate both active and passive components on a single chip. This is due to the high conductivity of the substrate which causes unacceptably high loss factors for inductors operating at frequencies above 700 MHz. Also, manufacturing options commonly available in silicon processing, such as gate oxide growth, are not available or as mature in GaAs. Thus, since bulk silicon and GaAs, have proven inadequate for single chip construction of high frequency applications of amplifier stage 300, such circuits are generally fabricated on an insulating substrate 316 using discrete components as shown in FIG. 5B. Insulating substrate 316 may be a printed circuit board or alumina substrate. Mounted on the substrate 316 are the individual components comprising the amplifier stage 300 including an N-channel active device 324, capacitors 326, resistors 328 and inductors 330. The dimensions of such a printed circuit board are typically about one inch square.

Figure 5C:
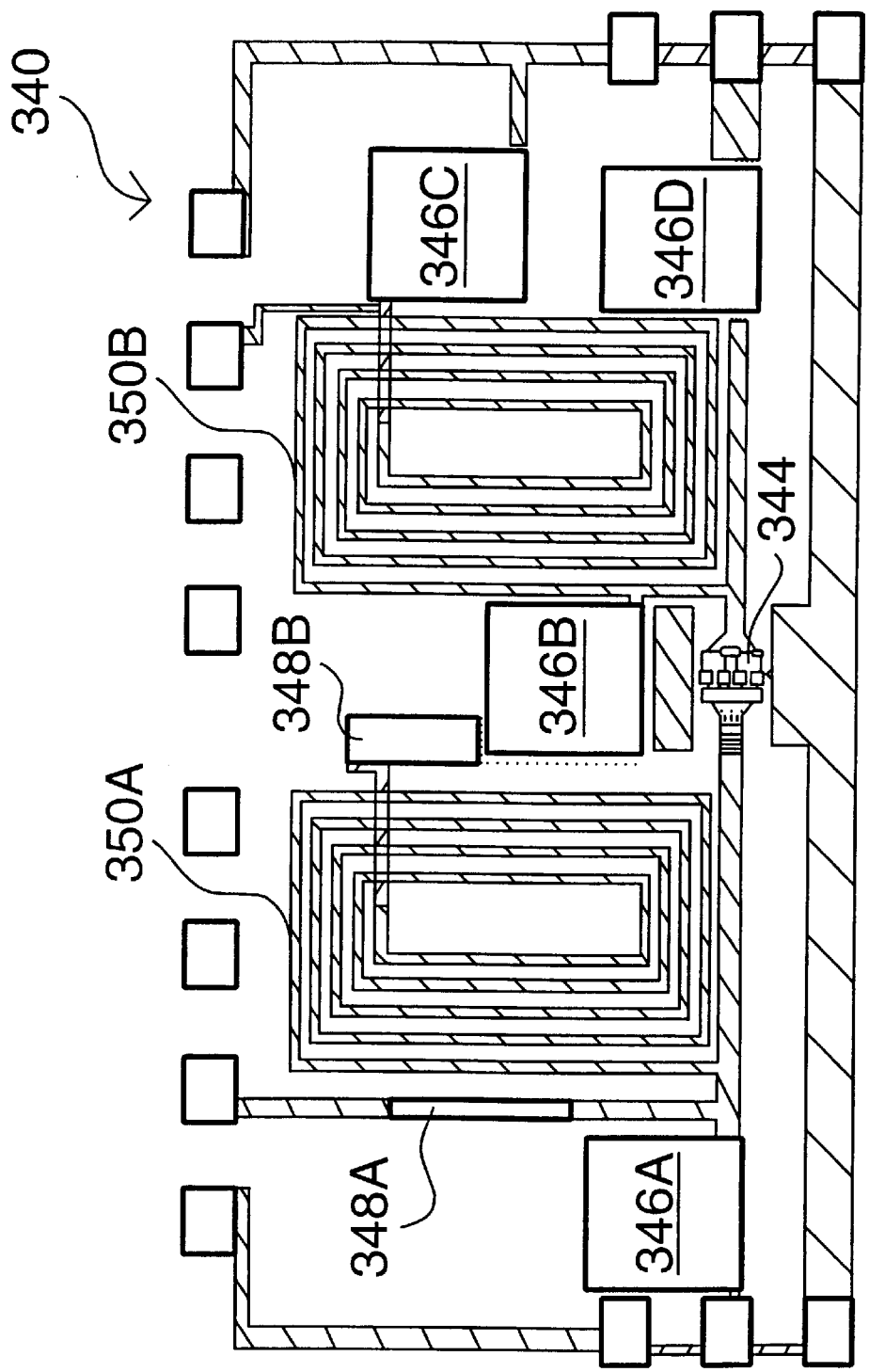
FIG. 5C shows the RF power amplifier stage in FIG. 5A fabricated on a single ultrathin silicon on sapphire chip of the present invention.

FIG. 5C illustrates the integration of passive and active components on a single ultrathin silicon on sapphire chip of the present invention. Shown in FIG. 5C is amplifier stage 300 on a single ultrathin silicon on sapphire chip of the present invention. In this case, all of the components, including active as well as passive devices are formed in the same material. As above, circuit 300 includes active device 344, capacitors 346, resistors 348, and inductors 350. Circuit layout 340 has dimensions of only 100 mils by 30 mils and is, therefore, easily accommodated on a small portion of an ultrathin silicon on sapphire integrated circuit. One important factor necessary for the successful integration of high frequency active and passive RF components on a single chip which is provided by the ultrathin silicon on sapphire chip of the present invention is low conductivity of the insulating substrate. Since traditional bulk silicon processing technology is easily transferred to the ultrathin silicon on sapphire technology of the present invention, fabrication of amplifier stage 300 on a single ultrathin silicon on sapphire chip of the present invention is straightforward.

Additional information (including circuit designs, design rules, processes, etc.) which may be adapted for making similar or analogous devices or circuits in the ultrathin silicon on sapphire material of the present invention is disclosed in a book authored by J. E. Franca and Y. Tsividis entitled "Design of Analog-Digital VLSI Circuits for Telecommunications and Signal Processing", 2nd Edition, Prentice Hall, 1994, this entire publication is hereby incorporated herein by reference.

ANALOG ELEMENTS

In order to eliminate the kink effect present in traditional SOS devices as previously described in the BACKGROUND OF THE INVENTION for analog circuitry, it is necessary to eliminate the undepleted region 176U under the gate 178 in the SOS transistor 171 shown in FIG. 4B. Two undesirable properties of traditional SOS devices must be overcome to eliminate this undepleted region 176U.

First, the density of active states must be reduced below about $2 \times 10^{11}$ cm$^{-2}$. Then the active states will not prematurely terminate the gate electric field, preventing it from ionizing all the dopant atoms in the channel region 176.

Second, the film thickness T must be less than the depletion depth when the channel is in a conductive state. When the channel is conducting, the surface potential of the channel has reached a value sufficient for inversion. This potential is more than 400 mV beyond the intrinsic potential of the substrate, and is more than sufficient to fully deplete a film thickness of approximately 1,000 Å.

Figure 6A:
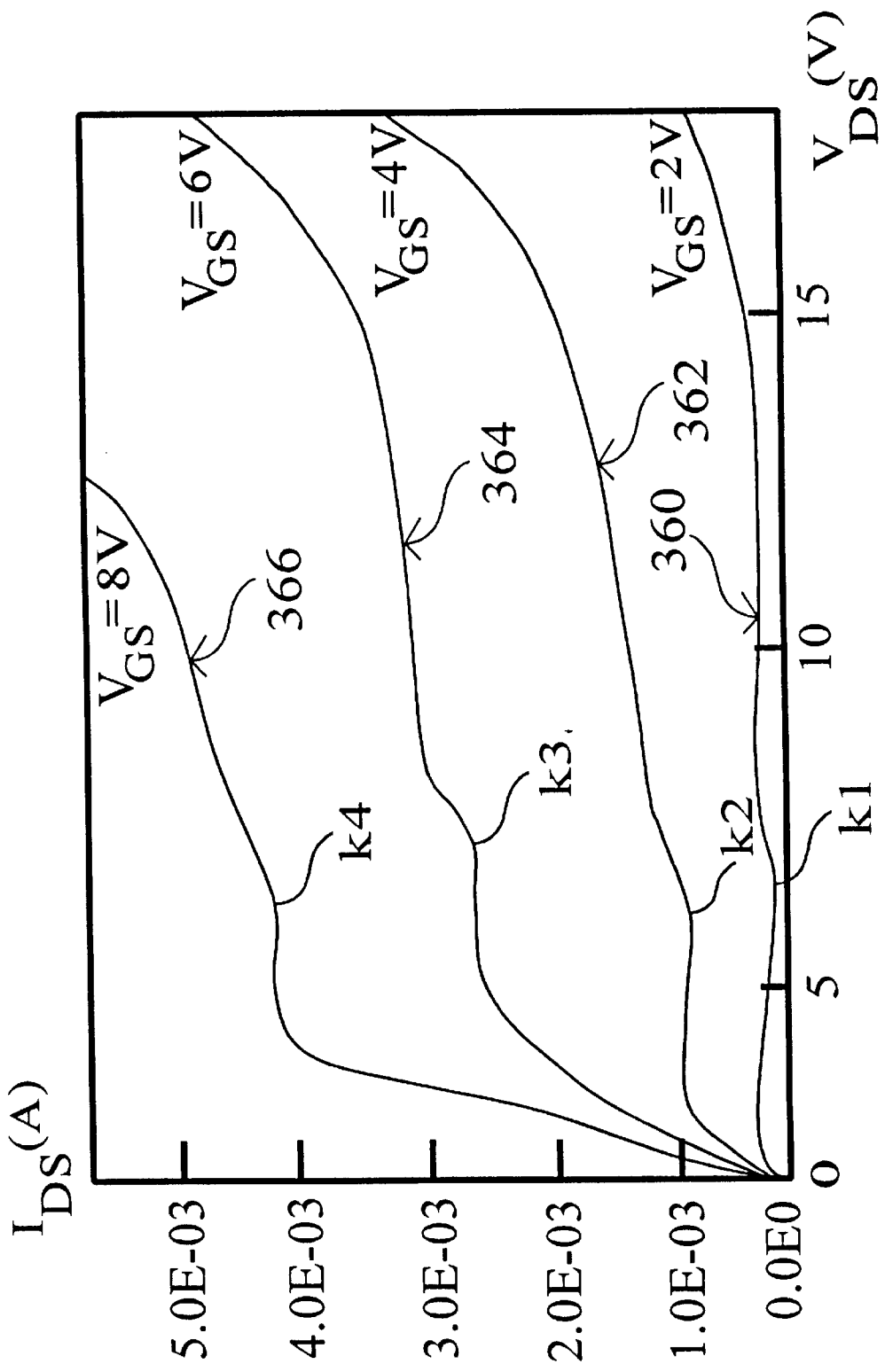
FIG. 6A illustrates the kink effect typical of traditional SOS devices.
Figure 6B:
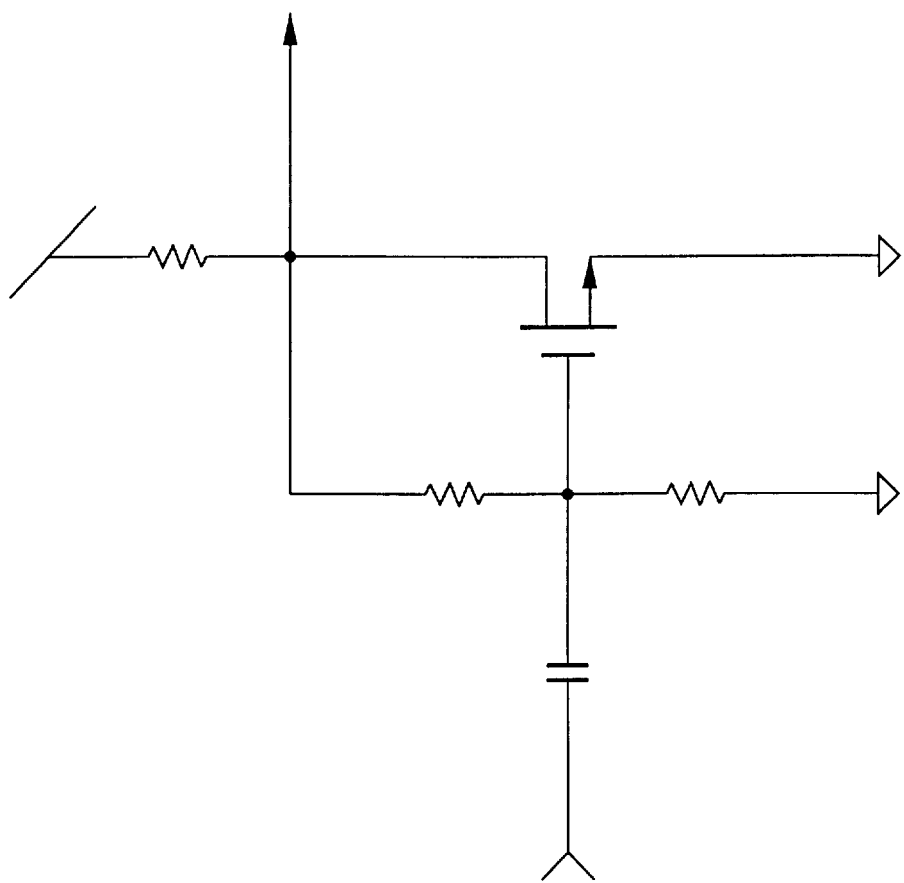
FIG. 6B shows a simple preamplifier circuit.

The curves shown in FIG. 6A illustrate the kink effect typical of traditional SOS devices. Curves 360, 362, 364 and 366 show the drain current $I_{DS}$ as a function of drain voltage $V_{DS}$ for four values of gate voltage $V_{GS}$, 2 volts, 4 volts, 6 volts and 8 volts, respectively. Each of these curves exhibits a kink, or non-linear feature, at the points labelled k1, k2, k3 and k4. Because drain current non-linearities and instabilities correspond to output voltage non-linearities and instabilities in a simple preamplifier as shown in FIG. 6B, such a preamplifier has a non-linear output voltage to input voltage relationship which is unsuitable for most analog circuit applications.

Referring now to FIGS. 7A through 7D, these graphs of N-channel and P-channel plots for bulk Si and the present invention in ultrathin silicon will illustrate the absence of the kink effect in the present invention.

Figure 7A:
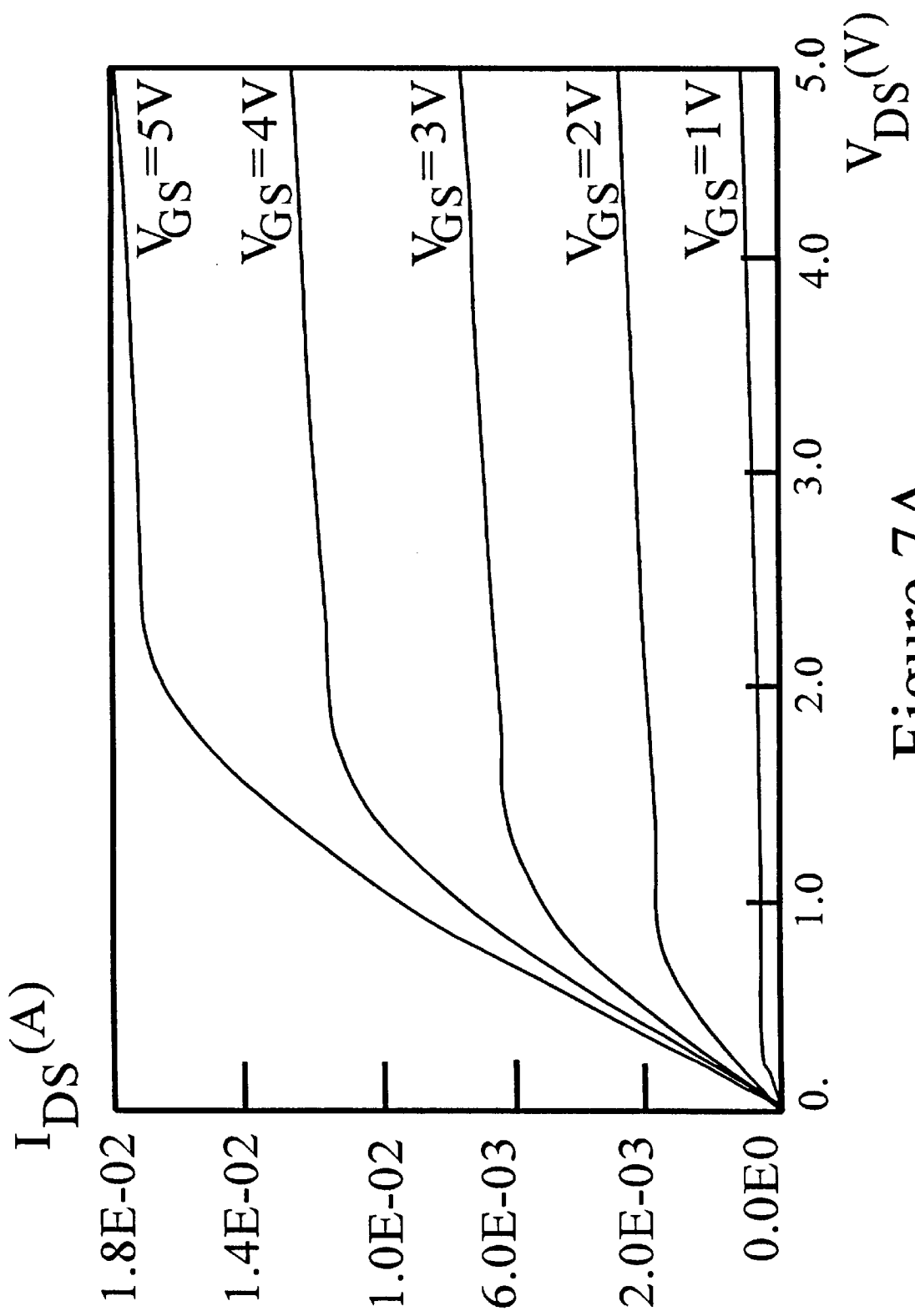
FIG. 7A illustrates the drain current versus gate voltage characteristics typical of a N-channel bulk silicon transistor.
Figure 7B:
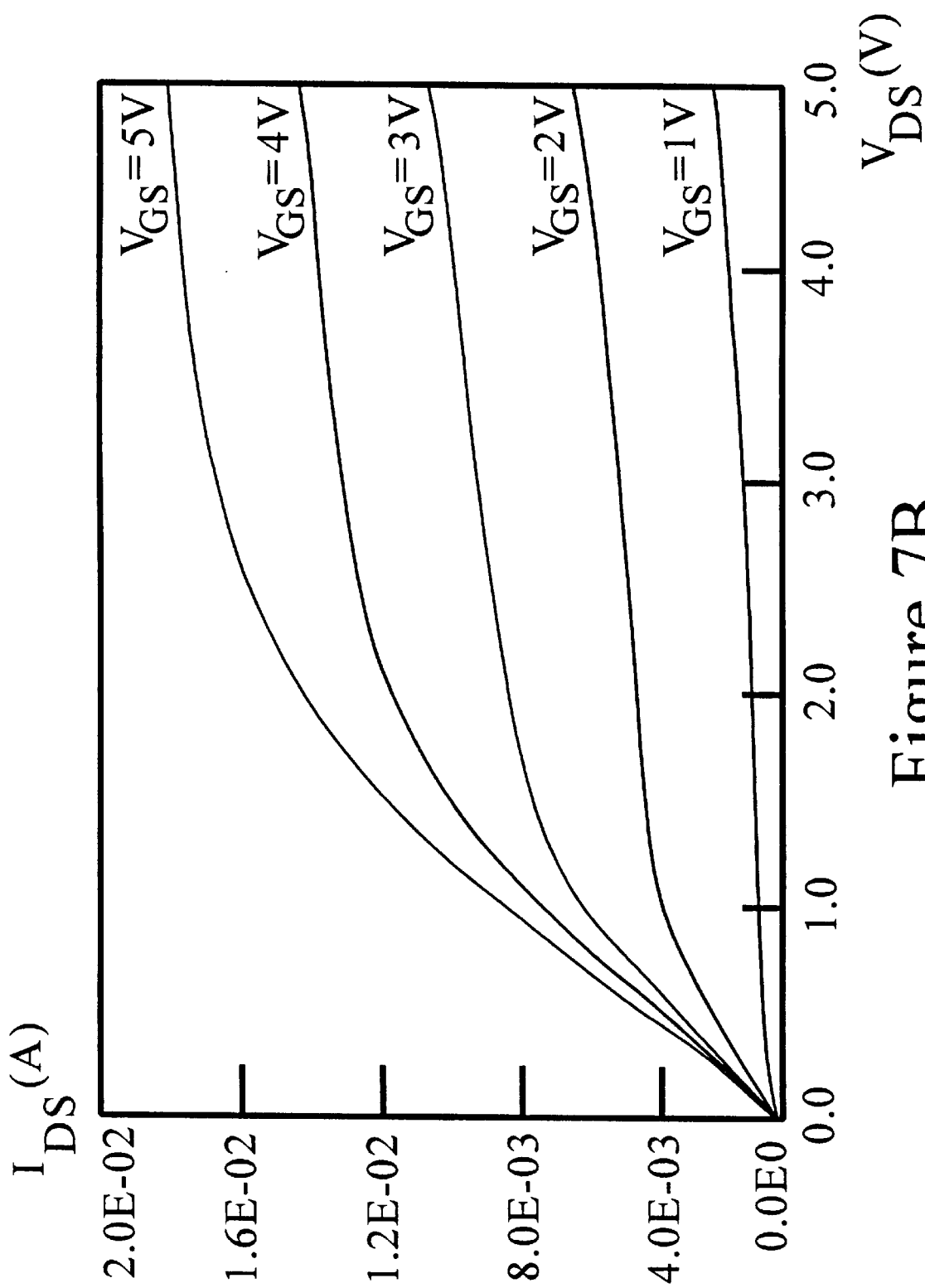
FIG. 7B illustrates the drain current versus gate voltage characteristics of a regular N-channel transistor fabricated in ultrathin silicon on sapphire of the present invention.

FIG. 7A illustrates the drain current versus gate voltage characteristics typical of a N-channel bulk Si transistor with an effective length or "LEFF" of 0.75 μm, a width of 50 μm, a gate polysilicon length of 0.75 μm, and a gate oxide thickness of 180 Å. FIG. 7B illustrates an N-channel transistor in ultrathin silicon on sapphire of the present invention with a width of 50 μm, an LEFF of 0.75 μm, a gate length of 0.75 μm, and a gate oxide thickness of 180 Å. The kink effect is absent in FIG. 7B and the flatness of the drain current curves indicates a minimal amount of electrostatic feedback from the drain to the gate region near the source. Because this transistor has a boron implant to bring its threshold near 0.7 V, it is designated as a "Regular N" or "RN" device.

Figure 7C:
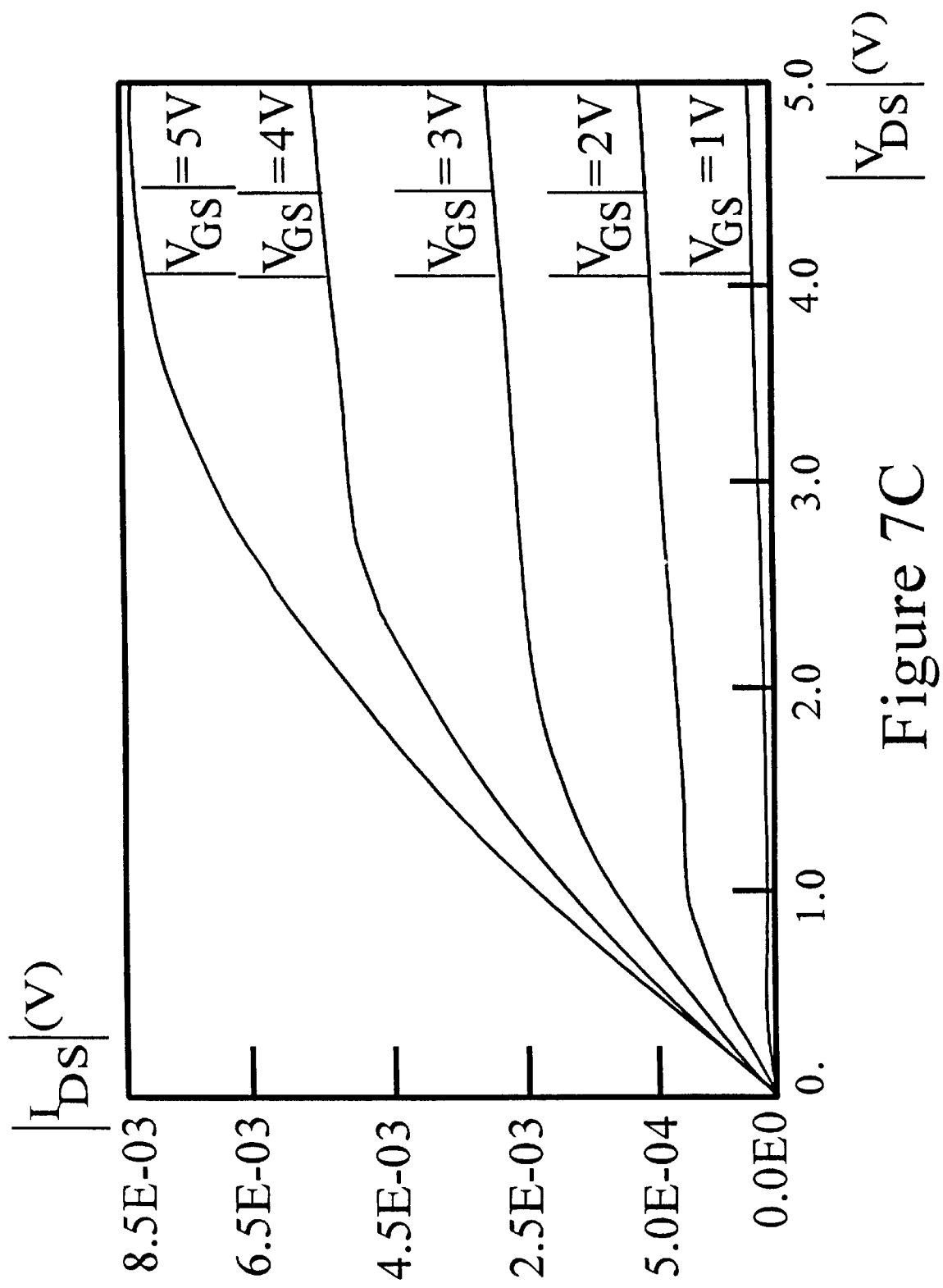
FIG. 7C illustrates the drain current versus gate voltage characteristics typical of a P-channel bulk silicon PMOS transistor.
Figure 7D:
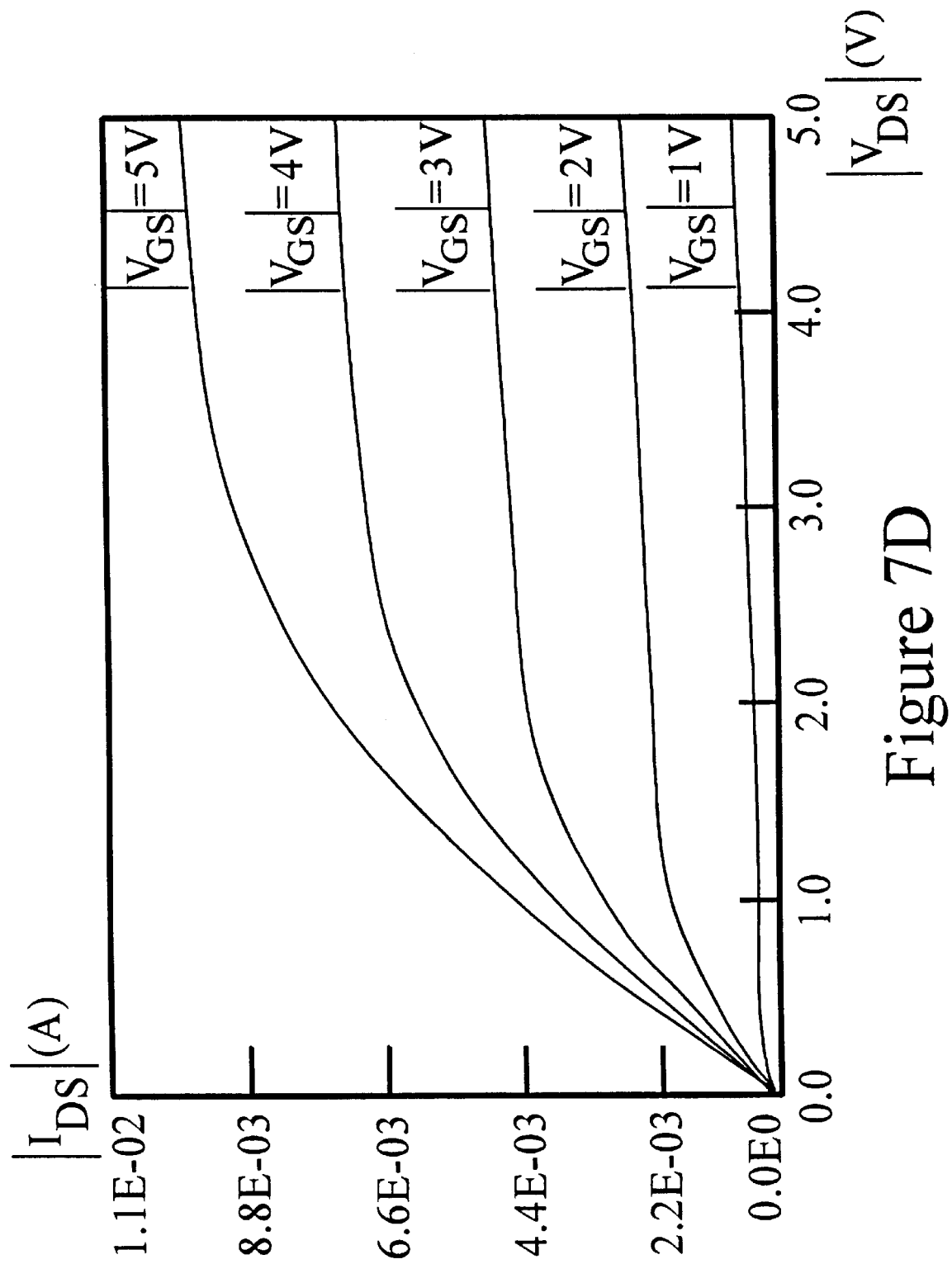
FIG. 7D illustrates the drain current versus gate voltage characteristics of a regular P-channel transistor fabricated in ultrathin silicon on sapphire of the present invention.

FIGS. 7C and 7D compare the P-channel curves for PMOS transistors in bulk Si and ultrathin silicon, respectively. The curves in FIG. 7C of bulk Si are for a transistor with a 0.75 μm LEFF, a width of 50 μm, a gate length of 0.75 μm, and a gate oxide thickness of 180 Å. The threshold voltage is seen from the curves to be approximately –0.9 V. The curves presented in FIG. 7D of the present invention are also for a PMOS transistor. The width is 50 μm, LEFF is 0.75 μm, the gate length is 0.75 μm, and the gate oxide thickness is 180 Å. As seen in the Figures, the P-channel transistor of the present invention provides at least 15% more $I_{DSAT}$ current than the bulk Si P-channel transistor of FIG. 7C.

The kink effect is absent in FIG. 7D as it is in FIG. 7B for the present invention. The flatness of the drain current curves indicates a minimal amount of electrostatic feedback from the drain to the gate region near the source. But, the flatness of the drain current characteristic also reveals another advantage of the current invention: the apparent absence of a significant amount of channel length modulation. The flatness of the drain current characteristics for both FIGS. 7B and 7D of the present invention indicates that the output conductance of these transistors is ideal for the fabrication of typical analog circuits such as operational amplifiers.

Because DC voltage gain in linear devices cannot exceed transconductance divided by output conductance, the DC gain of the device is significantly larger than the bulk Si P-channel MOS device. Transconductance is enhanced by comparison to bulk Si P-channel MOS devices because low doping in the channel results in less mobile carrier scattering, and therefore, higher mobility. An additional factor enhancing P-channel MOS mobility on sapphire substrates is that mismatches in the substrate to epitaxial lattice dimensions result in compressive stresses being applied to the epitaxial layer. Compressive stress in silicon enhances hole mobility, and therefore, enhances P-channel MOS transconductance. A threshold shifting implant reduces hole mobility. The P-channel transistor of FIG. 7D is designated "Regular P" or "RP" because it has a boron implant to shift threshold down to a regular bulk PMOS threshold of −0.7 volts. Because of the thinness of the fully depleted region, less boron is required than for the bulk CMOS device to reach the same threshold. Hole mobility is therefore approximately 10% to 20% higher for the RP device than for the bulk silicon PMOS device.

Figure 7E:
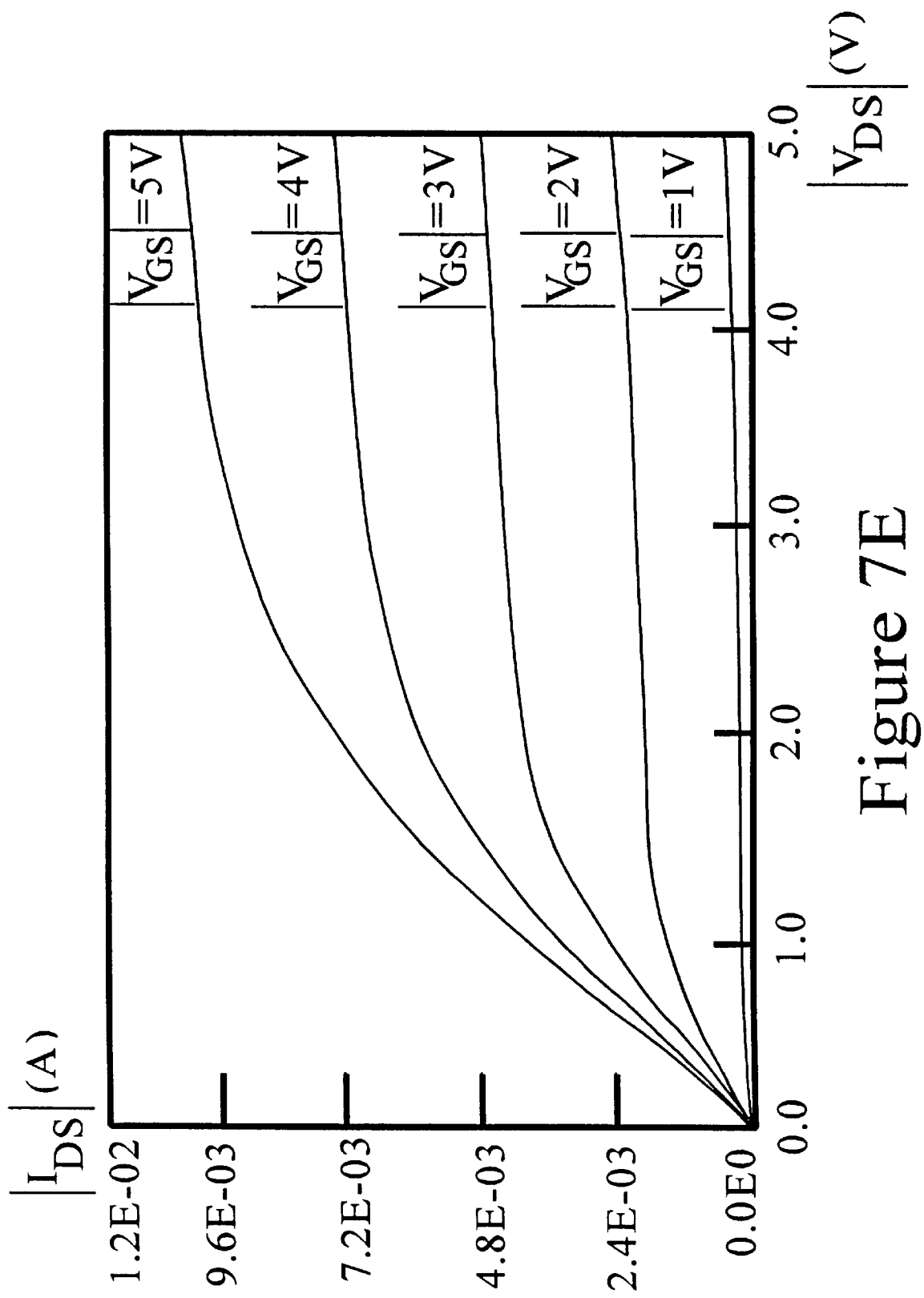
FIG. 7E illustrates the drain current versus gate voltage characteristics of an intrinsic P-channel transistor fabricated in ultrathin silicon on sapphire of the present invention.
Figure 7F:
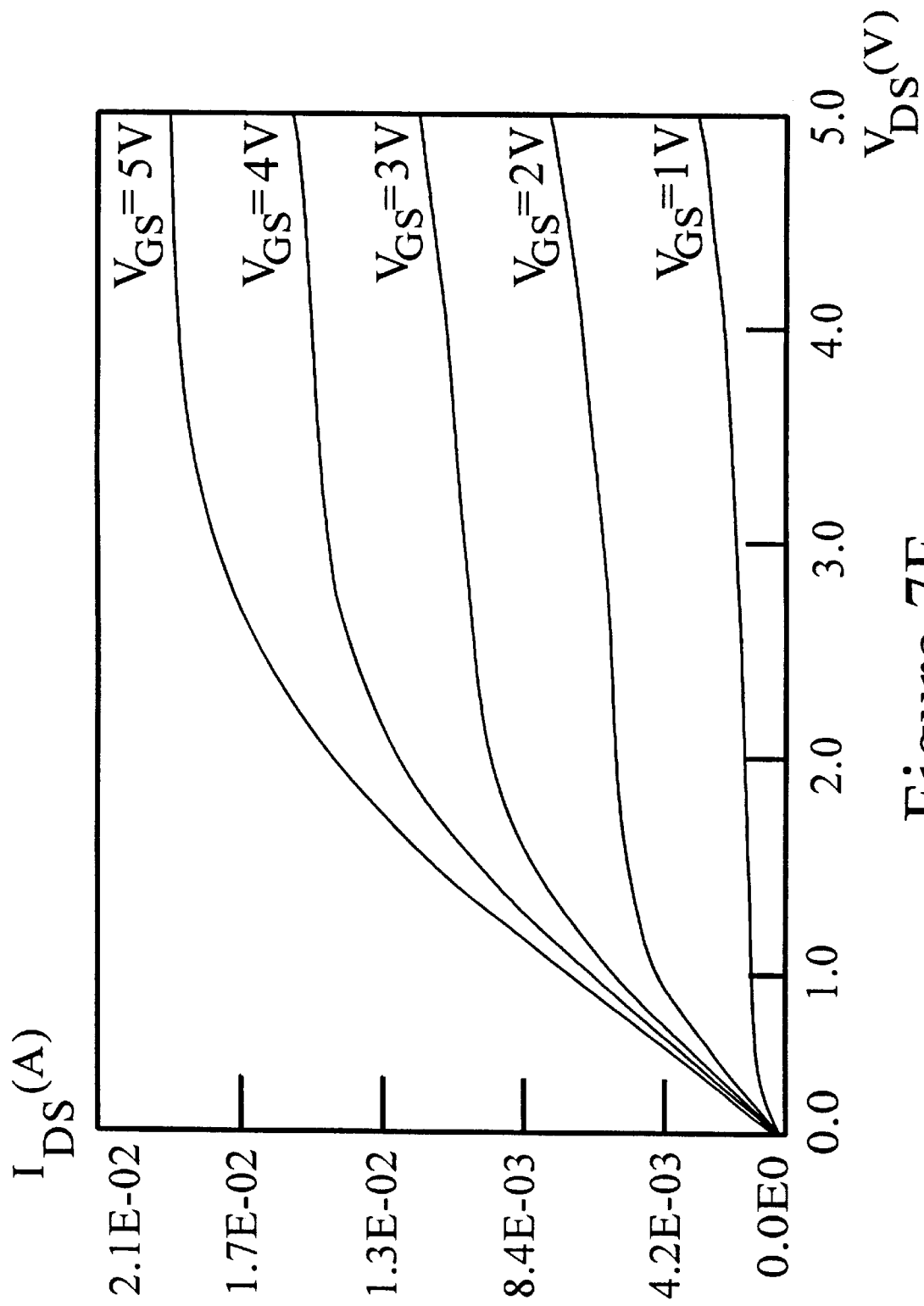
FIG. 7F illustrates the drain current versus gate voltage characteristics of an intrinsic N-channel transistor fabricated in ultrathin silicon on sapphire of the present invention.

It is also possible to fabricate both N-type and P-type devices in the ultrathin silicon on sapphire of the present invention with no threshold shifting implants. These devices are designated "Intrinsic P" or "IP" and "Intrinsic N" or "IN" and the drain current verse gate voltage characteristics of these devices are shown in FIG. 7E and FIG. 7F, respectively.

One embodiment of a PMOS transistor of the present invention is fabricated with a substrate doping of less than $5 \times 10^{15}$ cm$^{-3}$, well below the $5 \times 10^{16}$ cm$^{-3}$ considered adequate to prevent a typical sub-micron device from having unacceptably high output conductance resulting from channel length modulation. This is because the depletion region from the drain junction in a MOS device typically extends much farther into the channel than the drain because the channel is more lightly doped. The edge of the drain depletion region in the channel defines the end of the channel for a bulk CMOS device. If the depletion region length extends as a result of a drain voltage increase, then the channel length is shortened and the device current, proportional to the width divided by the length of the channel, increases. The amount the depletion region lengthens for a given change in drain voltage is inversely proportional approximately to the square root of doping density.

Another important property related to the fabrication of typical analog circuits, such as operational amplifiers, is offset voltage uniformity. It is desirable to achieve offset voltages less than 50 mV in typical CMOS operational amplifier applications. Because the standard deviation in threshold variation from the presence of active states is proportional to the square root of the number of active states below the gate, reducing the active state density to an acceptable value is key to obtaining an acceptable offset voltage uniformity.

Full depletion of the substrate provides an extremely useful result in the construction and performance of an analog transmission gate. The analog transmission gate is a well known device in the art of CMOS data converters. The gate functions as a switch with a very high "off resistance" and an "on resistance" inversely proportional to the "gate drive", or gate-to-source voltage in excess of threshold.

Figure 8:
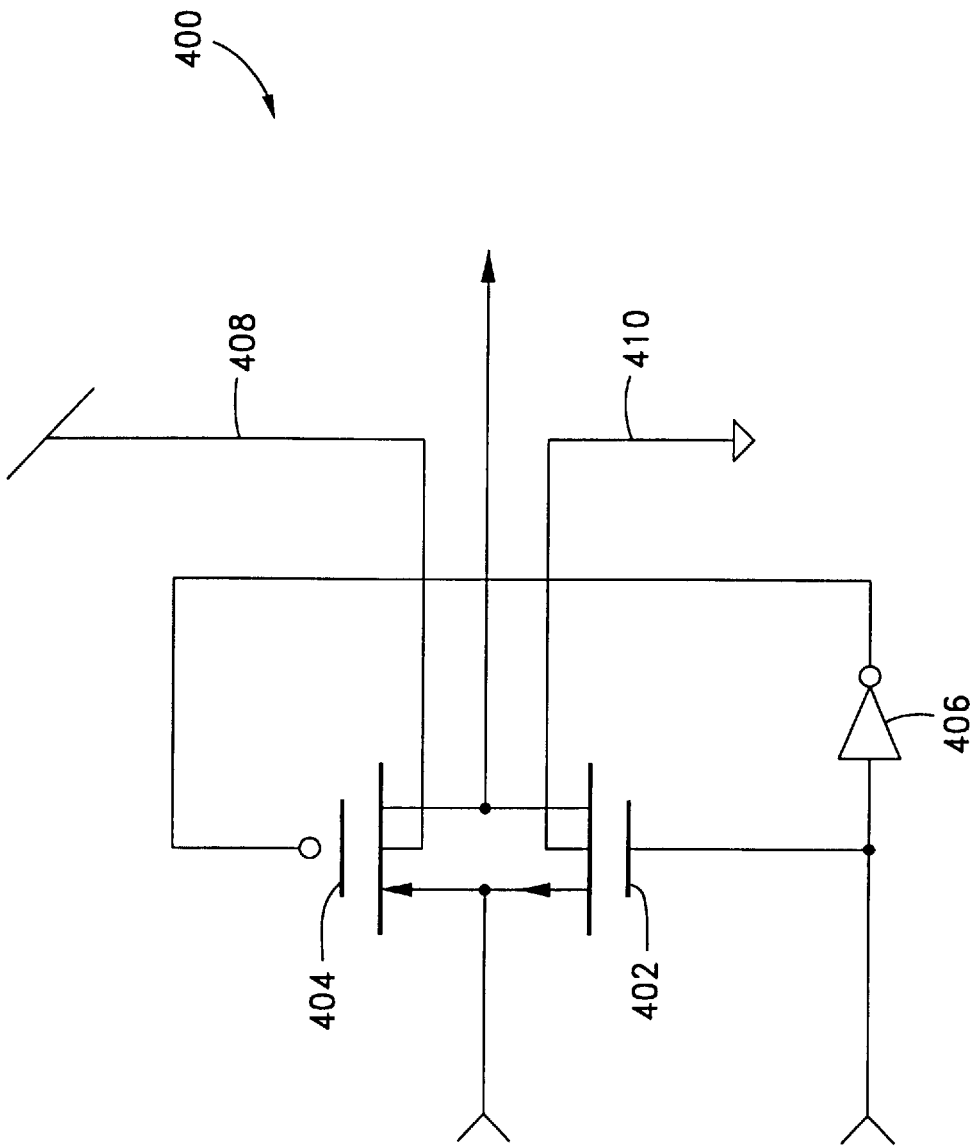
FIG. 8 shows a typical bulk silicon analog transmission gate circuit.

A typical bulk silicon analog transmission gate circuit 400 of bulk Si is shown in FIG. 8. Circuit 400 includes an NMOS device 402, a PMOS device 404, a logic inverter 406, a PMOS N well supply voltage of 5 V, 408, and a NMOS P well supply voltage of 0 V (or grounded) 410.

The IP device of the present invention has a mobility slightly higher than the RP device because of the lack of a threshold shifting implant. The threshold voltage of approximately −1 volt is not as high as for the corresponding bulk silicon device because there is much less contribution to threshold voltage shift from substrate depletion charge. Fabrication of a bulk CMOS IP or IN channel device would not be practical since channel length modulation effects would increase output conductance to levels unacceptable for conventional analog or digital MOS circuit design.

The IN device has a mobility significantly higher than the RN device because of a lack of a threshold-shifting implant. Threshold for the IN device is near 0 volts. This device is useful for high current drivers in memory applications and for source follower transistors in analog applications. In an analog source-follower the normal gate-to-source threshold causes the source output voltage to be at a voltage below the gate input voltage by an amount greater than the threshold voltage. This gate-to-source offset voltage is reduced by at least 0.7 volts from the use of the IN, rather than the RN device. It is reduced additionally as a result of the low source-body effects present in both RN and IN ultrathin fully depleted silicon on sapphire devices. The last reduction is significant because analog source-followers are normally operated with source voltages midway between the positive and negative supply voltages.

An analog transmission gate of the present invention in ultrathin silicon comprises the same elements as the analog transmission gate 400 in FIG. 8 of bulk Si, but with the elimination of the PMOS N well supply voltage 408 and NMOS P well supply voltage 410. The analog transmission gate fabricated in the ultrathin silicon on sapphire of the present invention does not exhibit the problems associated with the bulk silicon version of this circuit previously described in the BACKGROUND OF THE INVENTION section. In the present invention, the threshold does not increase with source voltage because the depletion region has already reached its maximum depth at the onset of inversion. The gate voltage in excess of threshold is, then, just the difference between the gate-source voltage and the device threshold of 0.8 V. This is low compared with a bulk MOS threshold of typically 1.7 V when the source is operated at a voltage midway between the +5V supply voltage. The "on resistance" of the gate is therefore a factor of 2 less than in bulk Si. Also, because of a lack of body effect, a simple N-channel pass transistor 402 can be used in place of the transmission gate 400, thereby eliminating P-channel MOSFET 404 and logic inverter 406, thereby reducing area and complexity by up to 80%.

Because of the great reduction in "on resistance" possible using the present invention, transmission gate speed is increased by more than a factor of 2 in driving a given capacitive load at mid-supply. This speed increase is also useful in transmission gates used in SRAM or DRAM cells.

Figure 9A:
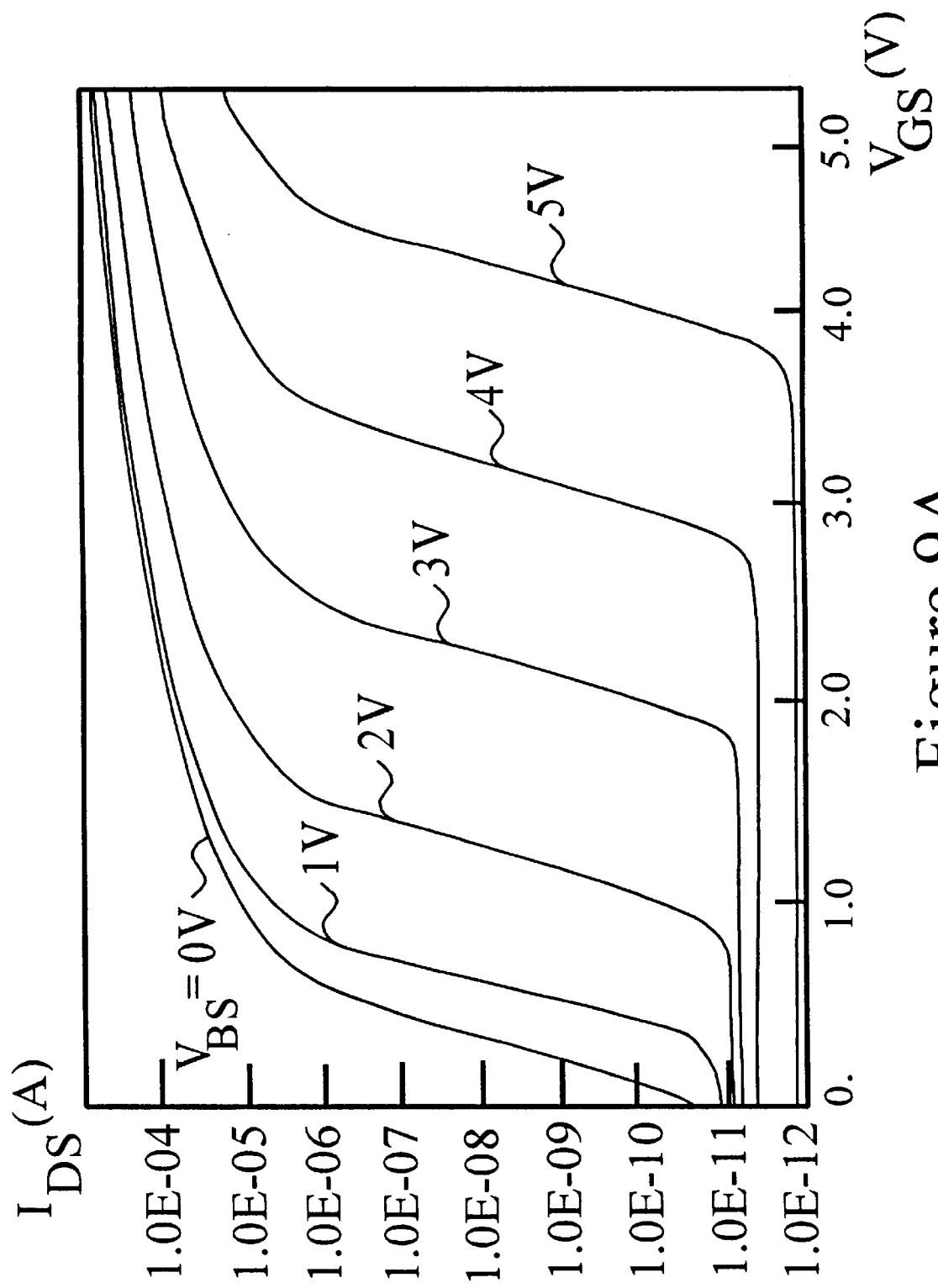
FIG. 9A flows a family of Log I–V plots for a bulk Si N-channel MOS transistor.
Figure 9B:
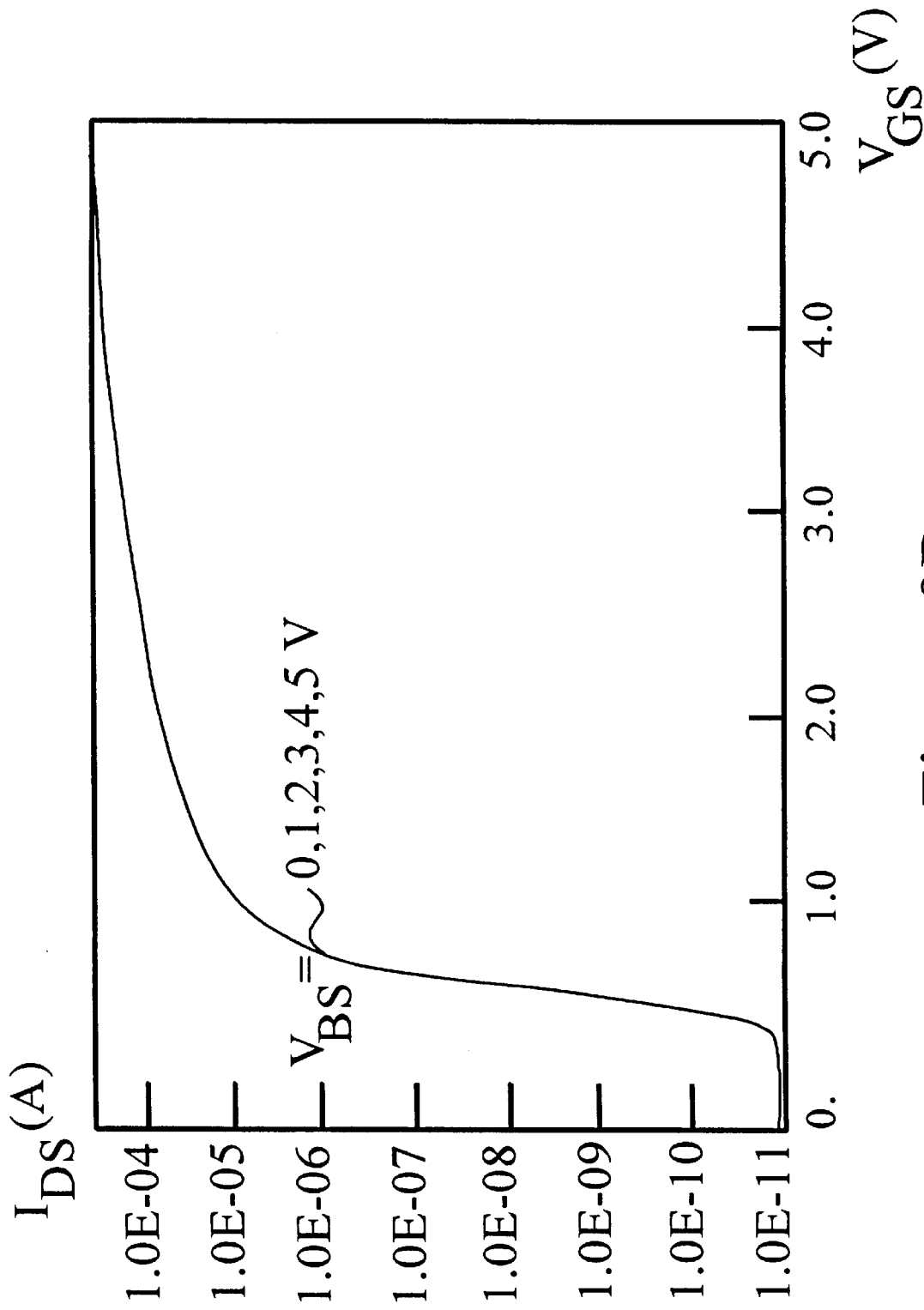
FIG. 9B shows a Log I–V plot for an N-channel MOS transistor fabricated in the ultrathin silicon on sapphire of the present invention.

In order to demonstrate the absence of source body effects in the present invention, a comparison of a bulk silicon N-channel MOS transistor with an N-channel MOS transistor fabricated in ultrathin silicon on sapphire of the present invention is shown in FIGS. 9A and 9B. FIG. 9A is a family of Log I–V plots for a bulk Si N-channel MOS transistor. The drain to source current, $I_{DS}$, is plotted as a function of the gate to source voltage, $V_{GS}$, for six values of the bulk (or well) to source voltage, $V_{BS}$. The curves demonstrate that the curves shift to the right as the voltage between the bulk Si substrate and the source, $V_{BS}$, increases, thus indicating an increase in threshold voltage, $V_{TH}$. As the threshold voltage goes up, the gate drive is reduced by a corresponding amount.

FIG. 9B shows a Log I–V plot for an N-channel MOS transistor fabricated in the ultrathin silicon on sapphire of the present invention. The drain to source current, $I_{DS}$, is plotted as a function of the gate to source voltage, $V_{GS}$, for the same values of $V_{BS}$ as shown in FIG. 9A. Advantageously, this plot shows that there is no change in depletion with source voltage to affect threshold voltages. The identical curves in FIG. 9B illustrate that no source body effect occurs for this N-channel transistor.

Additional information (including circuit designs, design rules, processes, etc.) which may be adapted for making similar or analogous devices or circuits in the ultrathin silicon on sapphire material of the present invention is disclosed in: 1) a book authored by Paul R. Gray and Robert G. Meyer entitled "Analysis and Design of Analog Integrated Circuits", 3rd Edition, John Wiley & Sons, Inc., 1993, ISBN 0-471-57495-3; and 2) a book edited by Leonard Shaw entitled "Analog MOS Integrated Circuits, II", The Institute of Electrical and Electronics Engineers, Inc., 1989, IEEE Order Number: PC0239-4, ISBN 0-87942-246-7, the entire contents of both of these publications are hereby incorporated herein by reference.

LOGIC ELEMENTS

Modern integrated circuits are comprised of many transistors (up to several millions). While leading to complex systems on a chip, these circuits are basically large assemblages of a few basic building blocks. These building blocks, called logic gates, include NAND (NOT-AND), NOR (NOT-OR), and transmission (or "pass") gates. The latter is discussed in the previous analog section, and NAND and NOR gates are discussed in the present logic section. For a specific application, these gates are interconnected using standard metallization to form complex chips such as a field programmable gate array (FPGA) or microprocessor.

Figure 10:
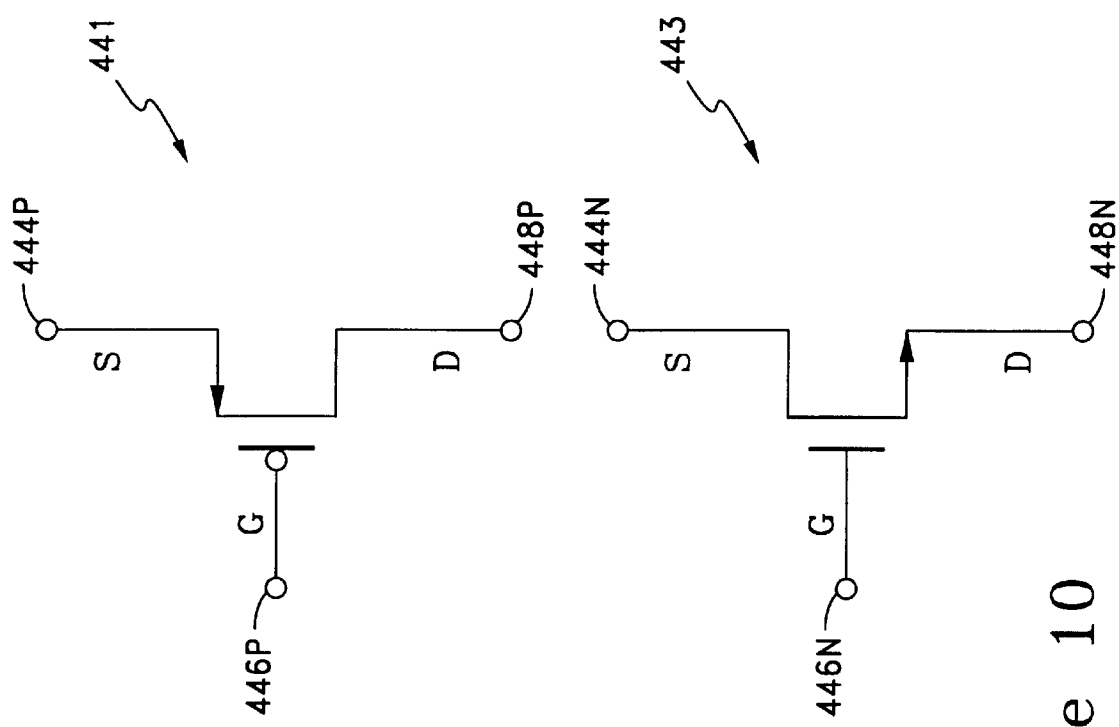
FIG. 10 shows the N-channel MOS transistor and the P-channel MOS transistor shown in FIG. 3C in a transistor-level schematic format.

A cross sectional view of two FET devices fabricated on an ultrathin silicon on sapphire wafer of the present invention is illustrated in FIG. 3C. FIG. 10 represents the same devices shown in FIG. 3C, but in a transistor-level schematic format. A P-channel transistor 441 in FIG. 10 corresponds with P-channel transistor 67 in FIG. 3C, and an N-channel transistor 443 in FIG. 10 corresponds with N-channel transistor 69 in FIG. 3C. The present invention will hereinafter be referred to in the schematic format shown in FIG. 10.

In the present invention, P-channel and N-channel transistors 441 and 443 both include a source, 444P and 444N, a gate, 446P and 446N, and a drain, 448P and 448N, as labeled in FIG. 10. This figure represents two transistors, and its form can be used as an example for the following drawings also depicted in this transistor-level schematic diagram format.

The ultrathin silicon on sapphire wafer processes greatly improve the design, function, and cost in building logic circuitry in the present invention. The thinness of the epitaxial silicon film is of great help in the fabrication of both N and P-channel MOS transistors with sub-micron channel lengths. Logic circuitry in ultrathin silicon may be fabricated at reduced lengths without significant short channel effects from drain electrostatic feedback.

Figure 11:
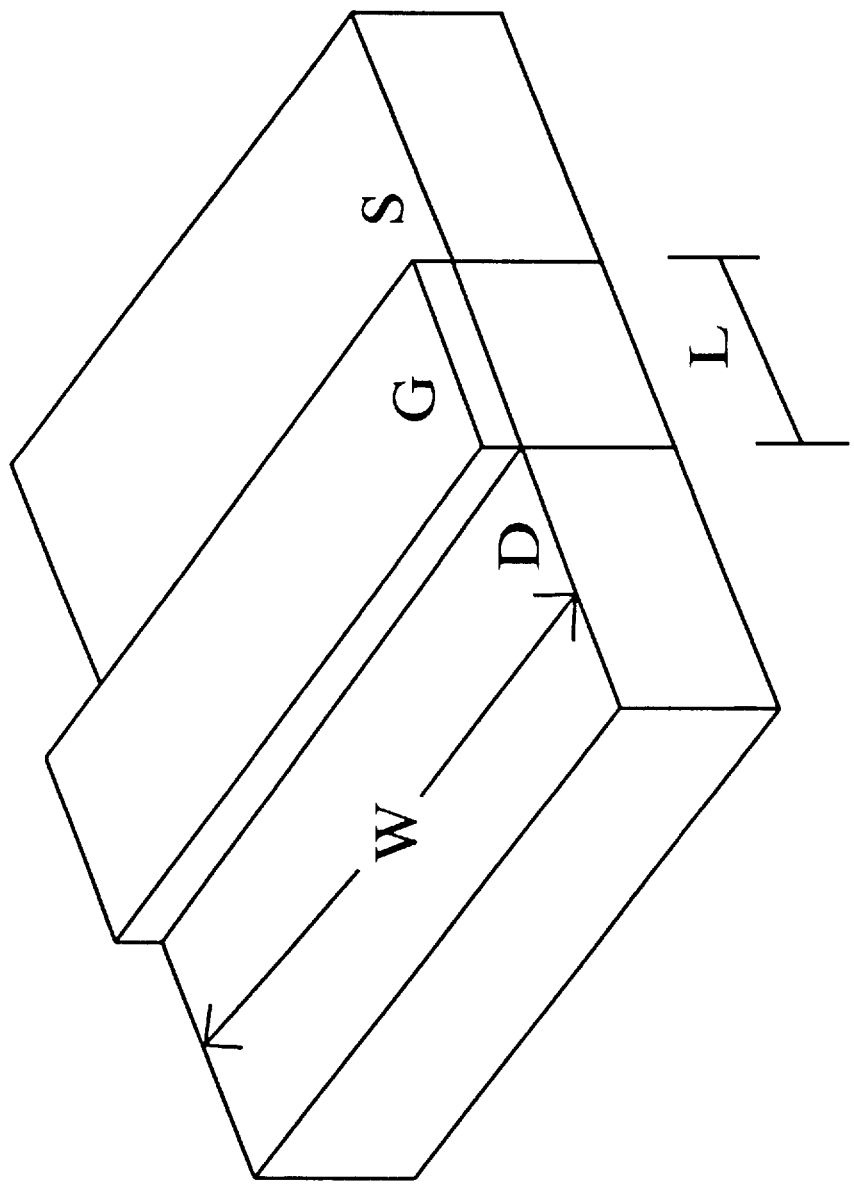
FIG. 11 shows an isometric view of a typical transistor with a gate G, source S, and drain D illustrating W and L dimensions.

In FIG. 11, an isometric view of a typical transistor with a gate G, source S, and drain D, is shown. Transistor channel width W and length L dimensions are shown. In the following drawings, width and length (W/L) dimensions will be represented by these symbols W and L. To explain the advantages of building logic circuitry in ultrathin silicon, a comparison of W/L dimensions for the present invention and bulk Si is useful. These dimensions demonstrate how ultrathin silicon improves upon bulk Si technology by allowing the use of reduced dimensions. A reduction in the PMOS gate lengths is especially advantageous.

Figure 12:
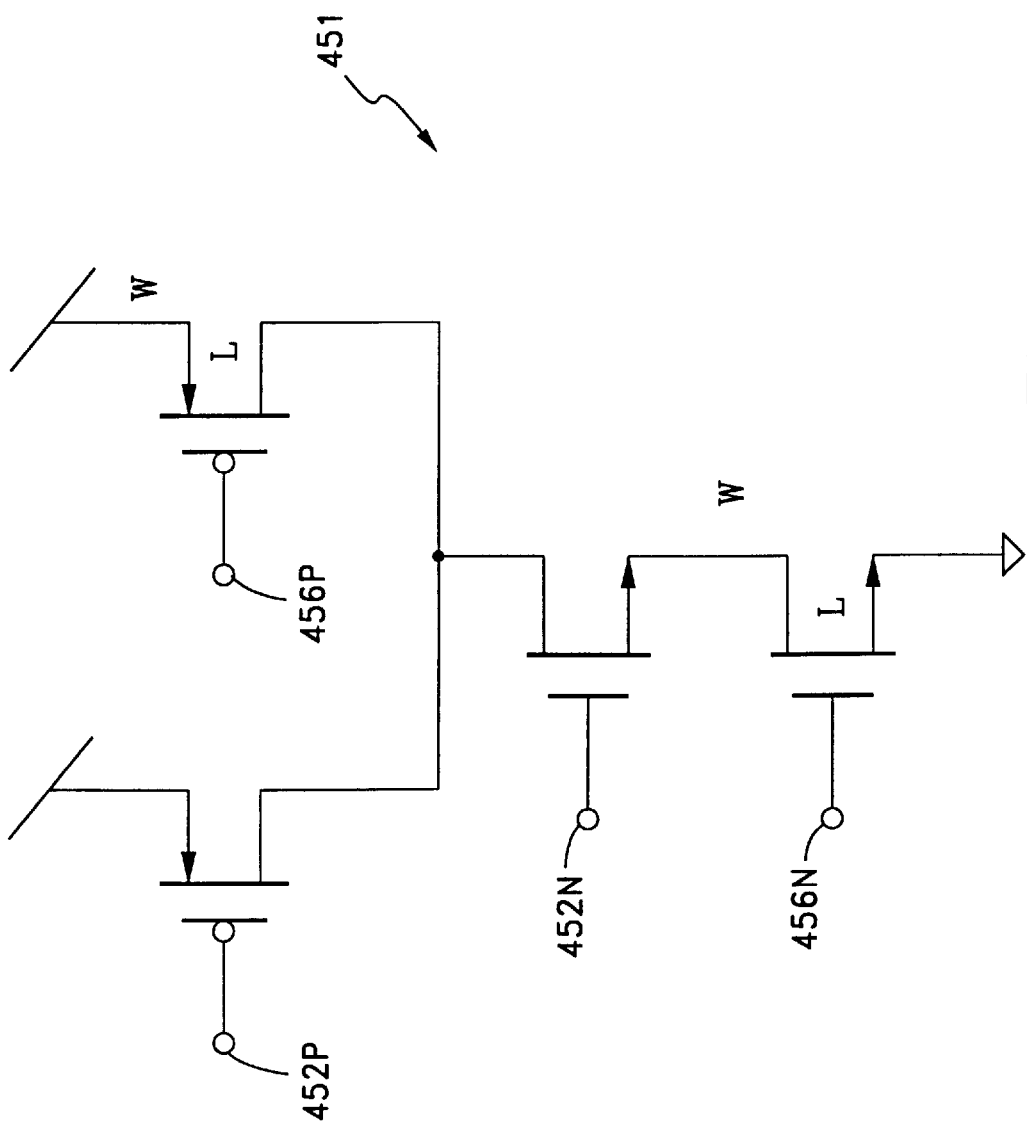
FIG. 12 shows a NAND gate fabricated in accordance with the present invention.

One logic circuit embodiment, a NAND gate 451, is shown in FIG. 12. Devices 452P and 456P represent P-channel transistors, and devices 452N and 456N represent N-channel transistors. In ultrathin silicon, the W/L dimensions are reduced significantly as compared to bulk silicon. For example, in the present invention, P-channel devices 452P and 456P of NAND gate 451 have W/L dimensions of 1.3/0.7 μm. For N-channel devices of NAND gate 451, the W/L dimensions are 0.9/0.8 μm for device 452N and 1.1/0.8 for device 456N.

In ultrathin silicon, the P-channel dimensions are also reduced, allowing the N-channel dimensions to be reduced to drive the reduced capacitance load and yield significant advantages over bulk Si and conventional SOS.

For P-channel devices in the bulk Si NAND gate, the W/L dimensions are 1.8/0.9 μm. The N-channel device W/L dimensions are 1.1/0.8 μm for the top N-channel transistor (452N) and 1.2/0.8 μm for the bottom N-channel transistor (456N).

The PMOS devices 452P and 456P in NAND gate 451 have an increase in transconductance in the present invention. This increase allows the PMOS transistors to be sized down to 1.3 μm from the 1.8 μm found in bulk Si. This width yields an almost 30% reduction in gate input capacitance and area compared to bulk Si.

NMOS device 452N is designed to drive a certain capacitive load at a given speed. Because the capacitive load is reduced as a result of lower PMOS gate capacitance in ultrathin silicon, the width is reduced to 0.9 μm instead of the 1.1 μm found in bulk Si. Also, in bulk Si, the extra width of NMOS device 456N compensates for the reduction in NMOS 452N's transconductance due to the source-body effect. However, significantly less source-body effects exist in ultrathin silicon, and the extra capacitance contributed by NMOS device 452N is lower in the present invention in comparison to the bulk Si device, so the device 456N is made with a width of only 0.9 μm instead of 1.2 μm.

Figure 13:
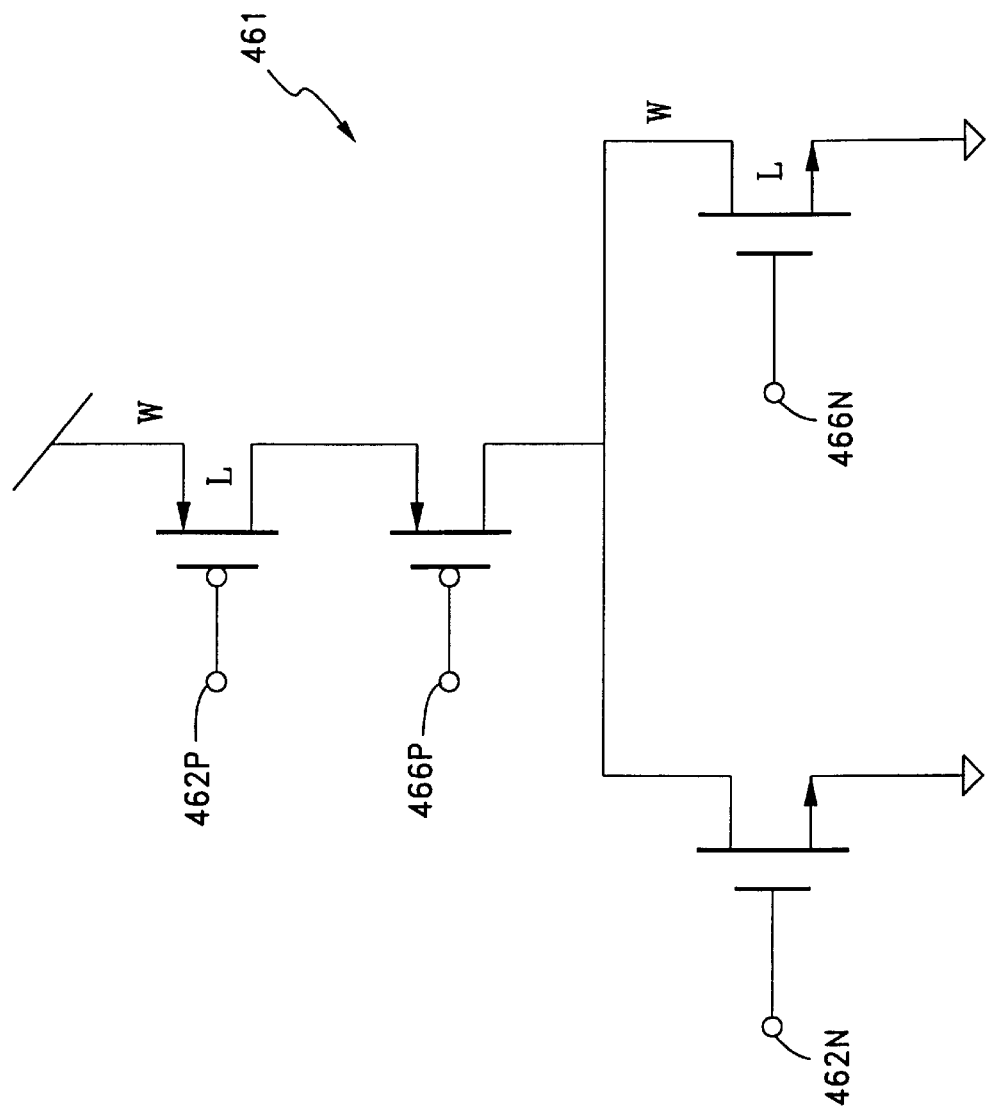
FIG. 13 shows a NOR gate fabricated in accordance with the present invention.

The advantages of ultrathin silicon for logic circuitry is also demonstrated in NOR gate logic devices. A NOR gate 461 is illustrated in FIG. 13. The W/L dimensions for the transistors are significantly reduced compared to the transistors found in bulk Si NOR gate circuitry.

PMOS transistors 462P and 466P for NOR gate 461 have W/L dimensions of 1.5/0.7 μm in ultrathin silicon. NMOS transistors 462N and 466N have W/L dimensions of 1.0/0.8 μm.

In comparison, PMOS transistors for NOR gate logic in bulk Si have W/L dimensions of 3.0/0.9 μm, and NMOS transistors have W/L dimensions of 1.2/0.8 μm. Note that the PMOS gate widths in ultrathin silicon are 50% smaller than the PMOS gate widths in bulk Si (3.0 μm to 1.5 μm) for the same gate speed. This substantial reduction for all the reasons mentioned in the BACKGROUND OF THE INVENTION for logic elements is an improvement over bulk Si technology.

Also, because of the reduced PMOS input capacitance in ultrathin silicon, NMOS devices 462N and 466N are sized with widths of 1.0 μm, which is approximately 20% less than the 1.2 μm width requirements for NMOS devices in the bulk Si NOR gate. A crucial amount of cell space is now saved for both NMOS and PMOS transistors, which ultimately reduces costs of production.

MEMORY ELEMENTS

Modern integrated circuit memories are comprised of many (up to multiple millions) transistors. While often occupying large chip areas, these circuits are assemblages of a few basic building blocks. These building blocks, called cells, are comprised of word-line decoders, word-line drivers, memory cells, column coders, and sense amplifiers. Memory cells most commonly used are dynamic random access memory (DRAM) cells and static random access memory (SRAM) cells.

Figure 14A:
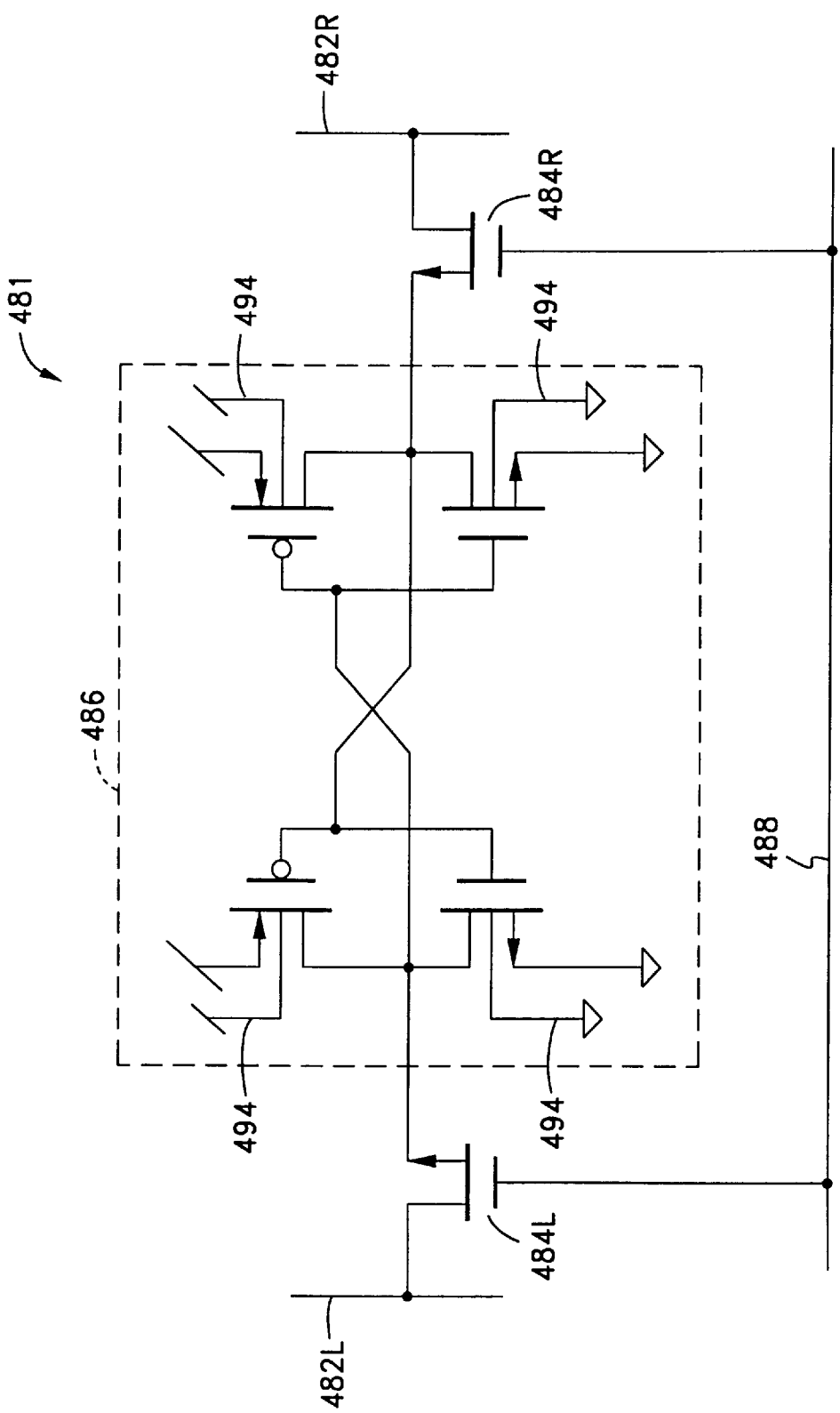
FIG. 14A shows a schematic diagram for a typical bulk Si CMOS 6 transistor (6-T) SRAM cell.

A schematic diagram for a typical bulk Si CMOS 6 transistor (6-T) SRAM cell 481 is shown in FIG. 14A. The cell 481 comprises a left bit line 482L, a right bit line 482R, a left pass transistor 484L, and a right pass transistor 484R. Also shown is a core flip flop 486, which is a basic logic circuit component, a word line 488 and substrate ties 494. As is well understood, it is also possible to form a 4-T SRAM cell by replacing the two PMOS devices inside the core flip-flop 486 with resistors. Such an embodiment is understood to be included within the scope of the present invention and the discussion below is appropriate for either a 4-T or a 6-T implementation.

Numerous improvements result when the SRAM cell 481 is fabricated in ultrathin silicon on sapphire of the present invention. Memory word line driver power is reduced by constructing the pass-gates 484L and 484R with lower input gate capacitance than if constructed in a bulk Si counterpart. The gate input capacitance is reduced to the fully depleted channel with reductions ranging from 10% to 50% depending on specific design and operating conditions.

Word line driver size reduction and power savings result from the reduced depletion capacitance of the "off" pass transistor. Depletion charge in ultrathin silicon reaches a limit prior to the transistor reaching the threshold voltage. The total charge push is quite small by comparison to bulk Si. The combination of a fully depleted substrate and reduced gate area capacitance greatly reduces the capacitance of the cell "off" pass devices, (484L or 484R) connected to internal nodes storing a logic 1, or high voltage. In addition, the memory word line current is decreased in a small, but measurable amount by decreased wiring capacitance with construction of the word lines over an insulating substrate in the present invention.

Pass transistors, 484L and 484R, have smaller widths since they do not suffer from the source-body voltage reduction in the gate drive present in bulk Si MOS memories. In addition, memory word line 488 driver power is reduced as a result of lower cell pass transistor gate-source overlap and source junction capacitance by comparison to bulk Si MOS memories.

A considerable reduction in pass transistors 484L and 484R size over conventional SOS technology also accrues to the low sense amplifier differential input voltage required as compared to an amplifier constructed with traditional SOS. This is because sense amplifiers have far less variation in offset voltage than in conventional SOS and consequently require far less overdrive.

Figure 14B:
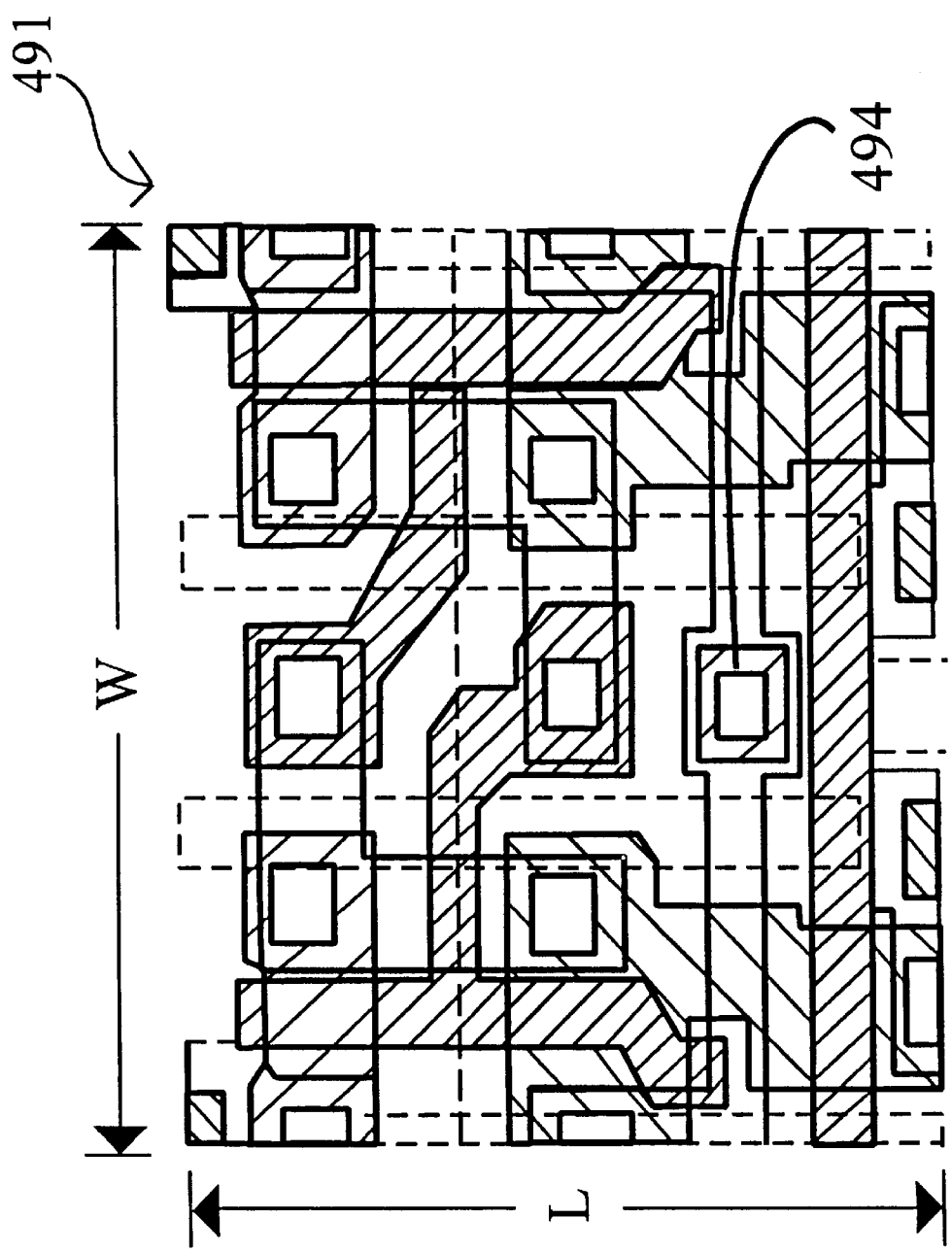
FIG. 14B shows a chip layout for a bulk Si SRAM cell.

A chip layout for a bulk Si SRAM cell 491 is shown in FIG. 14B. This 6-T SRAM cell displays the substrate tie 494, which is required in a bulk Si process. This bulk Si SRAM chip layout has a width W and a length L.

Figure 14C:
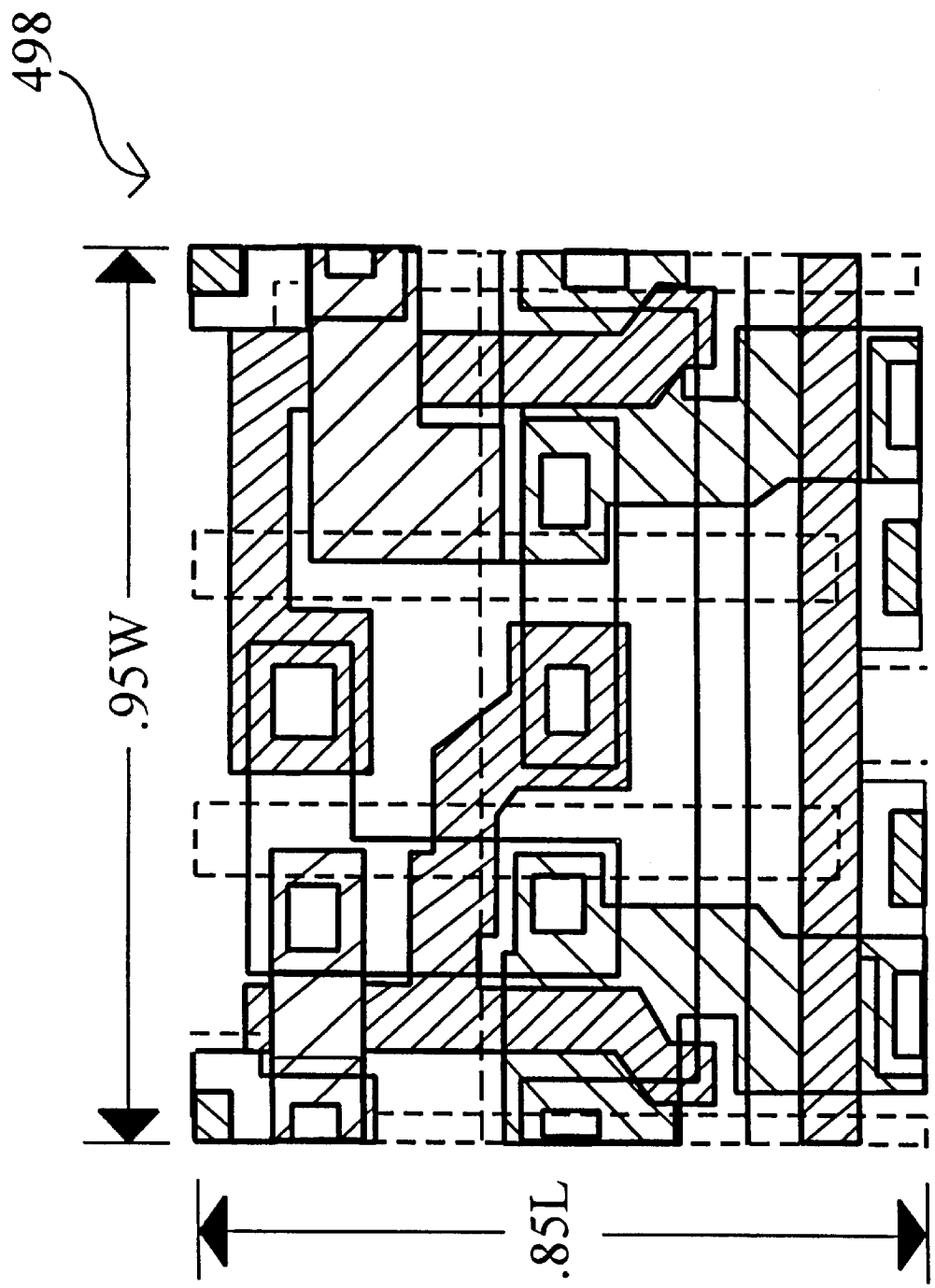
FIG. 14C shows a chip layout for an ultrathin silicon on sapphire of the present invention SRAM cell.

An ultrathin silicon CMOS 6-T SRAM cell 498 chip layout is shown in FIG. 14C. In this figure, no substrate or well ties are necessary to maintain substrate or well potential. The ties are not necessary because of the fully depleted operation in the present invention. The fully depleted operation eliminates the requirement to stabilize N and P diffusions underlying the N and P devices. This ultrathin silicon CMOS 6-T SRAM cell chip layout has a width which is approximately 95% that of the corresponding bulk silicon layout shown in FIG. 14B and a length which is approximately 85% that of the corresponding bulk silicon layout. Thus, the absence of these ties in ultrathin silicon saves significant cell area. Specifically, the ultrathin silicon SRAM cell chip layout 498 (FIG. 14C) has an area which is approximately 20% smaller than the area of the corresponding bulk silicon SRAM cell chip layout 491 (FIG. 14B). This significant difference in layout area is due to no bulk or substrate or well tie and no requirement for added spacing of active devices from a well in the ultrathin silicon SRAM cell chip layout 498.

Additional power savings in the ultrathin silicon SRAM cell chip layout 498 results from decreasing the widths of the pass transistors as discussed above.

It is also possible to reduce supply voltages in the present invention and maintain the same speed when memory device transconductances are improved and capacitances are reduced using the same gate widths as for bulk silicon cells. The designer is then free to choose whether to take advantage of the improvements in device properties by emphasizing power supply voltage reduction, or cell size reduction, or some combination of both.

Additional information (including circuit designs, design rules, processes, etc.) which may be adapted for making similar or analogous devices or circuits in the ultrathin silicon on sapphire material of the present invention is disclosed in a book authored by Lance A. Glasser entitled "The Design and Analysis of VLSI Circuits", Addison-Wesley Publishing Company, Inc., 1985, ISBN 0-201-12580-3, this entire publication is hereby incorporated herein by reference.

SINGLE CHIP ARCHITECTURE

In accordance with the individual device improvements described above, the present invention also includes the integration of the RF, analog, digital, and memory components of a high-frequency wireless communication system on a single ultrathin silicon on sapphire chip. It is also possible to integrate any combination of the above-described components, such as analog and digital, on a single ultrathin silicon on sapphire chip to achieve new high performance mixed-signal radio frequency system functions.

The present invention incorporates sensitive analog circuitry on the same substrate with large and complex digital subsystems. Practicality of the analog subsystem is achieved by elimination of the substrate voltage bounce under the analog circuitry resulting from high displacement currents in the logic. Practicality of the digital system is achieved by eliminating the source-body effect of an analog negative substrate bias under the digital circuitry.

Power limitations are important both from the standpoint of limited package power dissipation and battery life in small, portable applications. A large amount of power in a digital communication system is consumed by logic and memory subsystems. The present invention integrates very large scale logic and memory circuits while achieving power consumption levels substantially below the bulk Si MOS and conventional SOS processes that do not have the benefit of ultrathin films.

Figure 15A:
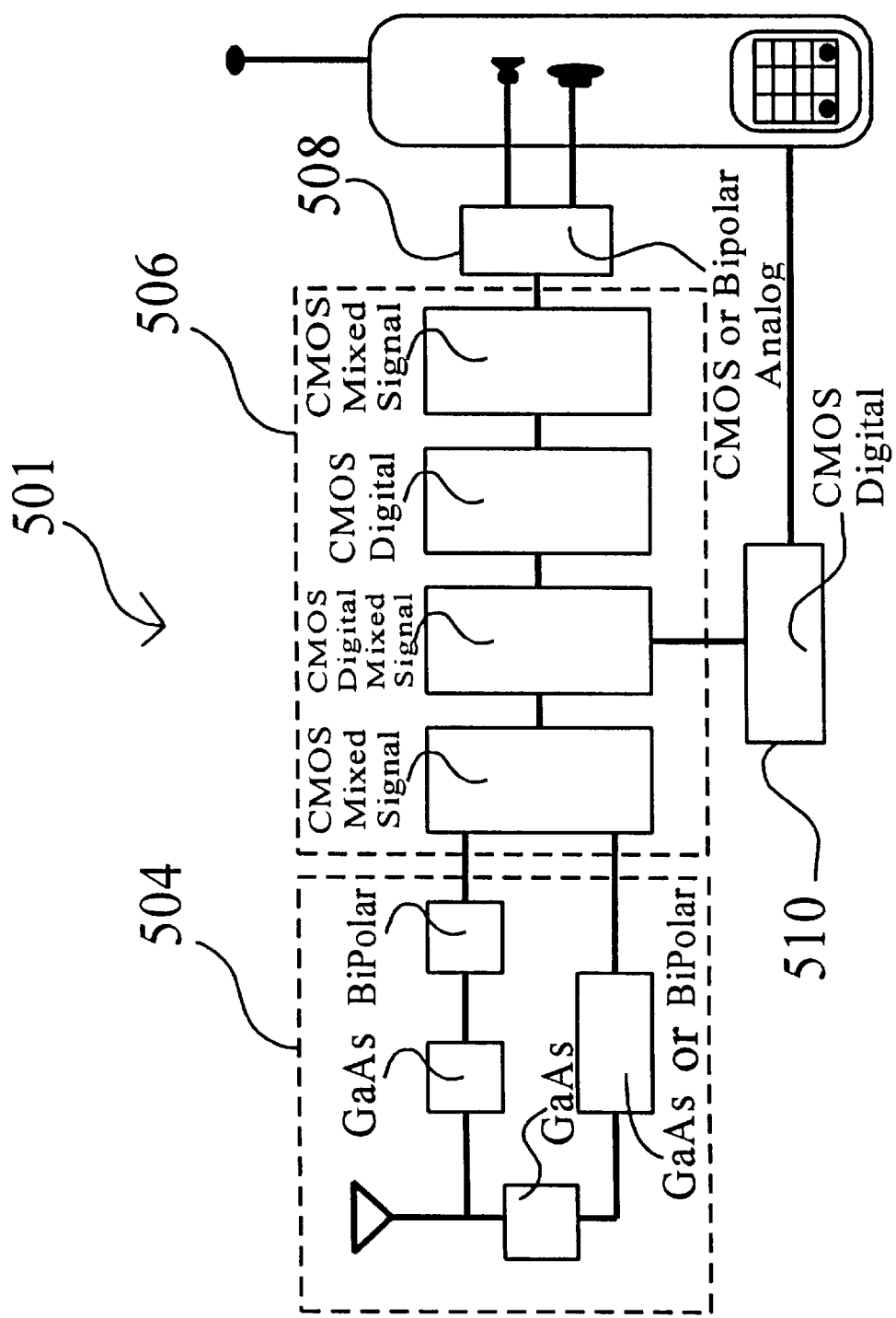
FIG. 15A shows a hand-held cellular telephone using chips fabricated in a variety of technologies. These chips are mounted and interconnected on a printed circuit board or alumina substrate to provide interconnections between subsystems.

FIG. 15A shows a hand-held cellular telephone block diagram generally indicated at 501 using currently available chips and either a printed circuit board or alumina substrate to provide interconnections between subsystems. The different functions require different technologies, making it impossible to combine them cost-effectively onto one chip using any one semiconductor technology. Region 504 comprises the RF chips including technologies such as Bipolar, GaAs, and CMOS. Region 506 comprises the baseband chips constructed with CMOS technology. An audio amplifier 508 is constructed of Bipolar technology and a microprocessor 510 is constructed of CMOS technology.

Figure 15B:
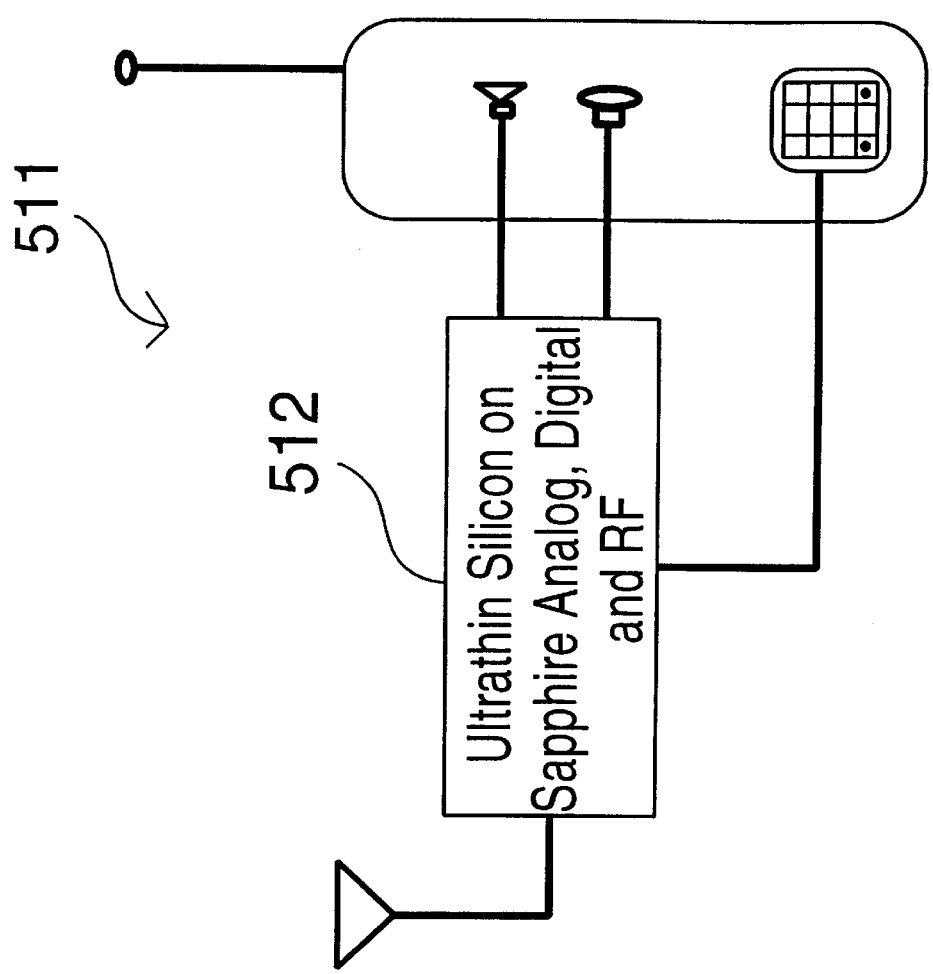
FIG. 15B shows a hand-held wireless communication system which integrates the RF, baseband, audio, and microprocessor components all in one single ultrathin silicon on sapphire chip of the present invention.

A wireless communication system in accordance with the present invention is shown in FIG. 15B. An illustrative example of a hand-held cellular telephone 511 demonstrates the use of a single chip for the same result desired in FIG. 15A, but without multiple chips. Region 512 comprises the RF, baseband, audio, and microprocessor components all in one single ultrathin silicon on sapphire chip of the present invention. The total chip cost is significantly reduced, as is the cost of chip-to-chip wiring and passive components.

In order to integrate high frequency RF active and passive components, analog, digital, and memory components of a power-efficient, wireless communication system in a single chip, an insulating substrate is required for many reasons. These reasons include, but are not limited to, integration of the high frequency passive components, isolation of the precision analog components from the digital noise, low noise characteristics for components both at high and low frequency levels, and reduction of digital and memory system power to a level required in a single-chip system.

Therefore, the current invention exhibits advantages in all major subsystems of a single chip communications system: digital, analog, memory, and RF. In addition, the advantages in each subsystem are achieved in a single integrated process and a single transistor structure. By offering superior performance in all aspects of a single chip communications system in a single integrated process, a variety of low cost, easy to use, portable communications devices can be designed and manufactured cost efficiently.

Additional information (including circuit designs, design rules, processes, etc.) which may be adapted for making similar or analogous devices or circuits in the ultrathin silicon on sapphire material of the present invention is disclosed in a data handbook distributed by Philips Semiconductors entitled "RF/Wireless Communications-1993", North American Philips Corporation, 1992, Publication Number 98-2000-290-04, this entire publication is hereby incorporated herein by reference.

CHIP FABRICATION CONSIDERATIONS
1. Introduction

In general, the processes utilized for fabricating devices in the ultrathin silicon on sapphire material of the present invention are the same as the processes used for conventional bulk silicon. Where differences occur or special considerations are advantageous or necessary, presentation of these factors is presented above in the context of the appropriate section. This section presents additional information which one skilled in the art may find helpful in adapting a specific process to the manufacture of devices in the ultrathin silicon on sapphire material of the present invention.

In one embodiment, the present invention is for a device having a gain-bandwidth product $f_t$ in excess of the 10 GHz required for RF amplifier operation in excess of 700 MHz. The initial film preparation steps leave the silicon film at a thickness of approximately 110 nm prior to the steps that result in the formation of the N and P MOSFETs. Subsequent oxidation and etch steps result in a film thickness under the gate of slightly less than 100 nm. In the present invention, a gate length of 500 nm, made with a film thinner than 100 nm, and preferably closer to 50 nm are achievable. However, the initial film preparation steps, resulting in the 110 nm thickness are representative of an 0.8 $\mu$m gate-length process. This gate length is sufficiently short to enable the fabrication of ultrathin silicon on sapphire MOSFETs with an $f_t$ well in excess of the 10 GHz required for RF amplifier operation above 700 MHz.

For a typical ultrathin silicon on sapphire MOSFET device constructed according to the principles of this invention, an 0.8 $\mu$m gate length is drawn in the CAD procedures. This results in a polysilicon gate length of 0.75 $\mu$m on the wafer after gate photolithography and etch. Subsequent processing forming the lightly doped source and drain regions results in the source and drain metallurgical junctions each extending under the gate by a length of approximately 0.05 $\mu$m. The resulting total reduction of 0.1 $\mu$m yields a final metallurgical junction length of approximately 0.65 $\mu$m. As previously discussed, the process begins with a starting material structure which is an intrinsic silicon film (I.E., contains no dopant atoms) on a sapphire substrate with substantially no electrically active states throughout the structure. Thus, in this example delta N (active state density) is preferably less than approximately $2.0 \times 10^{11}$ cm$^{-2}$, which is typical of most current devices fabricated in accordance with the invention.

The following detailed description of the process is intended to supplement information originally presented above. It is also intended to supplement standard bulk CMOS processing recipes. It is understood by those skilled in the art that each silicon fabrication facility has its own preferred process recipes that have been well tried and tested in its own bulk CMOS processes. Therefore, it is not necessary to explain each process recipe utilized in processing devices in the ultrathin silicon on sapphire of the present invention in order to enable one skilled in the art of bulk silicon CMOS processing to practice the present invention. Additionally, it is generally recognized that fabrication facilities vary widely in their practice of well understood steps such as the application of the metallization and pad layers. These steps constitute what is commonly known as the back-end of the process.

In other well known steps, such as gate oxide growth, it is not necessary to explain each cleaning or clean-up oxide step, but rather it is helpful to explain the final oxide target thickness. This type of information is provided for a 0.8 $\mu$m ultrathin silicon on sapphire process typical of the present invention.

2. Epitaxial Silicon Film Preparation

A typical starting material comprises a 270 nm thick epitaxial layer of silicon on a sapphire substrate. The silicon implant dose is approximately $6\times10^{14}$ with an energy of 185 keV. The solid phase epitaxial regrowth is at approximately 550° C. in nitrogen for approximately 30 minutes.

During implantation, a uniform temperature of approximately 0° C. is maintained throughout the film. This may be accomplished with backside cooling with hydrogen or helium. Both gasses are adequate when cooling is performed at millitorr pressures and the choice of gases is based on manufacturing plant ("fab") preference.

The anneal furnace is ramped to approximately 900° C. to begin the second anneal. A ramp time of 30 minutes in a nitrogen environment has been used successfully, but other times may also be appropriate and the second anneal is for approximately 30 minutes. The furnace is then ramped up to 1000° C. to perform the thinning oxidation. Since 950° C. is exceeded during the second ramp, it is necessary to turn on dry $O_2$ at 900° C. while the furnace is ramping and turning off the nitrogen.

When the temperature ramp reaches 1000° C., it is stabilized and the remainder of the oxidation is carried out in steam at 1000° C., until an oxide thickness of 360 nm is reached. Prior to ramp down, dry $O_2$ is turned on and left on during the ramp down.

After all the oxide is etched away, the remaining thickness is approximately 110 nanometers. At this film thickness, the substrate will be fully depleted at the onset of threshold conduction in both P and N-channel MOS devices.

3. Silicon Nitride Patterning

Devices may be fabricated with several types of well understood isolation methods. The following description is typical of the LOCOS (Local Oxidation of Silicon) process. It results in a thick isolation oxide, or field oxide, formed between devices.

One hundred angstroms of stress relief oxide is applied by a CVD step followed by deposition of 1000 Å of silicon nitride. The silicon nitride is patterned by photoresist and lithography steps well understood in the art. After patterning, the photoresist is left over the silicon nitride and subjected to an additional hard bake.

4. N-Channel MOSFET Edge Control

It is well understood that a leakage control implant is required at the edge of an N-Channel device prior to field oxide formation. The Boron increases the threshold of the devices at the edge of the N-channels and must be blocked from the region near the edge of the P-channel MOSFETs by an additional photolithography step that results in photoresist being applied well beyond the edge of the P-MOS devices.

The Boron implant is typically $5\times10^{14}$ of $BF_2$ between 40 and 70 keV.

5. Field Oxidation

The LOCOS field oxidation step is next. It is a preferably a wet oxidation step performed at a temperature less than 950° C. In the ultrathin silicon on sapphire process, the epitaxial silicon thickness of 110 nm limits the field oxide thickness to approximately 240 nm. This is a result of the oxidation proceeding to the silicon/substrate interface as a limit. The final oxide thickness is therefore far more independent of oxidation conditions and time than in a bulk CMOS process.

After the field oxidation, the Silicon Nitride and stress relief oxide are etched away.

6. Channel Implants

Implants are added in the channel region of the MOSFET devices to attain the proper thresholds. The process includes N and P channel digital devices with thresholds of approximately +0.65 V and –0.65 V, respectively. The first device is designated regular N or "RN" and the second device is designated as regular P or "RP."

Knowing that the gate polysilicon material will be heavily doped N-type material, the gate oxide thickness will be approximately 180 Angstroms, and that the epitaxial silicon layer under the gate is close to intrinsic, it is not difficult to determine the correct implant dose and energy.

For the RP device with the above described gate material, oxide thickness, and near-intrinsic silicon film, the implant is typically Boron at a dose of $1.3\times10^{12}$ cm$^{-2}$ and an energy of 10 keV.

For the RN device with the above described gate material, oxide thickness, and near-intrinsic silicon film, the implant is typically Boron at a dose of $2.5\times10^{12}$ cm$^{-2}$ and an energy of 10 keV.

Two additional devices are useful. They both require no additional implants. The first is an intrinsic P or "IP" device that has a final threshold of –1.0 V with no additional implant. The second is an intrinsic N or "IN" device with a threshold of nearly 0 V.

The IP device is useful in analog and memory circuits because the absence of hole scattering from any additional threshold-shifting Boron implant results in slightly higher hole mobility in the channel. This coupled with the beneficial effect of hole mobility enhancement from the compressive stress of the sapphire substrate results in an IP device hole mobility in excess of 10 percent higher than a bulk silicon PMOS device.

The IN device is useful in analog circuits as a source-follower device because of the low threshold. Electron mobility is reduced by the same substrate compressive stress effects that enhance hole mobility. The absence of an implant slightly improves mobility.

7. Gate Oxide Growth

A gate oxide is grown to a thickness of 180 Angstroms in a dry oxidizing ambient temperature of preferably 900° C. Pre-growth cleaning steps are well understood and not repeated here. The growth of the gate oxide reduces the final silicon film thickness to approximately 100 nm. It is understood that if a clean-up oxide is used, the depth of oxidation into the epitaxial silicon layer will additionally reduce the final film thickness.

8. Polysilicon Deposition and Photolithography

Polysilicon is deposited to a thickness of 2700 to 3000 Å. Although a target thickness is indicated, it is not critical. Doping and patterning follow well understood processing practices. The final gate length after patterning will be approximately 0.75 $\mu$M.

9. Lightly Doped Drain (LDD) Construction

Lightly doped drain construction methods are typical of conventional bulk CMOS recipes. The LDD implant for the PMOS devices is well understood to be BF2. Activation of a Phosphorous implant NMOS implant is typically at 900° C. for 20 minutes to maintain the temperature for this step below the 950° C. limit. An Arsenic LDD implant may also be used with a longer activation time.

The sidewall construction also follows standard practice, with typical lateral spacer conditions being dry $O_2$ at 825° to 850° C. A low temperature, low pressure oxide deposition and anisotropic etch follows to remove all oxide from the polysilicon gate and source/drain regions. A final cap oxide of approximately 100 Angstrom thickness is grown over source/drain regions to prevent contamination.

At this point in the process, the channel silicon epitaxial film thicknesses are typically between 950 and 1000 Å thick with source/drain film thickness being between 800 to 900 Å thick.

10. Source/Drain Implant

The preferred method of doping for the source and drain regions described previously was diffusion. In some situations, the preferred method for source/drain doping is by ion implantation.

The source/drain implants in the ultrathin silicon on sapphire of the present invention technology do not have to be driven well below the contact depth as in a bulk CMOS process. Because the bottom of the source/drain regions is terminated by an insulator, there is no contact spiking problem and the source/drain region thickness is typically 800 to 900 Å. This is about a factor of two thinner than for a comparable 0.8 $\mu$m bulk CMOS process.

Because of the thinness of the epitaxial silicon layer in the source/drain region, the optimum implant schedules are slightly different from what is considered optimum in a bulk CMOS process. First, the N+ source/drain regions are implanted with Arsenic at a dose of $2\times10^{15}$ cm$^{-2}$ at an implant energy of 55 keV. The P+ source/drain implant is $BF_2$ at a dose of $2\times10^{15}$ cm$^{-2}$ at an implant energy of 50 kev. Following the implants, and activation anneal is performed for 10 minutes at 900° C.

11. Salicide Steps

The key to a titanium salicide step is to deposit enough titanium to obtain acceptable resistances but not so much that titanium-rich low conductivity source/drains will result. The salicide represents an improvement over using dopant diffusions to achieve acceptable source/drain resistances.

Prior to the application of the titanium, it may be beneficial to apply a salicide block step. This will block the salicide with a deposited 1000 Å layer of nitride on top of a 100 to 300 Å layer of deposited oxide in regions that are to be blocked from the salicide. The nitride need not be removed from these regions to enable subsequent processing.

Following experimentation with source/drain regions of from 800 Å to 900 Å thickness, typical of the above process steps, it has been determined that the optimum thickness for the titanium deposition is approximately 400 Å.

Following the titanium deposition, a two step anneal is performed. The first step is at a temperature of approximately 700° C. Too high a temperature reduces the sidewall $SiO_2$ thereby causing silicide to form and short the gate to drain or source. The wafers are removed and a chemical etch is performed to remove the titanium nitride over the $SiO_2$. The temperature may now be increased to 900° C. for the final anneal of the source/drain regions.

12. Process Back End

The process back-end steps result in the formation of the additional insulator and metal layers required to interconnect the devices and form a final passivation layer. These steps are the same as would be required for a bulk silicon process without the usual severely constrained time and temperature restrictions that are applied to prevent the metal contacts to the source/drain regions from "spiking" or penetrating through to form a short circuit with the bulk substrate material. There is no conductive bulk substrate material in this process, only an insulating sapphire substrate.

It will be understood that the apparatus and method of the present invention for a High-Frequency Wireless Communication System on a Single Ultrathin Silicon on Sapphire Chip may be employed with many dimensions and designs typical of such devices. Thus, there are numerous other embodiments of the invention which will be obvious to one skilled in the art, including but not limited to changes in the dimensions of the regions forming the devices, the type of processes used to fabricate devices, the specific circuit designs, etc. Additionally, one skilled in the art will realize that the apparatus and method of the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. In combination:

an insulating substrate;

a layer of silicon formed on said insulating substrate wherein said silicon layer is less than approximately 1000 Å thick and is substantially free of electrically active states achieved by controlling the temperature of said silicon layer to temperatures of less than or equal to approximately 950° C. during any processing of said silicon layer which exposes said silicon layer to a non-oxidizing ambient environment; and a logic component fabricated in said silicon layer wherein said logic component is selected from the group including a NAND gate, a NOR gate and a transmission gate.

2. The combination defined in claim 1 wherein said insulating substrate comprises sapphire.

3. The combination defined in claim 1 wherein said layer of silicon has an areal density of electrically active states which is less than approximately $5\times10^{11}$ cm$^{-2}$.

4. The combination defined in claim 1 wherein said logic component selected from the group including a NAND gate, a NOR gate and a transmission gate further comprises P-channel transistors and N-channel transistors fabricated in said layer of silicon formed on said insulating substrate.

5. The combination defined in claim 4 wherein said logic component comprises CMOS FET transistors.

6. An electronic memory comprising:

an insulating substrate;

a layer of silicon formed on said insulating substrate wherein said layer of silicon is less than approximately 1000 Å thick and is substantially free of electrically active states achieved by controlling the temperature of said layer of silicon to temperatures of less than or equal to approximately 950° C. during any processing of said layer of silicon which exposes said layer of silicon to a non-oxidizing ambient environment;

a first N-channel transistor fabricated in said layer of silicon formed on said insulating substrate;

a first P-channel transistor fabricated in said layer of silicon formed on said insulating substrate;

a second N-channel transistor fabricated in said layer of silicon formed on said insulating substrate;

a second P-channel transistor fabricated in said layer of silicon formed on said insulating substrate, wherein said first N-channel transistor, said first P-channel transistor, said second N-channel transistor and said second P-channel transistor are interconnected to form a cross coupled inverter; and a transmission gate electrically connected to said cross coupled inverter wherein said transmission gate comprises either one of a third P-channel transistor or a third N-channel transistor fabricated in said layer of silicon formed on said insulating substrate.

7. A microelectronic circuit comprising:

an electrically insulating substrate;

a semiconductive silicon layer that is formed on the substrate and has a thickness of less than approximately 110 nanometers and an areal density of electrically active states less than approximately $5\times10^{11}$ cm$^{-2}$ achieved by controlling the temperature of said semiconductive silicon layer to temperatures of less than or equal to approximately 950° C. during any processing of said semiconductive silicon layer which exposes said semiconductive silicon layer to a non-oxidizing ambient environment; and a field effect transistor formed in the semiconductive silicon layer.

8. A circuit as in claim 7 in which the electrically insulating substrate comprises sapphire.

9. A circuit as in claim 7 in which the field effect transistor has a gate length of less than approximately 0.8 micrometers.

10. An electronic memory circuit comprising:

an electrically insulating substrate;

a semiconductive silicon layer that is formed on the substrate and has a thickness of less than approximately 110 nanometers and an areal density of electrically active states less than approximately $5\times10^{11}$ cm$^{-2}$ achieved by controlling the temperature of said semiconductive silicon layer to temperatures of less than or equal to approximately 950° C. during any processing of said semiconductive silicon layer which exposes said semiconductive silicon layer to a non-oxidizing ambient environment;

a first N-channel transistor fabricated in said semiconductive silicon layer formed on said insulating substrate;

a first P-channel transistor fabricated in said semiconductive silicon layer formed on said insulating substrate;

a second N-channel transistor fabricated in said semiconductive silicon layer formed on said insulating substrate; and a second P-channel transistor fabricated in said semiconductive silicon layer formed on said insulating substrate, wherein said first N-channel transistor, said first P-channel transistor, said second N-channel transistor and said second P-channel transistor are interconnected to form a flip-flop circuit element.

11. A circuit as in claim 10 in which the memory element further comprises a transmission gate electrically connected to said flip-flop circuit element wherein said transmission gate comprises either one of a third P-channel transistor or a third N-channel transistor fabricated in said semiconductive silicon layer formed on said insulating substrate.

12. A MOS device comprising:

an insulating substrate;

a silicon layer formed on said insulating substrate wherein said silicon layer is less than approximately 1000 Å thick and is substantially free of electrically active states achieved by controlling the temperature of said silicon layer to temperatures of less than or equal to approximately 950° C. during any processing of said silicon layer which exposes said silicon layer to a non-oxidizing ambient environment;

a source region formed in said silicon layer;

a drain region formed in said silicon layer;

a channel region formed in said silicon layer between said source region and said drain region; and a gate positioned adjacent said channel region.

13. A MOS device as defined in claim 12 wherein said insulating substrate comprises sapphire.

14. A MOS device as defined in claim 12 wherein said silicon layer has an areal density of electrically active states which is less than approximately $5\times10^{11}$ cm$^{-2}$.

15. A MOS device as defined in claim 12 wherein said channel has a length of less than approximately 0.8 µm.

16. A MOS device as defined in claim 12 wherein said source region and said drain region overlap said gate by less than approximately 0.06 µm.

17. A NAND gate comprising:

an insulating substrate;

a layer of silicon formed on said insulating substrate wherein said layer of silicon is less than approximately 1000 Å thick and is substantially free of electrically active states achieved by controlling the temperature of said layer of silicon to temperatures of less than or equal to approximately 950° C. during any processing of said layer of silicon which exposes said layer of silicon to a non-oxidizing ambient environment;

first and second P-channel transistors fabricated in said layer of silicon formed on said insulating substrate wherein said first and second P-channel transistors have widths of less than approximately 1.3 µm and lengths of less than approximately 0.7 µm;

a first N-channel transistor fabricated in said layer of silicon formed on said insulating substrate wherein said first N-channel transistor has a width of less than approximately 0.9 µm and a length of less than approximately 0.8 µm; and a second N-channel transistor fabricated in said layer of silicon formed on said insulating substrate wherein said second N-channel transistor has a width of less than approximately 1.0 µm and a length of less than approximately 0.8 µm.

18. A NOR gate comprising:

an insulating substrate;

a layer of silicon formed on said insulating substrate wherein said layer of silicon is less than approximately 1000 Å thick and is substantially free of electrically active states achieved by controlling the temperature of said layer of silicon to temperatures of less than or equal to approximately 950° C. during any processing of said layer of silicon which exposes said layer of silicon to a non-oxidizing ambient environment;

first and second PMOS transistors fabricated in said layer of silicon formed on said insulating substrate wherein said first and second PMOS transistors have widths of less than approximately 1.5 µm and lengths of less than approximately 0.7 µm; and first and second NMOS transistors fabricated in said layer of silicon formed on said insulating substrate wherein said first and second NMOS transistors have widths of less than approximately 1.0 µm and lengths of less than approximately 0.8 µm.

19. A logic component comprising:

an insulating substrate;

a layer of silicon formed on said insulating substrate wherein said silicon layer is less than approximately 1000 Å thick and is substantially free of electrically active states achieved by controlling the temperature of said layer of silicon to temperatures of less than or equal to approximately 950° C. during any processing of said layer of silicon which exposes said layer of silicon to a non-oxidizing ambient environment;

a first N-channel transistor fabricated in said layer of silicon formed on said insulating substrate;

49 a first P-channel transistor fabricated in said layer of silicon formed on said insulating substrate;

a second N-channel transistor fabricated in said layer of silicon formed on said insulating substrate; and a second P-channel transistor fabricated in said layer of silicon formed on said insulating substrate, wherein said first N-channel transistor, said first P-channel transistor, said second N-channel transistor and said second P-channel transistor are interconnected to form a flip-flop element.

20. A logic component as defined in claim 19 further comprising a transmission gate electrically connected to said flip-flop element wherein said transmission gate comprises either one of a third P-channel transistor or a third N-channel transistor fabricated in said layer of silicon formed on said insulating substrate.

21. A logic component comprising:

an insulating substrate;

a layer of silicon formed on said insulating substrate wherein said silicon layer is less than approximately 1000 Å thick and is substantially free of electrically active states achieved by controlling the temperature of said layer of silicon to temperatures of less than or equal to approximately 950° C. during any processing of said layer of silicon which exposes said layer of silicon to a non-oxidizing ambient environment;

a first N-channel transistor fabricated in said layer of silicon formed on said insulating substrate;

a first resistor fabricated in said layer of silicon formed on said insulating substrate;

a second N-channel transistor fabricated in said layer of silicon formed on said insulating substrate; and a second resistor fabricated in said layer of silicon formed on said insulating substrate, wherein said first N-channel transistor, said first resistor, said second N-channel transistor and said second resistor are interconnected to form a flip-flop element.

22. A logic component as defined in claim 21 further comprising a transmission gate electrically connected to said flip-flop element wherein said transmission gate comprises either one of a first P-channel transistor or a third N-channel transistor fabricated in said layer of silicon formed on said insulating substrate.

23. A MOS device comprising:

an insulating substrate;

50 a silicon layer formed on said sapphire substrate wherein said silicon layer is less than approximately 1000 Å thick and is substantially free of electrically active states achieved by controlling the temperature of said silicon layer to temperatures of less than or equal to approximately 950° C. during any processing of said silicon layer which exposes said silicon layer to a non-oxidizing ambient environment;

a source region formed in said silicon layer, wherein a voltage $V_S$ is applied to said source region;

a drain region formed in said silicon layer, wherein a voltage $V_D$ is applied to said drain region;

a channel region formed in said silicon layer between said source region and said drain region; and a gate positioned adjacent said channel region, wherein a voltage $V_G$ is applied to said source region to control current flowing between said source and said drain, $I_{DS}$.

24. A MOS device as defined in claim 23 wherein said current flowing through said channel from said source to said drain, $I_{DS}$, is a linear function of the voltage difference between said source and said drain, $V_D-V_S=V_{DS}$.

25. A MOS device as defined in claim 23 wherein said channel is fully depleted.

26. A digital electronic circuit comprising:

an electrically insulating substrate;

a semiconductive silicon layer that is formed on the substrate and has a thickness of less than approximately 110 nanometers and an areal density of electrically active states less than approximately $5 \times 10^{11}$ cm$^{-2}$ achieved by controlling the temperature of said semiconductive silicon layer to temperatures of less than or equal to approximately 950° C. during any processing of said semiconductive silicon layer which exposes said semiconductive silicon layer to a non-oxidizing ambient environment; and a digital field effect transistor element that is formed in the semiconductive silicon layer and includes:

an N-type source;

an N-type drain; and a P-type channel having a gate length of less than approximately 0.8 micrometers, negligible source-body effect and a mobility higher than approximately 180 cm/volt-second; and a gate formed over the channel.

* * * * *